US008679587B2

(12) United States Patent
Chang et al.

(10) Patent No.: US 8,679,587 B2
(45) Date of Patent: Mar. 25, 2014

(54) SOLUTION DEPOSITION OF INORGANIC MATERIALS AND ELECTRONIC DEVICES MADE COMPRISING THE INORGANIC MATERIALS

(75) Inventors: Chih-hung Chang, Corvallis, OR (US); Do-Hyoung Lee, Corvallis, OR (US); Yu-Jen Chang, Corvallis, OR (US)

(73) Assignee: State of Oregon acting by and through the State Board of Higher Education action on Behalf of Oregon State University, Corvallis, OR (US)

( * ) Notice: Subject to any disclaimer, the term of this patent is extended or adjusted under 35 U.S.C. 154(b) by 866 days.

(21) Appl. No.: 11/564,759

(22) Filed: Nov. 29, 2006

(65) Prior Publication Data

US 2007/0184576 A1   Aug. 9, 2007

Related U.S. Application Data

(60) Provisional application No. 60/740,707, filed on Nov. 29, 2005, provisional application No. 60/781,347, filed on Mar. 10, 2006.

(51) Int. Cl.
*B05D 3/02* (2006.01)

(52) U.S. Cl.
USPC ..................................... 427/376.2

(58) Field of Classification Search
USPC ..................................... 427/376.2
See application file for complete search history.

(56) References Cited

U.S. PATENT DOCUMENTS

| 4,100,068 A | 7/1978 | Jordan et al. |
| 4,647,748 A | 3/1987 | Glassman |
| 4,875,619 A | 10/1989 | Anderson et al. |
| 4,921,531 A * | 5/1990 | Nagle et al. ............... 75/351 |
| 5,073,658 A * | 12/1991 | Saleh et al. ............... 585/530 |
| 5,087,930 A | 2/1992 | Roy et al. |
| 5,093,286 A * | 3/1992 | Nogami et al. ............... 501/17 |
| 5,304,783 A * | 4/1994 | Clough et al. ............... 219/543 |
| 5,469,264 A | 11/1995 | Shigemori |

(Continued)

FOREIGN PATENT DOCUMENTS

WO   WO 03049515 A1 *   6/2003

OTHER PUBLICATIONS

Ota et al "Indium-tin-oxide Films Prepared by Dip Coating Using an Ethanol Solution of Indium Chloride and Tin Chloride" Surface and Coating Technology 169-170 (2003) p. 521-524.*

(Continued)

*Primary Examiner* — Nathan Empie
(74) *Attorney, Agent, or Firm* — Klarquist Sparkman, LLP

(57) ABSTRACT

Disclosed embodiments concern solution deposition of at least a first inorganic compound on a substrate, typically for production of electronic devices, such as solution deposition of metal salts, including halides, carbonyls, acetates, sulfates, phosphates, carbonates, and mixtures thereof. Solutions may be deposited using any suitable process, particularly inkjet printing or spin coating. The method can involve depositing only a first solution, depositing a first solution plural times, or deposition of plural different solutions. Furthermore, the method may involve simultaneous or serial deposition of two or more solutions. The method may further comprise post deposition processing the deposited material, such as thermal annealing, oxidation processes, reduction processes, exchange reactions, and combinations thereof. Electronic devices that can be made by the method also are described, including transistors, circuits, capacitors, photovoltaics, photodetectors, such as a UV detector, gas sensors, batteries, X-ray imagers, light emitting diodes, solid electrolytes, computer readable media, and combinations thereof.

32 Claims, 42 Drawing Sheets

(56) References Cited

U.S. PATENT DOCUMENTS

| | | | |
|---|---|---|---|
| 5,502,470 A * | 3/1996 | Miyashita et al. | 347/45 |
| 5,534,328 A | 7/1996 | Ashmead et al. | |
| 5,571,754 A | 11/1996 | Bertin et al. | |
| 5,575,855 A | 11/1996 | Kanai et al. | |
| 5,580,523 A | 12/1996 | Bard | |
| 5,610,645 A | 3/1997 | Moore et al. | |
| 5,611,214 A | 3/1997 | Wegeng et al. | |
| 5,648,684 A | 7/1997 | Bertin et al. | |
| 5,689,966 A | 11/1997 | Zess et al. | |
| 5,749,226 A | 5/1998 | Bowman et al. | |
| 5,769,985 A | 6/1998 | Kawakami et al. | |
| 5,779,833 A | 7/1998 | Cawley et al. | |
| 5,811,062 A | 9/1998 | Wegeng et al. | |
| 5,853,866 A * | 12/1998 | Watanabe et al. | 428/312.8 |
| 5,932,940 A | 8/1999 | Epstein et al. | |
| 5,972,527 A * | 10/1999 | Kaijou et al. | 428/697 |
| 5,974,867 A | 11/1999 | Forster et al. | |
| 5,985,068 A | 11/1999 | Kawakami et al. | |
| 6,048,432 A | 4/2000 | Ecer | |
| 6,100,463 A | 8/2000 | Ladd et al. | |
| 6,121,539 A | 9/2000 | Johnson et al. | |
| 6,129,973 A | 10/2000 | Martin et al. | |
| 6,143,247 A | 11/2000 | Sheppard et al. | |
| 6,148,635 A | 11/2000 | Beebe et al. | |
| 6,172,152 B1 * | 1/2001 | Kim et al. | 524/379 |
| 6,192,596 B1 | 2/2001 | Bennett et al. | |
| 6,202,312 B1 | 3/2001 | Rando | |
| 6,225,149 B1 | 5/2001 | Gan et al. | |
| 6,225,497 B1 | 5/2001 | Becker et al. | |
| 6,329,139 B1 | 12/2001 | Nova et al. | |
| 6,357,332 B1 | 3/2002 | Vecchio | |
| 6,537,506 B1 | 3/2003 | Schwalbe et al. | |
| 6,652,627 B1 | 11/2003 | Tonkovich et al. | |
| 6,672,502 B1 | 1/2004 | Paul et al. | |
| 6,676,835 B2 | 1/2004 | O'Connor et al. | |
| 6,688,381 B2 | 2/2004 | Pence et al. | |
| 6,737,026 B1 | 5/2004 | Bergh et al. | |
| 6,744,038 B2 | 6/2004 | Wang et al. | |
| 6,749,814 B1 | 6/2004 | Bergh et al. | |
| 6,793,831 B1 | 9/2004 | Paul et al. | |
| 6,814,859 B2 | 11/2004 | Koehler et al. | |
| 6,863,867 B2 | 3/2005 | Bussche et al. | |
| 6,903,332 B2 | 6/2005 | Weiss et al. | |
| 6,981,522 B2 | 1/2006 | O'Connor et al. | |
| 7,118,920 B2 | 10/2006 | Brophy et al. | |
| 7,150,815 B2 | 12/2006 | Ashmead et al. | |
| 7,341,917 B2 | 3/2008 | Milliron et al. | |
| 7,507,380 B2 | 3/2009 | Chang et al. | |
| 2002/0045265 A1 | 4/2002 | Bergh et al. | |
| 2002/0105080 A1 * | 8/2002 | Speakman | 257/749 |
| 2002/0108859 A1 | 8/2002 | Wang et al. | |
| 2003/0047816 A1 | 3/2003 | Dutta | |
| 2003/0052429 A1 | 3/2003 | Vigna et al. | |
| 2003/0118865 A1 * | 6/2003 | Marks et al. | 428/690 |
| 2003/0168590 A1 | 9/2003 | Weiss et al. | |
| 2004/0022691 A1 | 2/2004 | Allen et al. | |
| 2004/0208751 A1 | 10/2004 | Lazar et al. | |
| 2004/0246321 A1 * | 12/2004 | Takashima et al. | 347/100 |
| 2004/0256230 A1 | 12/2004 | Yager et al. | |
| 2005/0074834 A1 | 4/2005 | Chaplen et al. | |
| 2005/0126211 A1 | 6/2005 | Drost et al. | |

OTHER PUBLICATIONS

"Direct Writing of Inkjet Printing of Transparent Conducting Oxides (TCO) such as Antimony Tin Oxide (ATO)" Materials World, vol. 11. No. 7 pp. 12-13 Jul. 2003; obtained from http://www.azon.com/details.asp?ArticleID=2156, pp. 1-7.*

Zhang et. al. "Investigation of Sol-gel Derived Indium Tin Oxide Thin Films with Poly(ethyleneglycol) as an Additive", Journal of Ceramic Processing Research. vol. 5, No. 3, pp. 208-213. (2004).*

Zhang et. al. "Quartz Crystal Microbalance Coated with Sol-gel-derived Thin Films as Gas Sensor for NO Detection", Sensors 2003, 3, p. 404-414.*

Review article by Schmidt et al from http://www.solgel.com/articles/Nov00/coating.htm, available online Nov. 2000.*

Lee et al., "A General and Low-Cost Route to Printable High-Mobility Inorganic Thin Film Transistors." *Digital Fabrication*, p. 27-30 (Sep. 17, 2006).

Lee et al., "A General Route to Printable High-Mobility Transparent Amorphous Oxide Semiconductors." *Adv. Mater.*, vol. 19, pp. 843-847 (2007).

Chang et al., "High-performance spin-coated zinc tin oxide thin-film transistors." *Electrochemical and Solid-State Letters*, 10(5), pp. H135-H138 (2007).

Kern, Werner et al. "Advances in deposition processes for passivation films," *J. Vac. Sci. Technol*, 14(5), pp. 1082-1099 (Sep./Oct. 1977).

Spear, W.E. et al., "Substitutional Doping of Amorphous Silicon," *Solid State Communications*, vol. 17, pp. 1193-1196 (1975).

Sirringhaus, H. et al., "High-Resolution Inkjet Printing of All-Polymer Transistor Circuits," *Science*, vol. 290, pp. 2123-2126 (Dec. 15, 2000).

Afzali, Ali et al., "High-Performance, Solution-Processed Organic Thin Film Transistors from a Novel Pentacene Precursor," *J. Am. Chem. Soc.*, vol. 124, pp. 8812-8813 (2002).

Volkman, Steven K. et al., "Inkjetted Organic Transistors using a Novel Pentacene Precursor," *Mat. Res. Soc. Symp. Proc.*, vol. 769, pp. H11.7.1/L12.7.1-H11.7.6/L12.7.6 (2003).

Arias, Ana C. et al., "Polymer transistor display backplanes: High performance inkjet printed devices," Abstracts of Papers, 229th ACS National Meeting, San Diego, CA, United States (Mar. 13-17, 2005). PMSE-161. Publisher: American Chemical Society, Washington, D.C.

Hong, Cheong Min et al., "Inkjet Printed Copper Source/Drain Metallization for Amorphous Silicon Thin-Film Transistors," *IEEE Electron Device Letters*, 21(8), pp. 384-386 (Aug. 2000).

Fuller, Sawyer B. et al., "Ink-Jet Printed Nanoparticle Microelectromechanical Systems," *J. Microelectromechanical Systems*, 11(1), pp. 54-60 (Feb. 2002).

Ridley, Brent A. et al., "All-Inorganic Field Effect Transistors Fabricated by Printing," *Science*, vol. 286, pp. 746-749 (Oct. 22, 1999).

Ginley, David S. et al., "Transparent Conducting Oxides," *Materials Research Society Bulletin*, 25(8), pp. 15-18 (Aug. 2000).

Lewis, Brian G. et al., "Applications and Processing of Transparent Conducting Oxides," *Materials Research Society Bulletin*, 25(8), pp. 22-27 (Aug. 2000).

Kawazoe, Hiroshi et al., "Transparent p-Type Conducting Oxides: Design and Fabrication of p-n Heterojunctions," *Materials Research Society Bulletin*, 25(8), pp. 28-36 (Aug. 2000).

Minami, Tadatsugu, New n-Type Transparent Conducting Oxides, *Materials Research Society Bulletin*, 25(8), pp. 38-44 (Aug. 2000).

Freeman, A.J. et al., "Chemical and Thin-Film Strategies for New Transparent Conducting Oxides," *Materials Research Society Bulletin*, 25(8), pp. 45-51 (Aug. 2000).

Gordon, Roy G., "Criteria for Choosing Transparent Conductors," *Materials Research Society Bulletin*, 25(8), pp. 52-57 (Aug. 2000).

Tonsia, Antoni P., "Bioactive Glass Coating for Titanium Bone Implants Strengthens Their Adhesion," *Materials Research Society Bulletin*, 25(8), pp. 9-13 (Aug. 2000).

Chopra, K.L. et al., "Transparent Conductors—A Status Review," *Thin Solid Films*, vol. 102, pp. 1-46 (1983).

Alman et al., "Fabrication, Structure and Properties of Aluminum-Aluminide Layered Composites," *Materials Research Society Symp. Proc.*, vol. 434, pp. 255-260, 1996.

Alman et al., "Processing, Structure and Properties of Aluminum-Aluminide Layered Sheet Composites," Light Weight Alloys for Aerospace Applications III, The Minerals, Metals & Materials Society, pp. 531-544, 1995.

Chang, Y.J, et al., "Nanocrystalline CdS MISFETs Fabricated by a Novel Continuous Flow Microreactor," *Electrochemical and Solid-State Letters*, 9(5), pp. G174-G177, 2006.

Colgan, "A Review of Thin-Film Aluminide Formation," Material Science Reports 5, pp. 1-44, North-Holland, Jan. 1990.

deMello, John and Andrew; "Microscale reactors: nanoscale products," *The Royal Society of Chemistry*, Lab Chip, No. 4, pp. 11N-15N, 2004.

(56) References Cited

OTHER PUBLICATIONS

Demura et al., "Ductile Thin Foil of $Ni_3Al$," *Mechanical Properties of Structural Films*, 15 pages, Nov. 11-12, 2000.

Final Office Action, issued by the U.S. Patent and Trademark Office on May 28, 2009, for U.S. Appl. No. 11/490,966, 12 pp.

Hershberg, "Manufacturing Technology of the Tektronix Digital Ink Jet Head," *SPSE 3rd International Congress on Advanced in Non-Impact Printing Technologies, Journal of Imaging Technology*, vol. 14, pp. 124-128, 1998.

Hessell et al., "Micro mixers—a review on passive and active mixing principles," *Chem. Eng. Sci.*, 60, 2479-2501, 2005.

Office Action issued by the U.S. Patent and Trademark Office on Apr. 1, 2008, for U.S. Appl. No. 11/086,074, 22 pp.

Office Action issued by the U.S. Patent and Trademark Office on Dec. 23, 2009, for U.S. Appl. No. 11/490,966, 15 pp.

Office Action issued by the U.S. Patent and Trademark Office on Oct. 21, 2008, for U.S. Appl. No. 11/490,966, 10 pp.

Ridley, Bret, "Inorganic Semiconductors for Printed Transistors," Ph.D. Thesis, MIT, 25 pp., 1999.

Tour, "Chapter 3: Chemical Synthesis," *Molecular Electronics, Commercial Insights, Chemistry, Devices, Architecture and Programming*, World Scientific, pp. 33-41, Mar. 2003.

Voss, C. et al., "Growth Kinetics of Thin-Film Cadmium Sulfide by Ammonia-Thiourea Based CBD," *Journal of the Electrochemical Society*, 151 (10), pp. C655-C660, 2004.

Tadatsugu Minami, "New n-Type Transparent Conducting Oxides," *MRS Bulletin*, pp. 38-44, Aug. 2000.

\* cited by examiner

SOLUTION DEPOSITION OF INORGANIC MATERIALS AND ELECTRONIC DEVICES MADE COMPRISING THE INORGANIC MATERIALS

This application claims the benefit of the earlier filing date of U.S. Provisional Application No. 60/740,707, filed on Nov. 29, 2005, and U.S. Provisional Application No. 60/781,347, filed on Mar. 10, 2006. The entire disclosures of these provisional applications are considered to be part of the disclosure of the accompanying application and are incorporated herein by reference.

ACKNOWLEDGMENT OF GOVERNMENT SUPPORT

This invention was made with government support under CTS-0348723 awarded by the National Science Foundation. The government has certain rights in this invention.

FIELD

The present disclosure concerns embodiments of a method for making inorganic materials, particularly materials useful for electronic applications, embodiments of a method for depositing the inorganic materials, typically as thin films, onto a substrate, and products made comprising the inorganic materials.

BACKGROUND

Electronic devices are ubiquitous in modern society, prompting technological development in related or peripheral fields, such as transistor materials and methods for their manufacture. Current methods for producing functional inorganic electronic devices are based on sequential deposition and etching of selected semiconducting, conducting, and insulating materials. These sequential processes generally involve multiple photolithography and vacuum deposition steps, such as physical or chemical vapor deposition, which contribute to their high manufacturing costs. Thin films conventionally are deposited by a CVD (Chemical Vapor Deposition) method and a sputtering method. Silicon films, such as amorphous silicon films, and poly-silicone films, typically are used for the semiconductor films and have been formed by thermal CVD, plasma CVD or photo-CVD using monosilane or disilane gas. Thermal CVD generally has been used for depositing poly-silicon films (*J. Vac. Sci. Technology*, Vol. 14, p 1082 (1977)). Plasma CVD has been used for depositing amorphous silicon (*Solid State Com.*, Vol. 17, p 1193 (1975)).

Silicon films formed by CVD have experienced manufacturing complications. For example, the yield is low due because the manufacturing apparatus becomes contaminated and side products are formed. Moreover, a silicon film having a uniform thickness cannot be deposited on a substrate having a rough surface, since a gaseous starting material is used. The substrate also must be heated, and productivity is low because of unacceptably slow film deposition rates. Finally, complicated and expensive microwave generators and evacuation apparatuses are necessary for plasma CVD deposition.

Inkjet printed organic materials are known. Sirringhaus et al., for example, fabricated all-polymer thin film transistors using a combination of inkjet printing and spin-coating. Sirringhaus, H., Kawase, T., Friend, R. H., Shimoda, T., Inbasekaran, M., Wu, W., Woo, E. P., "High-resolution inkjet printing of all-polymer transistor circuits," *Science*, 290, 2123-2126 (2000). A mobility of 0.02 $cm^2/V \cdot sec$ was achieved by spin-coating a semiconducting polymer channel layer. Researchers at IBM developed a one-step synthetic process for making a soluble pentacene precursor. Afzali A., Dimitrakopoulos, C. D., Breen, T. L., "High-performance, solution-processed organic thin film transistors from a novel pentacene precursor," *JACS Comm.* 124, 8812-8813 (2002). The first inkjet-printed pentacene transistor was fabricated in 2003 with a mobility of 0.02 $cm^2/V \cdot sec$ and a current on-to-off ratio of $10^5$. Volkman S. K., Molesa, S., Mattis, B. Chang, P. C., Subramanian, V., "Inkjetted organic transistors using a novel pentacene precursor," Mat. Res. Soc. Symp. Proc. 769, H11.7.1/L12.7.1-H11.7.6/L12.7.6 (2003). Arias et al. reported an inkjet-printed TFT using a polythiophene semiconductor channel having a field effect mobility of 0.1 $cm^2/V \cdot s$, and a current on-to-off ratio of $10^7$. Arias, A. C. et al., "Polymer transistor display backplanes: high performance inkjet printed devices," *Abstract of papers*, $229^{th}$ ACS National Meeting, San Diego, Calif., United States (2005). Recently, Kawasaki et al. reported an organic TFT that was made using an inkjet-printed pentacene channel layer having a mobility of 0.15 $cm^2/V \cdot s$ (the highest value for all reported inkjet printed TFTs) and a current on-to-off ratio of $10^5$. Kawasaki, M. et al., "Printable organic TFT technologies for FPD applications," *Proceedings of SPIE-The International Society for Optical Engineering* 5940 (Organic Field-Effect Transistors IV) (2005).

To date, very few inorganic materials have been inkjet printed, and most published reports concern printing metal nanoparticle solutions for metallization. For example, copper nanoparticle solutions were inkjet printed for source/drain metallization of a-Si TFTs. Hong, C. M., Wagner S., "Inkjet printed copper source/drain metallization for amorphous silicon thin-film transistors," *IEEE Electron Device Lett.* 21(8), 384-386 (2000). Silver and gold nanoparticle solutions have been used for inkjet printing active microelectromechanical systems (MEMS). Fuller, S. B., Wilhelm, E. J., Jacobson, J. M., "Ink-jet printed nanoparticle microelectromechanical systems," *Journal of microelectromechanical systems* 11(1), 54-60 (2002). Ridley et al. report printing inorganic semiconducting channel materials. Ridley et al. fabricated a thin film transistor having a mobility of 1 $cm^2/V \cdot s$ and a current on-to-off ratio of $3.1 \times 10^4$ by casting CdSe thin films from a precursor solution of cadmium selenide nanocrystals using a micropipette. Ridley, B. A., Nivi, B., Jacobson, J. M., "All-inorganic field effect transistors fabricated by printing," *Science* 286(5440), 746-749 (1999).

Transparent conducting oxides (TCOs), like zinc oxide, tin oxide, and indium tin oxide, are important for a plethora of optical and electrical applications. For example, such materials are useful for making flat-panel displays, organic light-emitting diodes, electromagnetic shielding, and electrochromatic windows. See, for example, MRS Bulletin, *Transparent Conducting Oxides*, 25(8), 22-65 (2000); and Chopra, K. L., Major, S., Pandya, D. K., "Transparent conductors—a status review," *Thin Solid Films* 102, 1-46 (1983). More recently, conductive oxide materials have been used as channel materials for thin film transistors. See, for example, Nomura, K., Ohta H., Takagi A., Kamiya T., Hirano M., Hosono H., "Room-temperature fabrication of transparent flexible thin-film transistors using amorphous oxide semiconductors," *Nature* 432, 488-492 (2004); and Nomura, K., Ohta H., Ueda K., Kamiya T., Hirano M., Hosono H., "Thin-film transistor fabricated in single-crystalline transparent oxide semiconductor," *Science* 300(5623), 1269-1272 (2003).

Methods for solution processing materials for electronic device applications also have been patented. For example, Ostergard, U.S. Pat. No. 6,946,677, entitled "Pre-Patterned Substrate for Organic Thin Film Transistor Structures and Circuits and Related Method for Making Same," concerns forming a desired circuit configuration in the surface of a substrate, thereby pre-patterning the area to receive material useful for forming an organic thin film transistor (OTFT) structure and interconnecting conductive paths. According to the '677 patent, the "OTFT material is deposited in the pre-patterned area using printing techniques such as inkjet printing."

Weng et al., U.S. Pat. No. 6,927,108, also concerns solution processing thin-film materials for forming transistors. The '108 patent concerns forming "conductive solution-processed thin film material contacts, semiconductor solution-processed thin film material active regions, and dielectric solution-processed thin film material isolations in a sequence and organization to form a solution-processed thin film structure capable of transistor operation." Additional structure is formed by laser ablation "in one or more of the conductive solution-processed thin film material contacts, the semiconductor solution-processed thin film material active regions and the dielectric solution-processed thin film material isolations to pattern or complete patterning of a material being selectively ablated." The method may involve "depositing drain and source conductive solution-processed thin film material and depositing gate conductive material solution-processed thin film material" by inkjet printing conductive solution-processed thin film material. The '108 patent states that:

categories of solution-processed thin films include organic thin films and polymer thin film categories. The majority of the solution-processed materials that can be formed into thin films are the conductive polymers, semiconductive polymers and dielectric polymers. However, a solution-processed material may also be a precursor of small organic molecular material that is soluble in a solvent. One example is the pentacene precursor that is soluble in chloroform. It can be spin-coated to form a thin film and then heated to reduce to pentacene at temperatures of ≈200° C. Pentacene is an organic semiconductor but is not a polymer.

The '108 patent also states that "there may be inorganics that may be solution-processed to form thin films." However, no species of inorganic material appears to be identified by the '108 patent, nor is any detail provided by the '108 patent that would enable a person of ordinary skill in the art to solution-process an inorganic material to form electronic devices.

SUMMARY

Embodiments of the present invention address deficiencies of known processes. Solution-based deposition processes provide several advantages, such as low manufacturing costs, and large area depositions. Furthermore, direct writing provides high efficiency, and precludes having to use multiple lithography steps and/or processes. Solution-processing refers generally to forming a solution of materials for subsequent deposition by a solution technique, e.g., inkjet printing or spin coating, typically resulting in the formation of a thin film.

A first disclosed embodiment of a method for solution deposition of inorganic compounds involves providing a first solution comprising at least a first inorganic compound, and depositing the solution on a substrate. The inorganic compound often comprises a metal, such as a Group Ia, IIa, IIIa, IVa, Va, Ib, IIb, IIIb, IVb, Vb, VIIb, VIIb, or VIIIb metal, or mixtures thereof, with specific examples of metals including ant4imony (Sb), bismuth (Bi), cadmium (Cd), calcium (Ca), magnesium (Mg), barium (Ba), strontium (Sr), copper (Cu), gallium (Ga), gold (Au), titanium (Ti), zirconium (Zr), hafnium (Hf), indium (In), aluminum (Al), iron (Fe), ruthenium (Ru), lead (Pb), manganese (Mn), rhenium (Re), chromium (Cr), molybdenum (Mo), tungsten (W), nickel (Ni), silicon (Si), silver (Ag), thallium (Tl), germanium (Ge), tin (Sn), vanadium (V), niobium (Nb), tantalum (Ta), scandium (Sc), lanthanum (La), yttrium (Y), zinc (Zn), cobalt (Co), rhodium (Rh), lithium (Li), sodium (Na), potassium (K), rubidium (Rb), cesium (Cs), boron (B), mercury (Hg), palladium (Pd), platinum (Pt), iridium (Ir), osmium (Os), technetium (Tc), cerium (Ce), beryllium (Be), europium (Eu), terbium (Tb), gadolinium (Gd), holmium (Ho), erbium (Er), thulium (Tm), or lutetium (Lu).

Several working embodiments have used metal halides, metal carbonyls, and/or metal carbonyl halides as the inorganic compound. Examples of such compounds include, without limitation, $SbCl_3$, $SbBr_3$, $SbI_3$, $SbF_3$, $SbCl_5$, $SbBr_5$, $SbI_5$, $SbF_5$, $BiCl_3$, $BiBr_3$, $BiI_3$, $BiF_3$, $CdCl_2$, $CdBr_2$, $CdI_2$, $CdF_2$, $CaF_2$, $CaBr_2$, $CaCl_2$, $CaI_2$, $MgCl_2$, $MgBr_2$, $MgI_2$, $MgF_2$, $BaCl_2$, $BaBr_2$, $BaI_2$, $BaF_2$, $BeF_2$, $BeCl_2$, $BeBr_2$, $BeI_2$, strontium (Sr), $CuCl$, $CuBr$, $CuI$, $CuF$, $CuCl_2$, $CuBr_2$, $CuI_2$, $CuF_2$, $GaCl$, $GaI$, $GaBr$, $GaF$, $GaCl_3$, $GaBr_3$, $GaI_3$, $GaF_3$, $AuCl$, $AuCl_3$, $Au4Cl_8$, $AuBr$, $AuBr_3$, $AuI$, $AuI_3$, $AuF_3$, $AuF_5$, $TiCl_2$, $TiBr_2$, $TiI_2$, $TiF_2$, $TiCl_3$, $TiBr_3$, $TiI_3$, $TiF_3$, $TiCl_4$, $TiBr_4$, $TiI_4$, $TiF_4$, $ZrC_2$, $ZrBr_2$, $ZrI_2$, $ZrF_2$, $ZrCl_3$, $ZrBr_3$, $ZrI_3$, $ZrF_3$, $ZrCl_4$, $ZrBr_4$, $ZrI_4$, $ZrF_4$, $HfCl_4$, $HfBr_4$, $HfI_4$, $HfF_4$, $InCl$, $InBr$, $InI$, $InF$, $InCl_2$, $InBr_2$, $InI_2$, $InF_2$, $InCl_3$, $InCBr_3$, $InI_3$, $InF_3$, $AlCl_3$, $AlBr_3$, $AlI_3$, $AlF_3$, $TlCl$, $TlBr$, $TlI$, $FeI_2$, $FeI_3$, $FeCl_2$, $FeCl_3$, $FeBr_2$, $FeBr_3$, $FeF_2$, $FeF_3$, $RuCl_2$, $RuBr_2$, $RuI_2$, $RuF_2$, $RuCl_3$, $RuBr_3$, $RuI_3$, $RuF_3$, $PbCl$, $PbBr$, $PbI$, $PbF$, $MnCl_2$, $MnBr_2$, $MnF_2$, $MnI_2$, $ReCl_2$, $ReBr_2$, $ReI_2$, $ReF_2$, $ReI_4$, $ReI_4$, $CrCl_3$, $CrBr_3$, $CrI_3$, $CrF_3$, $MoCl_4$, $MoBr_4$, $MoI_4$, $MoCl_2$, $ReCl_4$, $ReBr_4$, $MoBr_3$, $MoI_3$, $MoF_3$, $MoCl_4$, $MoBr_4$, $MoI_4$, $MoF_4$, $MoCl_5$, $MoCl_6$, $WCl_6$, $WBr_6$, $WI_6$, $WF_6$, $AgI$, $AgBr$, $AgCl$, $TlCl$, $TlBr$, $TlI$, $TlF$, $SiCl_2$, $SiCl_4$, $SiBr_2$, $SiBr_4$, $SiI_2$, $SiI_4$, $SiF_2$, $SiF_4$, $GeCl_2$, $GeCl_4$, $GeBr_2$, $GeBr_4$, $GeI_2$, $GeI_4$, $GeF_2$, $GeF_4$, $SnCl_2$, $SnCl_4$, $SnBr_2$, $SnBr_4$, $SnI_2$, $SnI_4$, $SnF_4$, $VCl_2$, $VBr_2$, $VI_2$, $VF_2$, $VCl_3$, $VBr_3$, $VI_3$, $VF_3$, $VCl_4$, $VBr_4$, $VI_4$, $VF_4$, $NbCl_3$, $NbBr_3$, $NbI_3$, $NbCl_5$, $NbBr_5$, $NbI_5$, $NbF_5$, $TaCl_3$, $TaBr_3$, $TaI_3$, $TaF_3$, $TaCl_4$, $TaBr_4$, $TaI_4$, $TaF_4$, $TaCl_5$, $TaBr_5$, $TaI_5$, $TaF_5$, $ScCl_3$, $ScBr_3$, $ScI_3$, $ScF_3$, $LaCl_3$, $LaBr_4$, $LaI_3$, $LaF_3$, $YCl_3$, $YBr_3$, $YI_3$, $YF_3$, $ZnCl_2$, $ZnBr_2$, $ZnI_2$, $ZnF_2$, $NiCl_2$, $NiBr_2$, $NiI_2$, $NiF_2$, $CoCl_2$, $CoBr_2$, $CoI_2$, $CoF_2$, $CoCl_3$, $CoBr_3$, $CoI_3$, $CoF_3$, $RhCl_3$, $RhBr_3$, $RhI_3$, $RhF_3$, $LiCl$, $LiBr$, $LiI$, $LiF$, $NaCl$, $NaBr$, $NaI$, $NaF$, $KCl$, $KBr$, $KI$, $KF$, $RbCl$, $RbBr$, $RbI$, $RbF$, $CsCl$, $CsBr$, $CsI$, $CsF$, $BCl_3$, $BBr_3$, $BI_3$, $BF_3$, $HgCl_2$, $HgBr_2$, $HgI_3$, $HgF_3$, $PdCl_2$, $PdBr_2$, $PdBr_2$, $PdI_2$, $PdF_2$, $PdF_4$, $PtCl_3$, $PtCl_4$, $PtBr_3$, $PtBr_2$, $PtBr_4$, $PtI_2$, $PtI_3$, $PtI_4$, $PtF_4$, $PtF_6$, $IrCl_2$, $IrBr_2$, $IrI_2$, $IrF_2$, $IrF_2$, $IrCl_3$, $IrBr_3$, $IrI_3$, $IrF_3$, $IrCl_4$, $IrBr_4$, $IrI_4$, $IrF_4$, $OsCl_3$, $OsCl_4$, $OsCl_5$, $OsBr_3$, $OsBr_4$, $OsI$, $OSI_2$, $OsI_3$, $OsF_4$, $OsF_5$, $OsF_6$, $OsF_7$, $OsF_8$, $TcF_5$, $TcF_6$, $TcCl_4$, $TcCl_6$, $TcBr_4$, $Tc_2(CO)_{10}$, $Tc_3(CO)_{12}$, $CeCl_2$, $CeBr_2$, $CeI_2$, $CeF_2$, $CeCl_3$, $CeBr_3$, $CeI_3$, $CeF_3$, $EuCl_2$, $EuBr_2$, $EuI_2$, $EuF_2$, $EuCl_3$, $EuBr_3$, $EuI_3$, $EuF_3$, $TbF_2$, $TbF_3$, $TbF_4$, $TbCl_3$, $TbBr_3$, $TbI_3$, $GdCl_2$, $GdCl_3$, $GdBr_2$, $GdI_2$, $GdF_2$, $HoCl_3$, $HoBr_3$, $HoI_3$, $HoF_3$, $ErCl_3$, $ErBr_3$, $ErI_3$, $ErF_3$, $SrCl_2$, $SrBr_2$, $SrI_2$, $TcF_5$, $TcF_6$, $TcCl_4$, $TcCl_6$, $TcBr_4$, $Tc_2(CO)_{10}$, $Tc_3(CO)_{12}$, $ThCl_4$, $ThBr_4$, $ThI_3$, $ThI_3$, $ThI_4$, $ThF_4$, $TmCl_2$, $TmBr_2$, $TmI_2$, $TmF_2$, $TmCl_3$, $TmBr_3$, $TmI_3$, $TmF_3$, $LuCl_3$, $LuB_{r3}$, $LuI_3$, $LuF_3$, $CuAgI_2$, $CuCdI_2$, $CuBiI_4$, $CuPbI_3$, $CuSnI_5$, $SbSI$, $Sc(CO)$, $Ti(CO)_4$, $Ti(CO)_6$, $V(CO)_6$, $Cr(CO)_6$, $Mn_2(CO)1_2$, $Fe(CO)_5$, $Fe_2(CO)_9$, $Co_2(CO)_8$, $Co_4(CO)_{12}$, $Co_6(CO)_{16}$, $Rh_2(CO)_8$, $Rh_4(CO)_{12}$, $Rh6(CO)_{16}$, $Ni(CO)_4$, $Y(CO)_3$, $Zr(CO)_7$, $Nb(CO)_6$, $MO(CO)_6$, $Tc(CO)$, $Ru(CO)_5$, $Ru_2(CO)_{10}$, $Ru_3(CO)_{12}$, $Rh(CO)$, $Pd(CO)_4$, $Ag(CO)$, Hf(CO)$_7$, Ta(Co)$_6$, W(CO)$_6$, Re$_2$(CO)$_{10}$, Os$_3$(CO)$_{12}$, Ir$_4$(CO)$_{12}$, Pt(CO)$_4$, Au(CO), Mn(CO)$_5$Cl, Re(CO)$_4$Cl$_2$, Ru(CO)$_2$I$_2$, Os(CO)$_3$Cl$_2$, Ir(Co)$_2$Cl$_2$, Pt(CO)Cl$_2$, and Pt(CO)$_2$Cl$_2$. However, a person of ordinary skill in the art will appreciate that other compounds also can be used to practice the invention including, by way of example and without limitation, acetates, sulfates, phosphates, carbonates, carbonyls, and mixtures thereof. For metal halides, the inorganic compound may have a formula M$_a$X$_b$ where M is a metal, X is a halide, a is 1, 2 or 3, and b provides halide anions sufficient to equal a positive charge on the metal. Particularly useful halides include chloride and iodide. For other compounds, the inorganic compound may have a formula M$_a$Y$_b$ where M is a metal, Y is an anionic species, a is sufficient to provide metal atoms equal to the sum of the charge associated with any one or more Y groups, and b is sufficient to provide anionic groups equal to the sum of the positive charge associated with one or more metal atoms.

The inorganic compound also may be a binary compound, a ternary compound, or other higher-order compound. Examples of suitable binary inorganic compounds may have a formula M$_a^1$M$_b^2$Y$_c$ where a+b is sufficient to provide metal atoms equal to a negative charge associated with any one or more Y groups, and c is sufficient to provide anionic groups equal to a positive charge associated with the metal atoms. Examples of suitable ternary inorganic compounds have a formula M$_a^1$M$_b^2$M$_c^3$Y$_d$ where a+b+c is sufficient to provide metal atoms equal to a negative charge associated with any one or more Y groups, and d is sufficient to provide anionic groups equal to a positive charge associated with the metal atoms. Examples of higher order compounds include copper-cadmium, copper-silver, zinc-indium, zinc-tin, indium-tin, and manganese-silicon-zirconium oxide (ZrSiO$_4$:Mn).

The solvent used to form the solution, or solutions, used to practice the method can be any solvent suitably capable of dissolving required compounds. Additional factors to consider when selecting a solvent include: compatibility with other materials or facets of the process, such as substantially inert to substrate materials; volatility, as the more volatile the solvent, the easier it is to remove the solvent post deposition, such as by evaporation; availability; cost; and toxicity. Examples of suitable solvents include, but are not limited to, protic and aprotic aliphatic organic solvents, protic and aprotic heteroaliphatic solvents, protic and aprotic aryl solvents, protic and aprotic heteroaryl solvents, and combinations thereof. Specific examples of solvents include nitrites or alcohols, such as lower (i.e. 10 carbon atoms or fewer) alcohols or nitrites.

The method also includes removing, such as by evaporating, the solvent. Solvent can be allowed to evaporate under ambient conditions; alternatively, steps can be used to facilitate evaporation, such as by heating or impinging the solvent with a flowing fluid like an inert gas, such as nitrogen or argon.

Disclosed embodiments of the present invention deposit at least a first material onto a substrate. Solution may be deposited using any suitable process, such as inkjet printing, spin coating, gravure coating, micro-pen coating, nano-fountain pen coating, dip-pen coating, screen printing, spray coating, slide coating, slot coating, curtain coating, dip coating, and combinations thereof. Spin coating and inkjet printing are two currently preferred solution deposition processes.

The method may further comprise post deposition processing the deposited material. Examples of post deposition processing include thermal annealing, oxidation processes, reduction processes, exchange reactions, disproportionation reaction, and combinations thereof.

For example, deposited metal halides may be post deposition processed to oxidize the metal halide to form a metal oxide. Post deposition processing to convert the first compound to a metal oxide can be accomplished by treatment with water, oxygen, a chemical oxidizing agent, or combinations thereof. Examples of metal oxides include, without limitation, ZnO—In$_2$O$_3$ (ZIO), ZnO, In$_2$O$_3$, SnO$_2$, In$_2$O$_3$—SnO$_2$ (ITO), ZnO—SnO$_2$ (ZTO), and In$_2$O$_3$—ZnO—SnO$_2$ (IZTO), Ga$_2$O$_3$, ZnO—Ga$_2$O$_3$ (ZGO), Al$_2$O$_3$, B$_2$O$_3$, GeO$_2$, PbO, In$_2$O$_3$—GeO$_2$, SnO$_2$—GeO$_2$, SiO$_2$, CdO, CdO—SnO$_2$, CuO, CuO—Al$_2$O$_3$, MgO, MgO—In$_2$O$_3$, CaO, CaO—Al$_2$O$_3$, SrO, SrO$_2$, TcO$_2$, Tc$_2$O$_7$, BeO, TbO$_2$, Tb$_2$O$_3$, BaO, AgO, Ag$_2$O, ScO, CuO—ScO, SrO, CoO, Fe$_2$O$_3$, Fe$_3$O$_4$, ZnO—Fe$_3$O$_4$, Cr$_2$O$_3$, ZnO—Cr$_2$O$_3$, NiO, RuO$_2$, ReO$_2$, ReO$_3$, RhO, MoO$_2$, MnO, WO, V$_2$O$_3$, Nb$_2$O$_3$, Ta$_2$O$_5$, TiO$_2$, BaO—TiO$_2$, ZrO$_2$, ZrO$_2$—SiO$_2$, HfO$_2$, HfO$_2$—SiO$_2$, Y$_2$O$_3$, La$_2$O$_3$, PbO, TiO, Sb$_2$O$_3$, Sb$_2$O$_3$—SnO$_2$, Sb$_2$O$_5$, Bi$_2$O$_3$, and any and all combinations thereof.

Specific examples of post deposition processing include air annealing. Working embodiments have air annealed at 600° C. for one hour.

Post deposition processing also can be used to convert the first compound to a second compound other than a metal oxide, such as a metal (typically in an oxidation state other than as deposited), silicon, sulfides, selenides, tellurides, nitrides, carbides, phosphides, borides, or combinations thereof. Examples of metals that can be produced by post deposition processing include antimony (Sb), bismuth (Bi), cadmium (Cd), calcium (Ca), magnesium (Mg), barium (Ba), strontium (Sr), copper (Cu), gallium (Ga), gold (Au), titanium (Ti), zirconium (Zr), hafnium (Hf), indium (In), aluminum (Al), iron (Fe), ruthenium (Ru), lead (Pb), rhenium (Re), chromium (Cr), molybdenum (Mo), tungsten (W), nickel (Ni), silicon (Si), silver (Ag), thallium (Tl), germanium (Ge), tin (Sn), vanadium (V), niobium (Nb), tantalum (Ta), scandium (Sc), lanthanum (La), yttrium (Y), zinc (Zn), cobalt (Co), rhodium (Rh), lithium (Li), sodium (Na), potassium (K), rubidium (Rb), cesium (Cs), boron (B), mercury (Hg), palladium (Pd), platinum (Pt), iridium (Ir), osmium (Os), technetium (Tc), cerium (Ce), beryllium (Be), europium (Eu), terbium (Tb), gadolinium (Gd), holmium (Ho), erbium (Er), thulium (Tm), or lutetium (Lu). Post deposition processing can convert the first compound to: a sulfide by treatment with a suitable sulfiding agent, such as H$_2$S, S, S$_n$, where n is from about 2 to about 12, CS$_4$, thiourea, thioacetamide, dimethylthiourea and combinations thereof; a selenide by treatment with a suitable selenizing agent, such as H$_2$Se, Se, Se$_n$, where n is from about 2 to about 8, selenourea, dimethylselenourea, selenosemicarbazide, and combinations thereof; a telluride by treatment with a suitable tellurizing agent, such as H$_2$Te, Te, and lower (typically 10 carbon atoms or fewer) aliphatic agents, typically alkyl agents, such as (C$_2$H$_5$)$_2$Te, and combinations thereof; a nitride by treatment with a suitable nitriding agent, such as NH$_3$, N$_2$H$_4$, N, N$_2$, and combinations thereof; a carbide by treatment with a suitable carbiding agent, such as carbon compounds having 10 or fewer carbon atoms, such as CH$_4$, C$_2$H$_6$, C$_2$H$_4$, CCl$_4$, C$_3$H$_8$, C$_6$H$_6$, CH$_3$Cl or combinations thereof; a phosphide by treatment with a suitable phosphiding agent, such as PH$_3$; and/or a boride by treatment with a suitable boriding agent, such as BCl$_3$, B$_2$H$_6$, or combinations thereof.

A person of ordinary skill in the art will appreciate that the method can involve depositing only one solution, or can involve depositing plural solutions. Furthermore, the method may involve simultaneous deposition of two or more solutions, referred to as co-deposition, or can involve serial deposition of plural solutions to provide desired compositions in desired arrangements on the substrate. The same solution also can be deposited several times. This can be done, for example, to increase the thickness of the deposited materials. Thus, the method involves depositing a solution on a substrate to produce a first layer, and then solution depositing at least a second layer on the first layer.

For certain applications the thickness of a deposited layer can be an important consideration. The thickness of the deposited layer may vary, but typically is from greater than 0 nanometers to at least 300 nanometers, more typically from about 5 to about 250 nanometers, and even more typically from about 10 nanometers to about 200 nanometers. A desired thickness can be achieved either empirically simply by depositing material until the desired layer thickness is achieved. Desired thicknesses also can be provided by first over depositing material, and then removing material, such as by laser ablation, to provide a desired layer thickness. Alternatively, process steps can be implemented to allow more precise control over deposited layer thicknesses. For example, a concentration versus a deposited layer thickness curve can be obtained or generated. Disclosed embodiments of the method then involve providing a first solution with a concentration of the inorganic compound selected to provide a desired layer thickness, and depositing the solution to provide the desired layer thickness.

A particular embodiment of the method for solution deposition of inorganic compounds involves providing a first solution comprising at least a first inorganic compound comprising a Group Ia, IIa, IIIa, IVa, Va, Ib, IIb, IIIb, IVb, Vb, VIb, VIIb, or VIIIb metal, or mixtures thereof. The first solution is then deposited on a substrate using a process selected from inkjet printing, spin coating, gravure, micro-pen, nano-fountain pen, dip-pen, screen printing, spray coating, slide coating, slot coating, curtain coating, dip coating, and combinations thereof. The solvent is then evaporated, or allowed to evaporate, to provide a layer comprising the inorganic compound, the layer having a thickness of from greater than 0 nanometers to at least 300 nanometers.

Another particular embodiment of the method for solution deposition of inorganic compounds involves providing a first solution comprising an inorganic compound comprising a Group Ia, Ia, IIIa, IVa, Va, Ib, IIb, IIIb, IVb, Vb, VIb, VIIb, or VIIIb metal, or mixtures thereof. A second solution is provided comprising an inorganic compound comprising a Group Ia, IIa, IIIa, IVa, Va, Ib, IIb, IIIb, IVb, Vb, VIb, VIIb, or VIIb metal, or mixtures thereof. The first and second solutions are deposited on a substrate using a process selected from inkjet printing, spin coating, gravure coating, micro-pen coating, nano-fountain pen coating, dip-pen coating, screen printing, spray coating, slide coating, slot coating, curtain coating, dip coating, and combinations thereof. The solvent is then allowed to evaporate, or is evaporated by an affirmative process such as heating or using an impinging fluid flow, such as a flowing inert gas, to provide a layer comprising the inorganic compound or compounds, the layer having a thickness of from greater than 0 nanometers to at least 300 nanometers. The first and second solutions can be deposited serially, or may be co-deposited on the substrate. The method may involve depositing the first solution on a substrate to produce a first layer. The second solution is then used to deposit a second layer.

Still another particular embodiment of the disclosed method comprises obtaining a concentration versus a deposited layer thickness curve, and providing a first solution with a concentration of an inorganic compound selected to provide a desired layer thickness. The solution is then deposited to provide a desired layer thickness.

Still another particular embodiment of the disclosed method for solution deposition of an inorganic compound involves providing a first solution comprising at least a first inorganic compound comprising a Group Ia, Ia, IIIa, IVa, Va, Ib, IIb, IIIb, IVb, Vb, VIIb, VIIb, or VIIIb metal, or mixtures thereof. A second solution optionally is provided, the second solution comprising at least a first inorganic compound comprising a Group Ia, Ia, IIIa, IVa, Va, Ib, IIb, IIIb, IVb, Vb, VIb, VIIb, or VIIIb metal, or mixtures thereof. The first, and optionally the second, solution are solution deposited on a substrate using a process selected from inkjet printing, spin coating, gravure coating, micro-pen coating, nano-fountain pen coating, dip-pen coating, screen printing, spray coating, slide coating, slot coating, curtain coating, dip coating, and combinations thereof. This embodiment optionally may comprise obtaining a concentration versus a deposited layer thickness curve, and providing a first solution with a concentration of an inorganic compound selected to provide a desired layer thickness. The solution, or solutions, is then deposited to provide a desired layer thickness. The solvent is then evaporated, or allowed to evaporate, to provide a layer comprising the inorganic compound, the layer having a thickness of from greater than 0 nanometers to at least 300 nanometers. Deposited materials are then post deposition processed using a process selected from thermal annealing, oxidation, reduction, exchange reactions, and combinations thereof.

A method for making an electronic device or a component of an electronic device also is disclosed. The method comprises solution depositing at least one, and typically plural, solutions as disclosed herein. An electronic device is then formed comprising the inorganic compound or compounds. Examples of classes of electronic devices that can be made using the present invention include a conductor, a semiconductor, an insulator, a photoluminescent device, and combinations thereof. Particular examples of electronic devices, or components of electronic devices, that can be made using the present invention include transistors, circuits, capacitors, photovoltaics, photodetectors, such as a UV detector, gas sensors, batteries, X-ray imagers, light emitting diodes, solid electrolytes, computer readable media, and combinations thereof.

Solution-processed thin film transistors could fundamentally change the semiconductor industry. Solution processed thin film transistors also might be fabricated by simple techniques, e.g., direct printing of circuits. A thin film transistor typically includes semiconductor films, insulation films and conductive films. The insulation film includes gate insulation films and interlayer insulation films, and the conductive film is used for gate electrodes, source/drain electrodes, pixel electrodes and wiring lines.

One particular disclosed method for making a transistor comprises providing a substrate material, and forming a p+silicon gate layer. A silicon dioxide ($SiO_2$) layer is provided on the gate layer. A metal oxide or metal oxide precursor material is then solution deposited, followed by formation of source and drain contacts.

Inkjet printing is one method for depositing inorganic compounds on substrates. Inkjet printing can be used to deposit such materials in desired patterns. As a result, the present invention also concerns an inkjet printer modified for deposition of inorganic thin films, as well as inkjet printer cartridges comprising inorganic fluids useful for inkjet printing electronic components according to embodiments of the presently disclosed invention.

The foregoing and other objects, features, and advantages of the invention will become more apparent from the following detailed description, which proceeds with reference to the accompanying figures.

DETAILED DESCRIPTION

Figure 1:
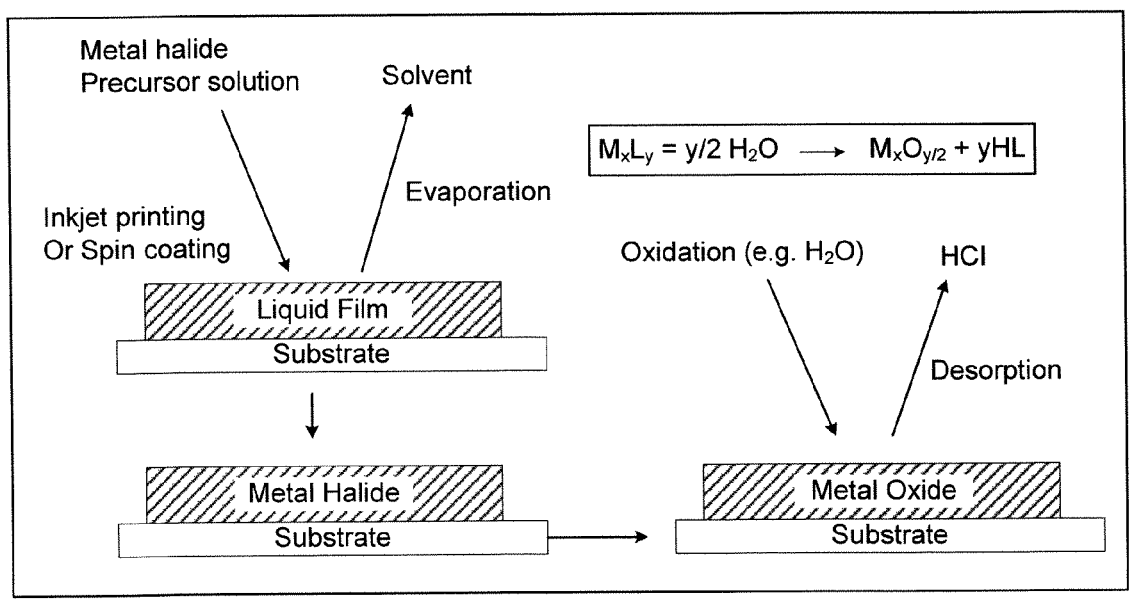
FIG. 1 illustrates one possible mechanism for metal oxide semiconductor thin film formation.

Disclosed embodiments of the present invention concern solution deposition of inorganic materials. Deposited inorganic materials have many uses, including manufacture of electronic devices, or components of electronic devices. These electronic devices are exemplified herein primarily by reference to transistors and circuits comprising the transistors. A person of ordinary skill in the art will appreciate that electronic devices other than transistors also can be made by the process.

One disclosed embodiment of the method involves first forming a solution comprising a metal compound, or a precursor material used to make a desired metal compound material, that can be deposited onto a substrate. Metal halides are one example of a class of compounds useful as precursors for making metal oxides. At least one, and potentially plural, metal compounds are dissolved in a solvent (e.g. acetonitrile or a lower aliphatic alcohol) and the resulting solution is then solution deposited onto a surface to form a substantially uniform and substantially continuous thin film. Solution deposition includes, but is not limited to, digital fabrication (e.g. inkjet printing) and/or blanket coating (e.g. spin coating) techniques. Solutions can be deposited in desired patterns, such as patterns designed to form working electronic components or devices. The deposited materials are then potentially subjected to post-deposition procedures, such as thermal annealing, oxidation, reduction, exchange reactions, etc., and combinations thereof.

Throughout this disclosure, the singular terms "a," "an," and "the" include plural referents unless the context clearly indicates otherwise. Similarly, the word "or" is intended to include "and" unless the context clearly indicates otherwise.

I. Inorganic Materials

The present disclosure concerns embodiments of a method for solution deposition of inorganic materials, typically solution deposition of inorganic materials deemed useful for electronic applications. A person of ordinary skill in the art will appreciate that many species of inorganic materials potentially are useful for end applications and can be processed according to embodiments of the method described herein. The present application is directed to all such inorganic materials. Solely by way of example, and without limitation, suitable inorganic materials include metal-containing materials. The metal typically is a Group Ia, IIa, IIIa, IVa, Va, Ib, IIb, IIIb, IVb, Vb, VIb, VIIb or VIIb metal, or mixtures thereof. Working embodiments have made, for example, metal halides comprising at least one metal and at least one halide, and metal oxides comprising a metal and oxygen atoms. These materials are referred to herein as binary compounds as they include only two different elements. Working embodiments of binary compounds have been made using antimony (Sb), bismuth (Bi), cadmium (Cd), calcium (Ca), copper (Cu), gallium (Ga), germanium (Ge), gold (Au), hafnium (Hf), indium (In), iron (Fe), lead (Pb), magnesium (Mg), manganese (Mn), molybdenum (Mo), nickel (Ni), silicon (Si), silver (Ag), thallium (Tl), tin (Sn), vanadium (V) zirconium (Zr), yttrium (Y), zinc (Zn). Working embodiments of metal halides, and mixed metal halides that have been made include $AgI$, $BiI_3$, $CaF_2$, $CaI_2$, $CdI$, $CuBr$, $CuI$, $MgI_2$, $NiI_3$, $PbI_2$, $SbI_3$, $SnI_2$, $SnI_4$, $TiI$, $ZnI_2$, $FeI_2$, $GeI_4$, $FeCl_2$, $FeCl_3$, $SnCl_2$, $SnCl_4$, $InCl_3$, $SbCl_3$, $SbCl_5$, $GeCl_4$, $SiCl_4$, $ZnCl_2$, $AgCl$, $CuAgI_2$, $CuCdI_2$, $CuBiI_4$, $CuPbI_3$, $CuSnI_5$ and $SbSI$.

Ternary and higher order mixed-metal compounds also have been made. For example, copper-cadmium, copper-silver, zinc-indium, zinc-tin, indium-tin, etc. compounds have made using embodiments of the method disclosed herein. For quaternary compounds, working embodiments include indium-tin-zinc mixed metal materials. A manganese-silicon-zirconium oxide ($ZnSiO_4$:Mn) also has been made for optical applications.

Inorganic materials comprising metals are solution processed for deposition on a surface. As a result, many exemplary compounds are metal salts. For example, metal halides have been used to make suitable solutions. These materials typically have a formula $M_aX_b$ where M is a metal, X is a halide, i.e., fluoride, chloride, bromide, iodide, or mixtures thereof, a typically is 1, 2 or 3, and b typically is equal to the positive charge on the metal atom or atoms.

Metal compounds other than metal halides may be used to practice the present invention. For example, metal acetates also have been used. These materials typically satisfy the formula $M_aY_b$ where M is a metal, Y typically is an anionic species, such as a halide, an acetate, a sulfate, a phosphate, etc., and combinations thereof, a is sufficient to provide metal atoms equal to the sum of the charge associated with any one or more Y groups, and b is sufficient to provide anionic groups equal to the sum of the positive charge associated with one or more metal atoms. While salt compounds other than halides, such as acetate compounds, can be suitably solution processed, such materials have not performed as well in working embodiments as the metal halides for subsequent electronic applications.

Ternary and higher-order mixed metal compounds also can be processed as disclosed herein. Ternary compounds typically have a formula $M_a^1M_b^2Y_c$ where a+b is sufficient to provide metal atoms equal to the sum of the charge associated with any one or more Y groups, and c is sufficient to provide anionic groups equal to the sum of the positive charge associated with the metal atoms. Similarly, quaternary compounds typically have a formula $M_a^1M_b^2M_c^3Y_d$ where a+b+c is sufficient to provide metal atoms equal to the sum of the charge associated with any one or more Y groups, and d is sufficient to provide anionic groups equal to the sum of the positive charge associated with the metal atoms.

Many of the disclosed metal oxide embodiments concern ZnO—$In_2O_3$, which may be referred to herein as ZIO. Metal oxides in addition to ZIO also have been made according to the present invention, including seven transparent conductive oxide thin films, nanely ZnO, $In_2O_3$, $SnO_2$, $In_2O_3$—$SnO_2$ (ITO), ZnO—$SnO_2$ (ZTO), and $In_2O_3$—ZnO—$SnO_2$ (IZTO). These materials have been fabricated by combining $ZnCl_2$, $SnCl_2$ and $InCl_3$ precursors in acetonitrile in various concentrations, followed by either inkjet printing or spin coating.

II. Solution Processing Inorganic Materials

One feature of certain disclosed embodiments is solution processing inorganic materials. While it is possible that suspensions of materials also may be useful, certain of the disclosed embodiments, such as inkjet printing methods, are best implemented using solutions and not suspensions. FIG. 1 schematically illustrates one solution processing embodiment. FIG. 1 refers to metal halides, but this is solely to exemplify solution-processing metal compounds generally. Moreover, FIG. 1 exemplifies optional post deposition processing of the metal halide to form metal oxides.

With reference to FIG. 1, a metal halide precursor solution is solution deposited onto a substrate. FIG. 1 indicates depositing the solution by either inkjet printing or spin coating. While these are two preferred solution deposition embodiments, they are by no means the only suitable methods for solution deposition. Other methods include, but are not limited to, gravure, micro-pen, nano-fountain pen, dip-pen, screen printing, spray coating, slide coating, slot coating, curtain coating, dip coating and combinations thereof.

Solvent used to form the metal halide precursor solution is then allowed to evaporate. Evaporation may be facilitated by optional drying procedures. These optional drying procedures include, but are not limited to, heating and using a flowing fluid like an inert gas, to facilitate solvent evaporation.

The metal halides can be used directly as deposited for conductors (electrons, holes, and ions), semiconductors, insulators, photoconductors and phosphors. Alternatively, the deposited inorganic layer comprising a metal, such as a metal halide layer, may be subjected to post deposition processing. Post deposition processing can include processing designed to maintain composition, but change physical properties. Alternatively, post deposition processing can include processing to convert deposited materials into other desired compounds, such as metal oxides. FIG. 1 illustrates oxidizing the metal halide, such as by treatment with water or an oxidizing atmosphere, to form the metal oxide on the substrate. Oxidation can change the metal halide, having an initial molecular formula of $M_aX_b$ where M is a metal, X is a halide, a is sufficient to provide a positive charge balancing the negative charge provided by the sum of the charge on the anionic halide, and b is sufficient to provide a negative charge to balance the positive charge provided by the sum of the charges on the cationic metal species. The metal halides are converted into oxides having a formula $M_aO_{b/2}$ where M is a metal, and a and b have the values stated above.

It also originally was believed that aprotic solvents, such as acetonitrile, were best suited for practicing disclosed solution deposition embodiments. Aprotic solvents were considered less likely to dissociate metal precursor materials, such as metal halides. In addition, acetonitrile is volatile (boiling point=81-82° C.), which helps convert the printed liquid thin films into solid metal halide thin films in short order. In contrast, metal halides tend to dissociate and form hydroxide precipitates in an aqueous solution and dry much more slowly. Nevertheless, protic solvents, such as lower (i.e. fewer than 10 carbon atoms) aliphatic alcohols, typically lower alkyl alcohols, such as methanol, ethanol, isopropanol, etc., also can be used to solution process inorganic materials. Thus, suitable solvents include protic and aprotic aliphatic organic solvents, protic and aprotic heteroaliphatic solvents, protic and aprotic aryl solvents, protic and aprotic heteroaryl solvents, and combinations thereof. A person of ordinary skill in the art therefore will appreciate that a large number of liquids are potentially useful as solvents for practicing the present invention. Hence, appropriate solvents for a particular application are best determined by considering factors such as solubility of the material in the solvent, boiling point (to facilitate removal or evaporation), wettability, availability, cost, toxicity, etc.

Solutions of varying concentrations can be used to practice the present invention. Thus, any solution where the concentration of the inorganic material is greater than zero to the saturation concentration can be used to practice the present invention. Solely by way of example, working embodiments typically have used a metal halide concentration of from about 0.015 molar to about 0.16 M.

Figure 2:
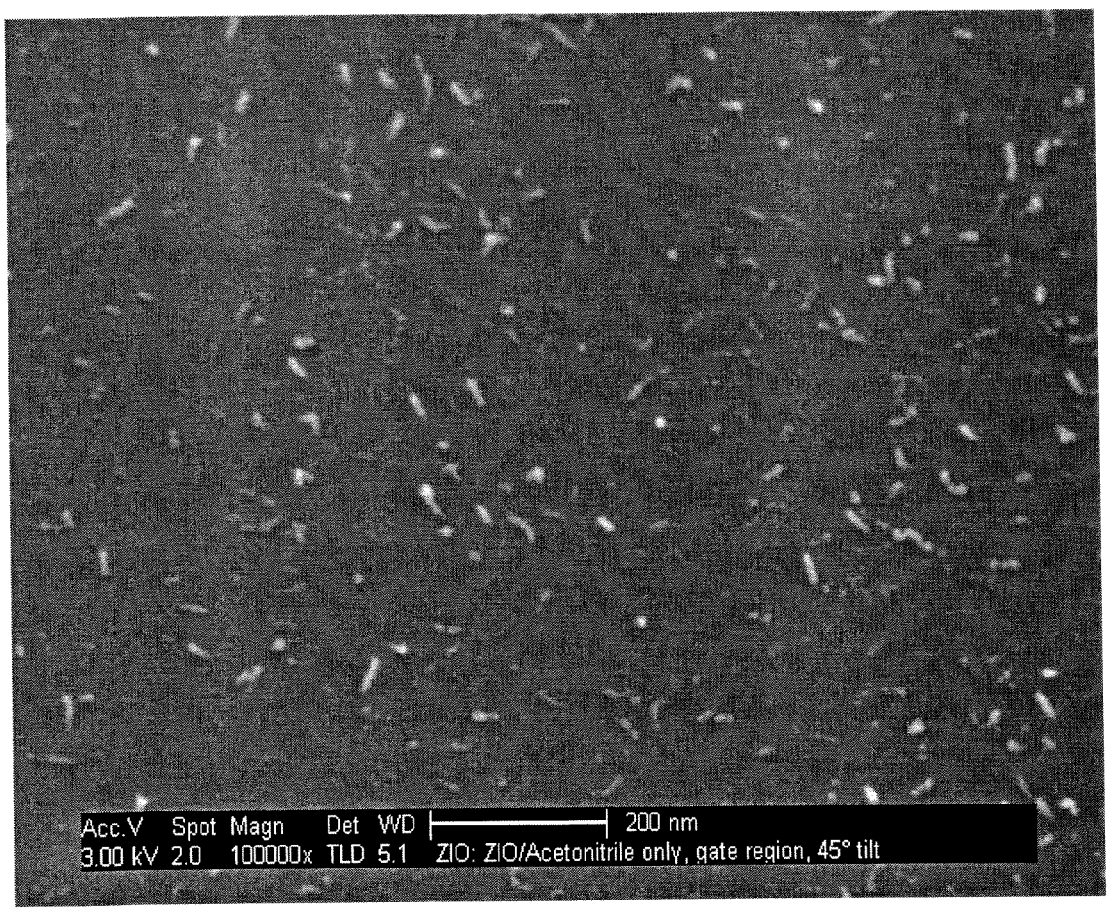
FIG. 2 is a top SEM image of an inkjet printed ZnO—$In_2O_3$ (ZIO) formed using a low concentration (0.015 M of $ZnCl_2$ and $InCl_3$ in 25 ml acetonitrile) deposition solution.
Figure 3:
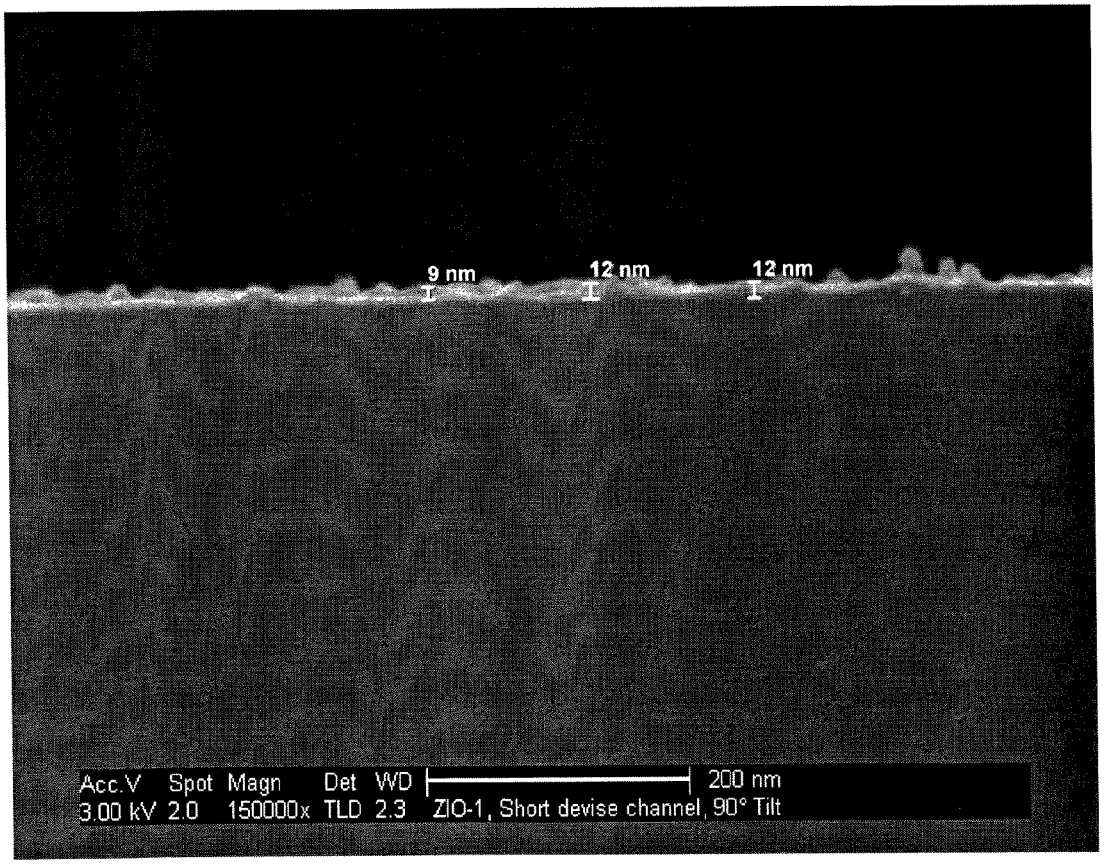
FIG. 3 is a cross-sectional SEM image of an inkjet printed ZnO—$In_2O_3$ (ZIO) formed using a low concentration deposition solution showing a deposited layer thickness of about 11 nanometers.
Figure 4:
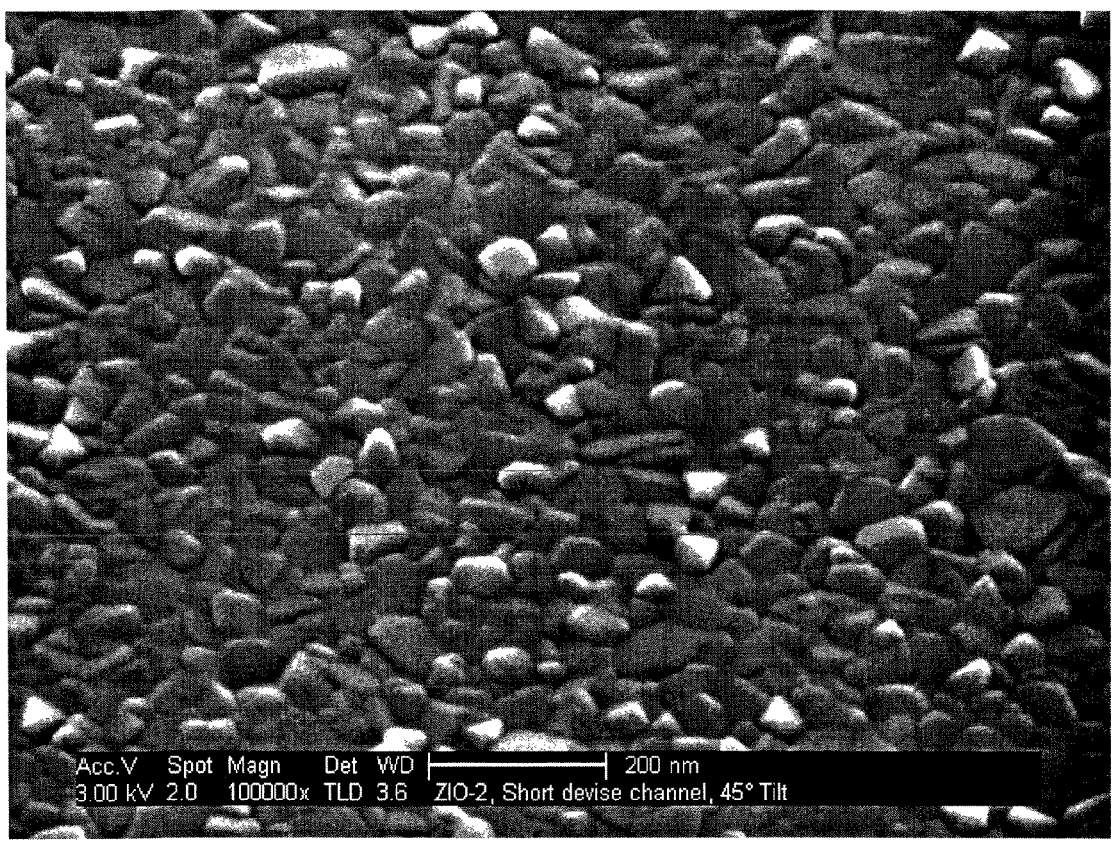
FIG. 4 is a top SEM image of an inkjet printed ZnO—$In_2O_3$ (ZIO) formed using a high concentration (0.03 M of $ZnCl_2$ and $InCl_3$ in 25 ml acetonitrile) deposition solution.
Figure 5:
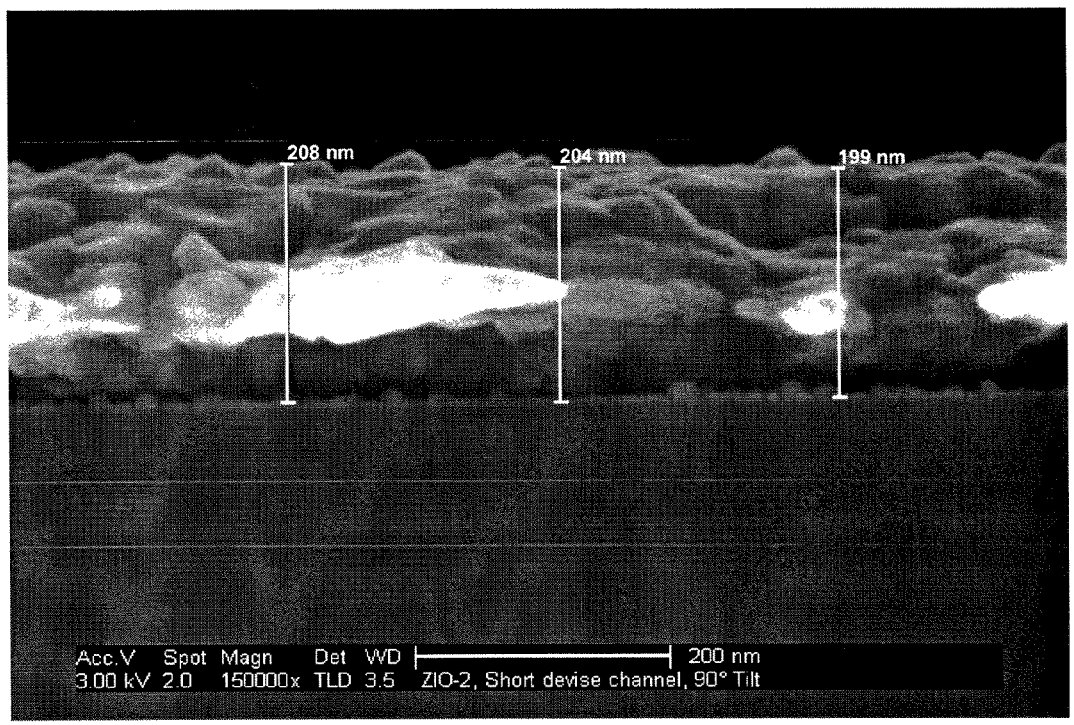
FIG. 5 is a cross-sectional SEM image of an inkjet-printed ZnO—$In_2O_3$ (ZIO) layer formed using a high concentration deposition solution showing a deposited layer thickness of about 204 nanometers.

Moreover, deposited film thicknesses appear to be directly correlated with the concentration of the solution used to deposit the material used to make the film. This result is illustrated by FIGS. 2-5. FIG. 2 is a top SEM image of an inkjet printed $ZnO-In_2O_3$ (ZIO) formed using a low deposition solution. FIG. 3 is a cross-sectional SEM image of an inkjet printed $ZnO-In_2O_3$ (ZIO) formed using a low concentration (0.015 M of $ZnCl_2$ and $InCl_3$ in 25 ml acetonitrile) deposition solution. FIG. 2 clearly shows that the deposited layer thickness varies from about 9 nanometers to about 11 nanometers. FIG. 4 is a top SEM image of an inkjet printed $ZnO-In_2O_3$ (ZIO) formed using a high concentration (0.03 M of $ZnCl_2$ and $InCl_3$ in 25 ml acetonitrile) deposition solution. FIG. 5 is a cross-sectional SEM image of an inkjet-printed $ZnO-In_2O_3$ (ZIO) layer formed using a high concentration deposition solution. FIG. 5 clearly shows a deposited layer thickness that varies from about 199 nanometers to about 208 nanometers. Thus, deposited film thickness can vary from some value greater than 0 nanometers to at least about 300 nanometers, more typically from greater than 5 nanometers to about 250 nanometers, and even more typically from about 10 nanometers to about 200 nanometers. A person or ordinary skill in the art will appreciate that a film thickness versus concentration curve can be determined empirically for a particular system, and this information can be used to determine suitable concentrations for use in that application. For film thicknesses greater than can be deposited with a single deposition step, multiple deposition steps can be practiced to provide the requisite film thickness.

III. Optional Post Solution Deposition Processing

As will be understood by a person of ordinary skill in the art, the composition of the deposited inorganic material depends on the composition of the material used to form the deposition solution. For example, if the metal-comprising compound dissolved in the deposition solution is a metal halide, then metal halide thin films are produced by the initial deposition step. However, many devices require deposition of films comprising materials other than the original material, such as a metal halide, that is initially solution deposited. Thus, composite structures having deposited inorganic thin films optionally can be subjected to post deposition processing too.

Figure 20:
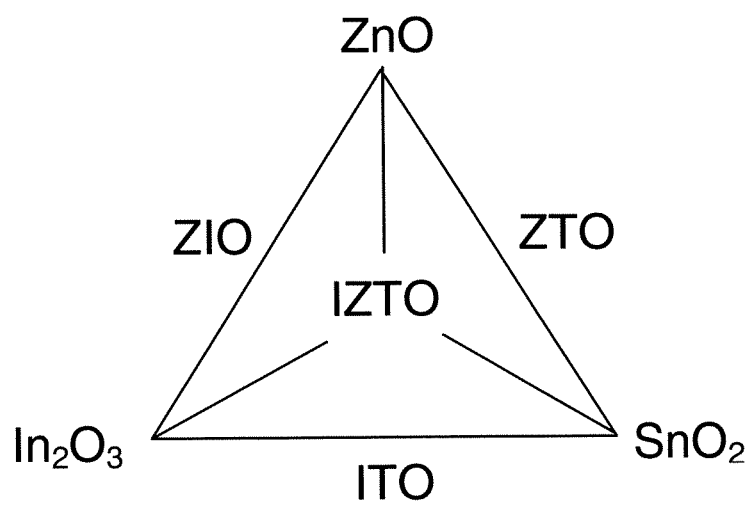
FIG. 20 schematically illustrates a number of different conductive oxide thin films that can be deposited using metal halide precursor solutions and suitable deposition processes, such as inkjet printing and spin coating deposition.

Post deposition processing can include, by way of example and without limitation, annealing, oxidation, reduction, exchange reactions, etc. Post processing is exemplified by the formation of oxide materials from halide materials by a variety of methods, such as air annealing (e.g., at 600° C. for one hour) and treating deposited materials with oxidizing agents, such as oxygen and/or water. FIG. 20 schematically illustrates a number of different conductive oxide thin films that can be deposited using metal halide precursor solutions, suitable deposition processes, such as inkjet printing and spin coating deposition, and post processing to form the oxide.

Examples of additional classes of materials that can be made from as-deposited materials, and post processing techniques used to make such additional materials, are provided below in Table 1.

TABLE 1

| Compounds | Annealing Gas |
|---|---|
| Oxides | e.g. $H_2O$, $O_2$, O (oxidizing agents) |
| Sulfides | e.g. $H_2S$, S, $CS_4$ (Sulfiding agents) |
| Selenides | e.g. $H_2Se$, Se (Selenizing agents) |
| Tellurides | e.g. $H_2Te$, Te (Tellurizing agents) |
| Nitrides | e.g. $NH_3$, N (Nitriding agents) |
| Carbides | e.g. $CH_4$, $C_2H_6$, $C_2H_4$ (Carbiding agents) |
| Phosphides | e.g. $PH_3$ (phosphiding agents) |
| Borides | e.g. $BCl_3$, $B_2H_6$ (boriding agents) |
| Elements | e.g. $H_2$, H reducing agents |
| e.g. Si, Ge | $SiI_4 + 2H_2 \rightarrow Si + 4HI$<br>$GeI_4 + 2H_2 \rightarrow Ge + 4HI$<br>Disproportionation reaction<br>$2GeI_2 \rightarrow Ge + GeI_4$ |

IV. General Description of Transistors

Figure 6A:
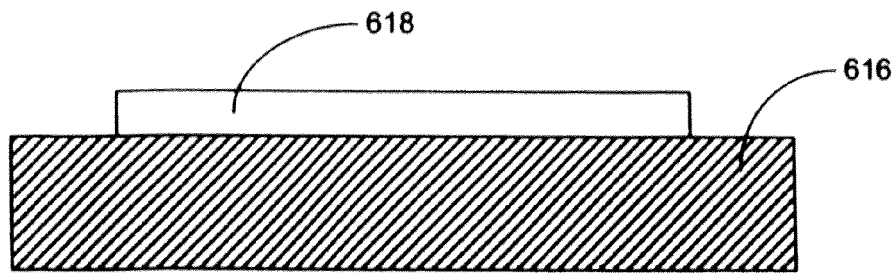
FIGS. 6A-6C are schematic block diagrams illustrating an exemplary thin film transistor.
Figure 6B:
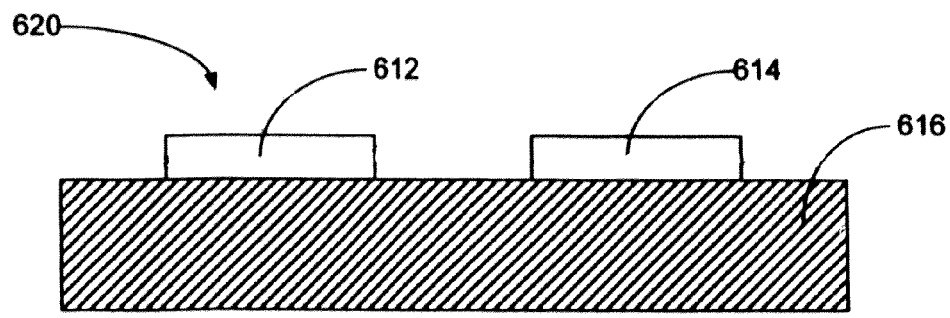
Figure 6C:
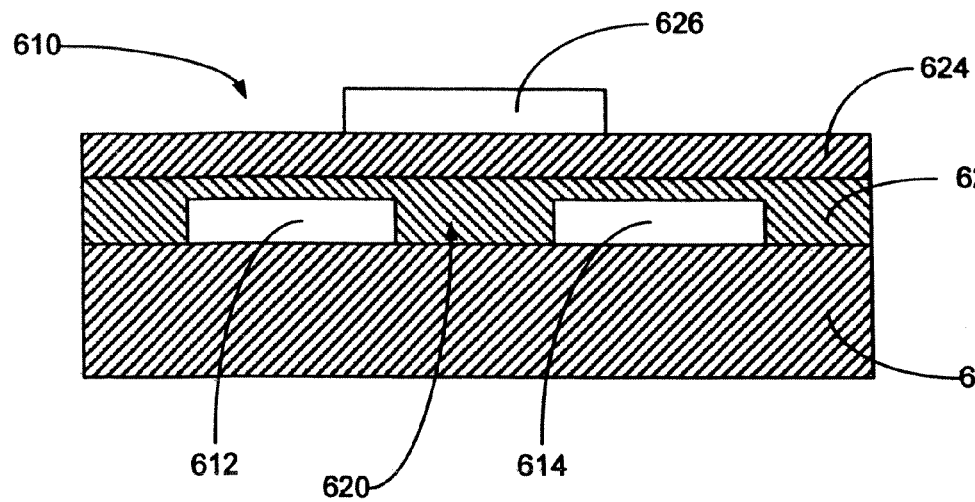

FIGS. 6A-6C illustrate a first exemplary embodiment of a thin film transistor 610. Transistor 610 has source contacts 612 and drain contacts 614 formed upon a substrate 616. Substrate 616 can be made from any suitable material, but preferably has good dielectric properties. Substrate 616 also should be compatible with the solution-processed thin film materials used to form the transistor 610. Examples of suitable exemplary substrates include, without limitation, glass, silica, polymeric materials, such as polycarbonate, polyarylate, polyethylenterephtalate (PET), polyestersulfone (PES), polyimide, polyolefin, and polyethylene naphthalate (PEN). Initially, a desired conductive solution-processed material is deposited as a thin film 618, such as by inkjet printing or spin coating, onto substrate 616.

Solution-processed thin film 618 may form a rough pattern, such as a circuit interconnect pattern useful for connecting multiple transistors. If an initial step forms a roughly patterned deposit, additional patterning may be done, using any suitable method, to form more refined detail. For example, laser ablation using laser irradiation tuned to a wavelength preferably selectively absorbed by the thin film material 618 may be used for additional patterning. By these methods, desired structures can be formed. For example, a transistor channel 620 can be formed between the source contacts 612 and drain contacts 614. Channel 20 preferably is made as narrow as possible to reduce threshold voltage. Channel 620 typically has a width of 5 μm or less, and channel widths of at least as narrow as 1 μm or less can be formed. Some devices permit wider channels. A person of ordinary skill in the art will appreciate that the minimum and maximum feature sizes will depend on various factors including variable device architecture.

Again with reference to the exemplary transistor of FIGS. 6A-6C, a thin film of semiconductor material is deposited to form an active region thin film layer 622 over the source contacts 612, drain contacts 614 and exposed portions of the substrate 616. The thin film layer may be formed by any suitable solution deposition process, such as inkjet printing or spin coating. A dielectric solution-processed thin film material is then used to form an isolation layer 624 over the active region thin film layer 622. A conductive solution-processed thin film material is then deposited upon the isolation layer 624 to form a gate contact 626, which also may form part of a circuit interconnect pattern.

Figure 7:
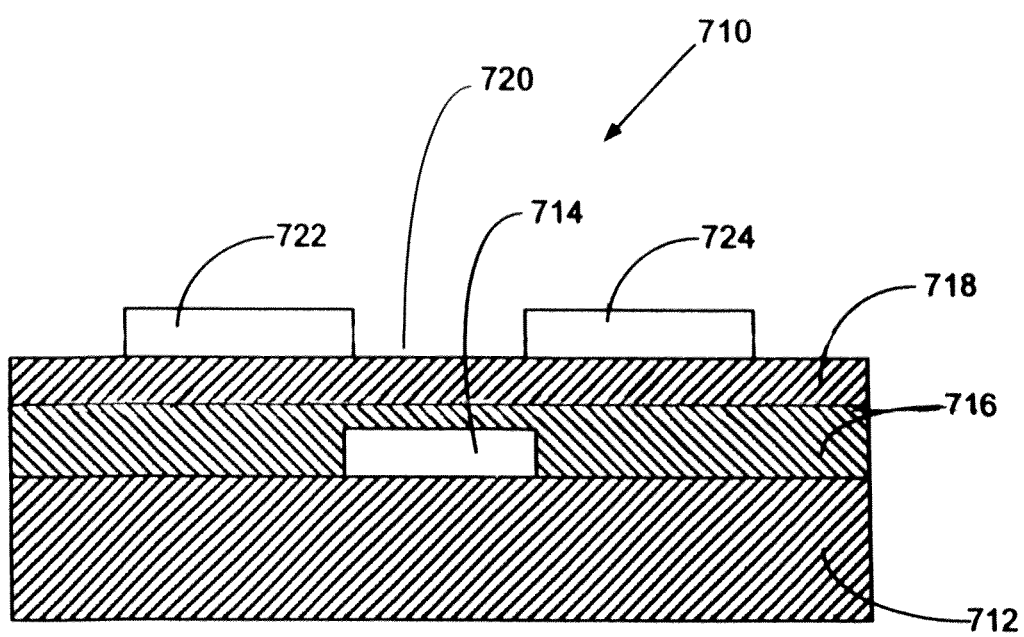
FIG. 7 is a schematic block diagram illustrating an exemplary thin film transistor.

FIG. 7 illustrates a second exemplary embodiment of a solution-processed thin film transistor 710. A conductive solution-processed thin film material is deposited onto substrate 712 to form a gate contact 714, which first may be patterned roughly by solution deposition, and then refined by any suitable method, such as laser ablation. Gate contact 714 also may form part of a circuit interconnect pattern. A dielectric solution-processed thin film material is then deposited as thin film layer 716 over the gate contact 714 and any exposed portions of the substrate 712. A semiconductor solution-processed thin film material then may be deposited as an active region thin film layer 718. Conductive solution-processed thin film material is deposited on the semiconductor active region thin film layer 718. Patterning techniques, such as laser ablation, can be used to pattern a transistor channel 720 between the source contact 722 and drain contact 724.

Figure 8:
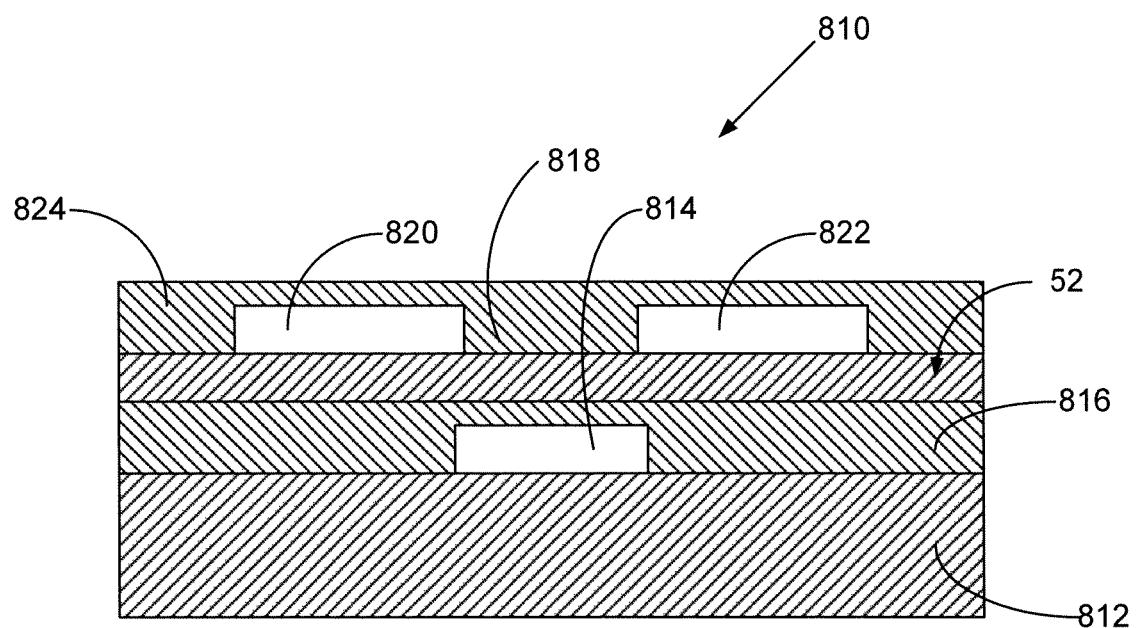
FIG. 8 is a schematic block diagram illustrating an exemplary thin film transistor.

FIG. 8 illustrates yet another embodiment of an exemplary thin film transistor 810. A conductive solution-processed thin film material is patterned upon the substrate 812 to form a gate contact 814. Gate contact 814 initially may be patterned roughly by solution deposition, and then refined subsequently by any suitable patterning methodology, such as laser ablation. Gate contact 814 also may form part of a circuit interconnect pattern. A dielectric solution-processed thin film layer 816 is then formed over the gate contact 814 and exposed portions of the substrate 812. Conductive solution-processed thin film material is deposited on the thin film layer 816. Additional patterning, such as laser ablation patterning, can be used to pattern a transistor channel 818 between the source contacts 820 and drain contacts 822. A semiconductor solution-processed thin film material is then deposited over the source contact 820 and drain contact 822 to form semiconductor solution-processed thin film material active region thin film layer 824.

Figure 9:
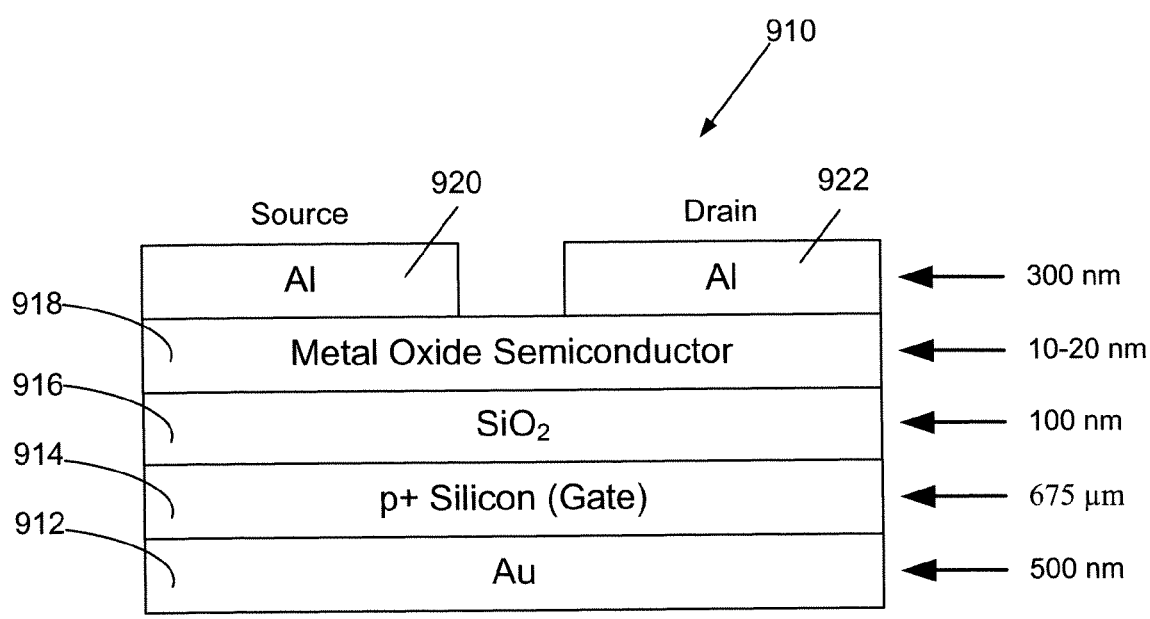
FIG. 9 is a schematic, cross-sectional view of one embodiment of a metal oxide semiconductor MISFET structure.

FIG. 9 illustrates one embodiment of a metal oxide semiconductor MISFET 910. MISFET structure 910 includes a gold substrate material 912 having a thickness of about 500 nanometers. A p+silicon gate layer 914 was formed having a thickness of about 675 μm. Gold layer 912 was sputter deposited on the silicon substrate to form a gate contact. Silicon dioxide ($SiO_2$) layer 916 was thermally grown on top of a silicon layer 914. Layer 916 typically had a thickness of about 100 nanometers. As the name implies, a metal oxide semiconductor MISFET requires a metal oxide semiconductor layer 918. Layer 918 can be formed as described herein by solution process deposition of a suitable metal oxide or metal oxide precursor material, such as a metal halide. These layers have typical thicknesses of from about 10 to about 20 nanometers. 300-nanometer aluminum source contact 920 and drain contact 922 were evaporated on top of the ZnO layer 918 through a shadow mask with a channel width-to-length ratio of 7 and 12, respectively.

V. Examples

The following examples are provided to exemplify particular features of working and/or hypothetical embodiments of the present invention. A person of ordinary skill in the art will appreciate that the invention is not limited to the particular features of such examples.

Example 1

This example describes thin film deposition of $ZnCl_2$ for use in fabricating inkjet-printed ZIO and IZTO thin films. $ZnCl_2$ powder was obtained from Alfa Aesar and used directly without further purification. A 0.015 molar $ZnCl_2$ solution in acetonitrile was then prepared. The solution was subjected to ultrasonic mixing for 10 minutes at ambient temperature in a 30 milliliter, pre-cleaned vial to provide a well mixed solution for printing.

A HP 1220C thermal inkjet printer was modified to allow placement of Si/SiO$_2$ substrates on a plastic tray, which were loaded from the back of the printer for deposition of thin film inorganic materials. The black ink cartridge was filled with ZnCl$_2$ solution (~10 milliliters) using a syringe. The cartridge was sealed with a metallic ball and loaded into the printer's cartridge holder. Microsoft Excel software was used to print the active layer with a desired pattern.

Desired substrate materials were then treated using a standard acetone/methanol/de-ionized water (AMD) pre-cleaning method. A nitrogen stream was used to dry the cleaned substrate, which was then loaded into the inkjet printer for printing. Spin coating was performed using a Specialty Coating System P-6708D spin coater operating at 8,000 rpm for 30 seconds.

Example 2

This example describes thin film deposition of InCl$_3$ for use in fabricating inkjet-printed thin films. InCl$_3$ powder was obtained from Alfa Aesar and used directly without further purification. A 0.015 molar InCl$_3$ solution in acetonitrile was then prepared. The solution was subjected to ultrasonic mixing for 10 minutes at ambient temperature in a 30 milliliter, pre-cleaned vial to provide a well mixed solution for printing.

A HP 1220C thermal inkjet printer was modified to allow placement of Si/SiO$_2$ substrates on a plastic tray, which were loaded from the back of the printer for deposition of thin film inorganic materials. The black ink cartridge was filled with InCl$_3$ solution (~10 milliliters) using a syringe. The cartridge was sealed with a metallic ball and loaded into the printer's cartridge holder. Microsoft Excel software was used to print the active layer with a desired pattern.

Desired substrate materials were then subjected to the AMD pre-cleaning process. A nitrogen stream was used to dry the cleaned substrate, which was then loaded into the inkjet printer for printing. Spin coating was performed using a Specialty Coating System P-6708D spin coater operating at 8,000 rpm for 30 seconds.

Example 3

This example describes thin film deposition of SnCl$_2$ for use in fabricating inkjet-printed thin films. SnCl$_2$ powder was obtained from Alfa Aesar and used directly without further purification. A 0.015 molar SnCl$_2$ solution in acetonitrile was then prepared. The solution was subjected to ultrasonic mixing for 10 minutes at ambient temperature in a 30 milliliter, pre-cleaned vial to provide a well mixed solution for printing.

A HP 1220C thermal inkjet printer was modified to allow placement of Si/SiO$_2$ substrates on a plastic tray, which were loaded from the back of the printer for deposition of thin film inorganic materials. The black ink cartridge was filled with SnCl$_2$ solution (~10 milliliters) using a syringe. The cartridge was sealed with a metallic ball and loaded into the printer's cartridge holder. Microsoft Excel software was used to print the active layer with a desired pattern.

Desired substrate materials were then subjected to the AMD pre-cleaning process. A nitrogen stream was used to dry the cleaned substrate, which was then loaded into the inkjet printer for printing. Spin coating was performed using a Specialty Coating System P-6708D spin coater operating at 8,000 rpm for 30 seconds.

Example 4

This example concerns one embodiment of a method for making a Metal-Insulator-Semiconductor Field Effect Transistors (MISFETs), illustrated schematically in FIG. 9, using ZnCl$_2$ thin film deposition. A heavily boron (p+) doped silicon substrate served as the gate and an inverted-gate structure was used. Silicon dioxide having a thickness of 100 nm was thermally grown on top of a silicon substrate. A 500-nanometer gold layer was sputtered on the backside of the Si substrate to form a gate contact. This structure was used to test device fabrication.

Semiconductor channel material was strip patterned using a designated layout that was generated using a Microsoft Excel software program in order to reduce the gate leakage current. A 10 to about 20 nanometer ZnCl$_2$ thin film was deposited on top of the SiO$_2$ by inkjet printing. After ZnCl$_2$ deposition, post deposition annealing was performed at 600° C. for 1 hour. This converted the ZnCl$_2$ thin film to a ZnO layer. 300-nanometer aluminum source and drain contacts were then evaporated on top of the ZnO layer through a shadow mask with channel width-to-length ratio of 7 and 12 (channel length equals 200 μm) to form the MISFET. Device characterization was performed in the dark at room temperature with an HP 4157B Semiconductor Parameter Analyzer.

Example 5

This example concerns one embodiment of a method for making a Metal-Insulator-Semiconductor Field Effect Transistors (MISFETs) using InCl$_3$ thin film deposition. A heavily boron (p+) doped silicon substrate served as the gate and an inverted-gate structure was used. Silicon dioxide having a thickness of 100 nm was thermally grown on top of a silicon substrate. A 500 nanometer gold layer was sputtered on the backside of the Si substrate to form a gate contact. This structure was used to test device fabrication.

Semiconductor channel material was strip patterned using a designated layout that was generated using a Microsoft Excel software program in order to reduce the gate leakage current. A 10~20 nanometer InCl$_3$ thin film was deposited on top of the SiO$_2$ by inkjet printing. After InCl$_3$ deposition, post deposition annealing was performed at 600° C. for 1 hour. This converted the InCl$_3$ thin film to In$_2$O$_3$. 300-nanometer aluminum source and drain contacts were then evaporated on top of the In$_2$O$_3$ layer through a shadow mask with channel width-to-length ratio of 7 and 12 (channel length equals 200 μm) to form the MISFET. Device characterization was performed in the dark at room temperature with an HP 4157B Semiconductor Parameter Analyzer. The drain current-drain voltage ($I_{DS}$-$V_{DS}$) output characteristics are presented. The parameters characterized from the MISFETs including field effect mobility, drain current on-to-off ratio, and turn-on voltage.

Absorption and transmission analyses of the In$_2$O$_3$ thin films were measured at various wavelengths by a UV-Vis spectrophotometer (Ocean Optics Inc, USB 2000 optic spectrometer) for optical bandgap estimation and transmittance measurement, respectively. The surface morphology of the film was characterized by SEM (FEI Sirion XL30). The TEM sample was prepared by inkjet printed thin films directly on a TEM grid (Electron Microscopy Sciences, Dura SiN TEM grid). TEM analysis was performed using a FEI Tecnai F20 at 200 KV for high resolution images, structure (selected area electron diffraction) and chemical composition analysis (energy dispersive x-ray spectroscopy), respectively.

Example 6

This example concerns one embodiment of a method for making a Metal-Insulator-Semiconductor Field Effect Transistors (MISFETs) using $SnCl_2$ thin film deposition. A heavily boron (p+) doped silicon substrate served as the gate and an inverted-gate structure was used. Silicon dioxide having a thickness of 100 nm was thermally grown on top of a silicon substrate. A 500 nanometer gold layer was sputtered on the backside of the Si substrate to form a gate contact. This structure was used to test device fabrication.

Semiconductor channel material was strip patterned using a designated layout that was generated using a Microsoft Excel software program in order to reduce the gate leakage current. A 10~20 nanometer $SnCl_2$ thin film was deposited on top of the $SiO_2$ by inkjet printing. After $SnCl_2$ deposition, post deposition annealing was performed at 600° C. for 1 hour. This converted the $SnCl_2$ thin film to SnO. 300-nanometer aluminum source and drain contacts were then evaporated on top of the SnO layer through a shadow mask with channel width-to-length ratio of 7 and 12 (channel length equals 200 µm) to form the MISFET. Device characterization was performed in the dark at room temperature with an HP 4157B Semiconductor Parameter Analyzer. The drain current-drain voltage ($I_{DS}$-$V_{DS}$) output characteristics are presented. The parameters characterized from the MISFETs including field effect mobility, drain current on-to-off ratio, and turn-on voltage.

Absorption and transmission analyses of the SnO thin films were measured at various wavelengths by a UV-Vis spectrophotometer (Ocean Optics Inc, USB 2000 optic spectrometer) for optical bandgap estimation and transmittance measurement, respectively. The surface morphology of the film was characterized by SEM (FEI Sirion XL30). The TEM sample was prepared by inkjet printed thin films directly on a TEM grid (Electron Microscopy Sciences, Dura SiN TEM grid). TEM analysis was performed using a FEI Tecnai F20 at 200 KV for high resolution images, structure (selected area electron diffraction) and chemical composition analysis (energy dispersive x-ray spectroscopy), respectively.

Example 7

Figure 10:
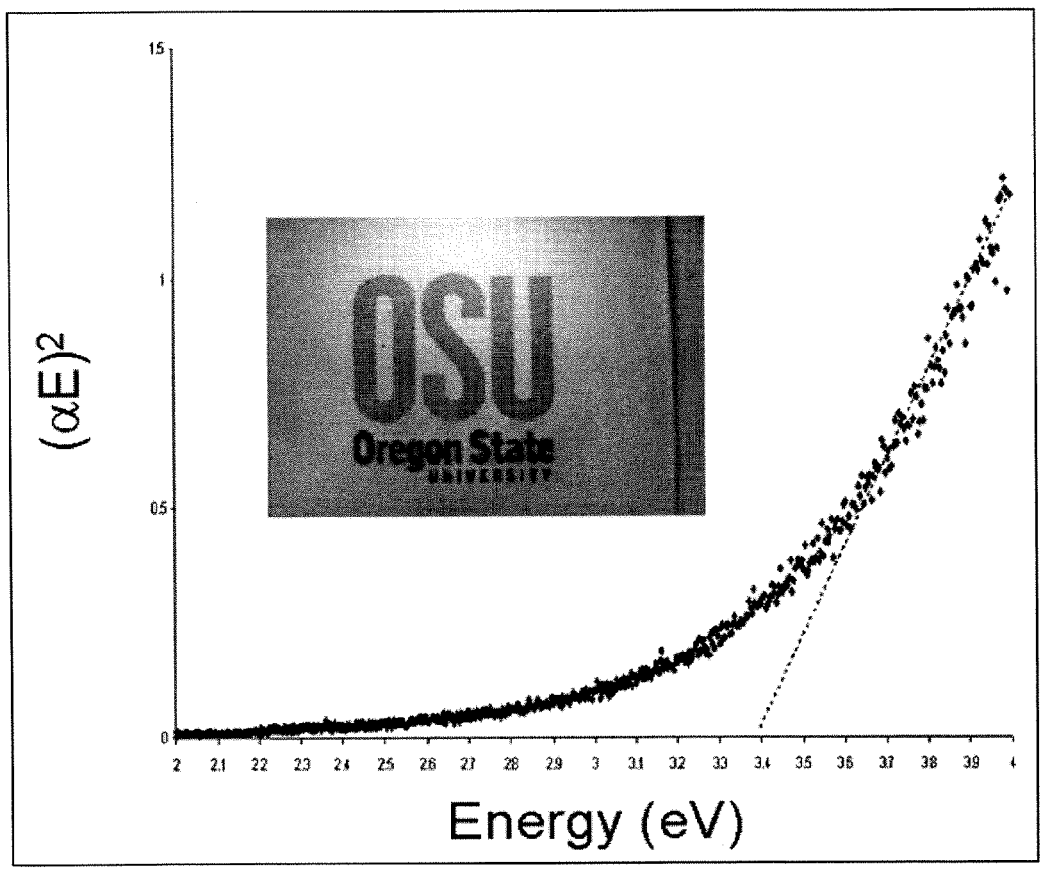
FIG. 10 is a UV-Vis absorption measurement (optical transmittance, bandgap estimation and optical image) for an inkjet-printed ZIO thin film made according to Example 7.

ZIO thin films were formed for optical evaluation. The ZIO precursor solution was prepared by dissolving 0.015 M of $ZnCl_2$ and $InCl_3$ in 25 ml acetonitrile. This solution was inkjet printed on glass slides. The UV-Vis absorption spectrum for the inkjet-printed ZIO thin film is provided by FIG. 10. The optical bandgap of the ZIO thin film was estimated to be 3.4 eV from the UV-Vis absorption spectra. This value is compared to a reported ZIO bandgap value of 3.7 eV. Hara, H., Shiro, T. Yatabe, T., "Optimization and properties of Zn doped indium oxide films on plastic substrate," *Jpn. J. Appl. Phys.* 43(2), 745-749 (2004). Transmittance of the ZIO thin film measured in the wavelength range from 300 to 800 nm indicates a highly transparent ZIO thin film with an average value of 85% beyond 400 nm. The image (inset) shows the transparency of obtained ZIO thin film.

Figure 11:
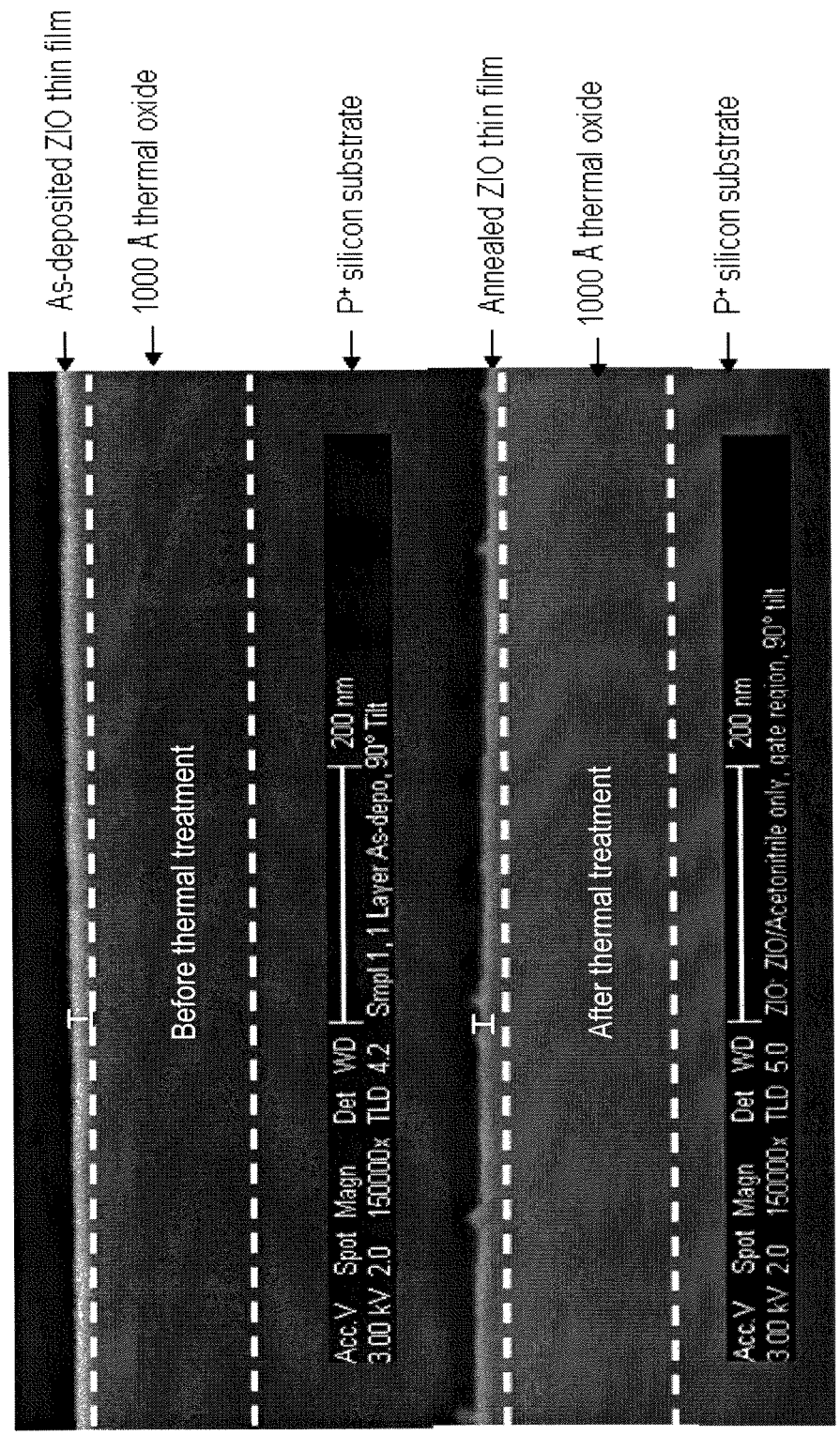
FIG. 11 provides cross-sectional SEM images for as-deposited ZIO thin films and after annealed ZnO—$In_2O_3$ (ZIO) thin films made according to Example 7.

ZIO thin film precursor and ZIO thin film after thermal treatment at 600° C. for 1 hour was characterized by Scanning Electron Microscopy (SEM) as provided by FIG. 11. An average thickness of about 11 nanometers for a single layer deposition can be measured from the cross-sectional SEM micrograph. Some particular defects could be observed on the surface of the channel layer in some cases (supplement). These defects may be caused by poor printing control, and non-uniform wetting and drying during the printing process.

Figure 12:
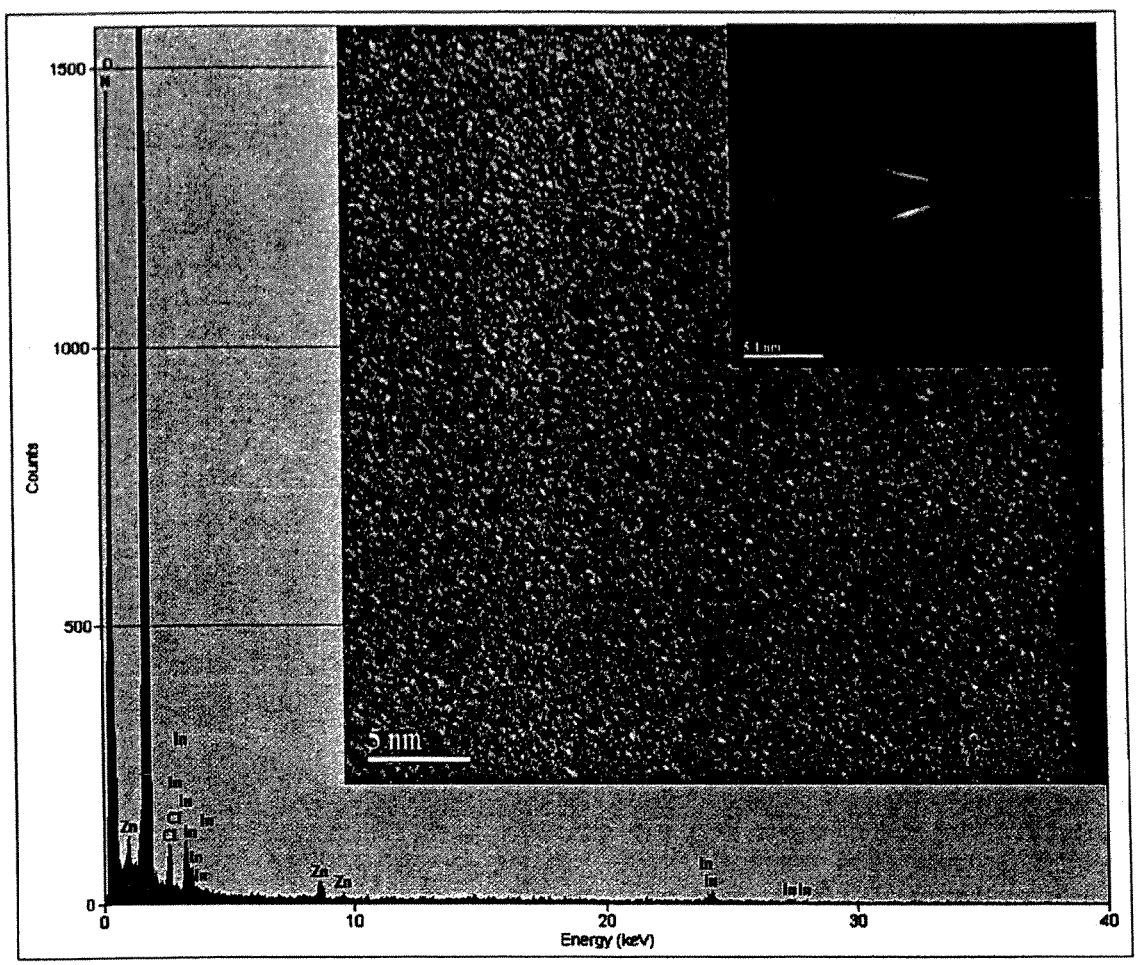
FIG. 12 is TEM micrograph, electron diffraction pattern (inset) and EDX analysis of a ZIO thin film made according to Example 7.

No clear crystalline patterns were observed in the high resolution TEM micrograph of FIG. 12. The TEM and the electron diffraction pattern (inset) of FIG. 12 both indicate the amorphous structure of the inkjet printed ZIO thin films. The Energy Dispersive X-ray (EDX) spectra of FIG. 12 clearly show the presence of Zn, In and O in the printed thin film. The Si and N peaks represent the background $Si_3N_4$ TEM grid.

Absorption and transmission analyses of the ZnO thin films were measured at various wavelengths by a UV-Vis spectrophotometer (Ocean Optics Inc, USB 2000 optic spectrometer) for optical bandgap estimation and transmittance measurement, respectively. The surface morphology of the film was characterized by SEM (FEI Sirion XL30). The TEM sample was prepared by inkjet printed thin films directly on a TEM grid (Electron Microscopy Sciences, Dura SiN TEM grid). TEM analysis was performed using a FEI Tecnai F20 at 200 KV for high resolution images, structure (selected area electron diffraction) and chemical composition analysis (energy dispersive x-ray spectroscopy), respectively.

Example 8

This example concerns one embodiment of a method for making a ZIO MISFET Metal-Insulator-Semiconductor Field Effect Transistors (MISFETs). Inkjet printed ZIO thin films have been used to form channel layers for the fabrication of Metal-Insulator-Semiconductor Field Effect Transistors (MISFETs). The ZIO precursor solution was prepared by dissolving 0.015 M of $ZnCl_2$ and $InCl_3$ in 25 ml acetonitrile. A ZIO MISFET was fabricated from a ZIO active channel layer that was deposited by a double inkjet printing process on an oxidized silicon substrate using the solution of $ZnCl_2$ and $InCl_3$ in acetonitrile. The inkjet printed films were subjected to a post annealing process at 600° C. for 1 hour. FIG. 9 is a schematic cross-sectional view of the ZIO MISFET structure.

Figure 13:
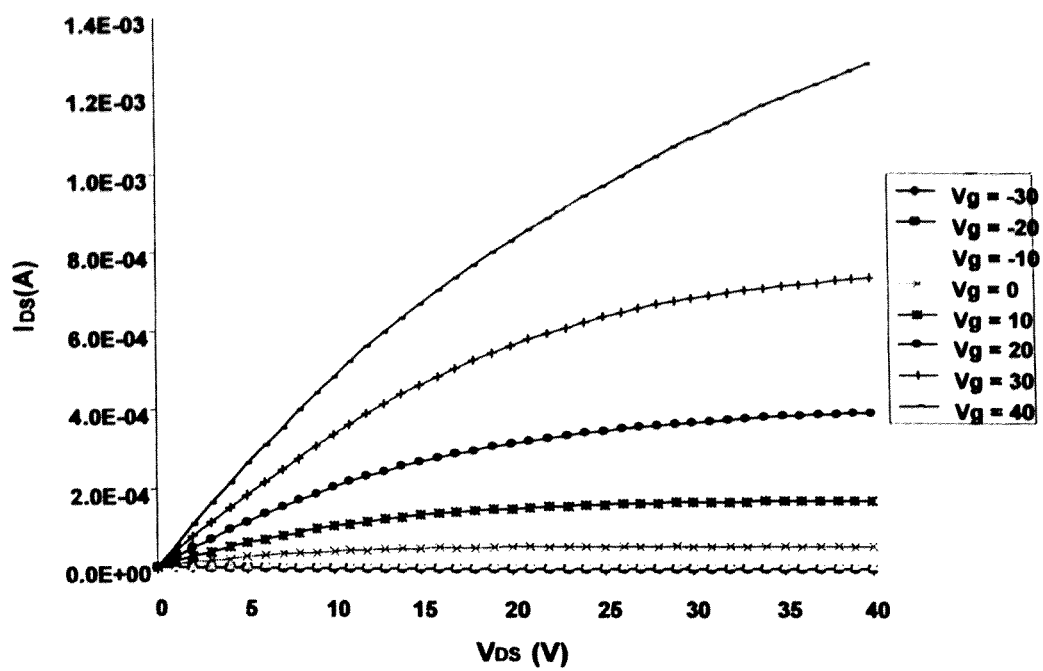
FIG. 13 provides the drain current-drain voltage ($I_{DS}$-$V_{DS}$) output characteristics for a ZnO—$In_2O_3$ (ZIO) MISFET made according to Example 8.

The drain current-drain voltage ($I_{DS}$-$V_{DS}$) output characteristics for the ZIO MISFET with a channel width-to-length ratio of 7 (channel length equals 200 µm) are presented in FIG. 13. The transistors exhibit very good gate-modulated behavior. The MISFET device parameters, including the field effect mobility, the drain current on-to-off ratio, and the turn-on voltage, have been determined. The mobility of a MISFET refers to the carrier mobility that is proportional to the carrier velocity in an electric field. See, Pierret, R. F., "Field Effect Devices," ($2^{nd}$ edn), Addison-Wesley Publishing Company, Inc., New York (1990). The field-effect mobility ($\mu_{FE}$) for this device is 7.37 cm²/V·sec, which is determined from the transconductance of the device at $V_{DS}$=1 V to ensure a mobility extracted from the linear region. Schroder, D. K., "Semiconductor Material and Device Characterization," ($2^{nd}$ edn), John Wiley & Sons, Inc., New York (1998).

Figure 14:
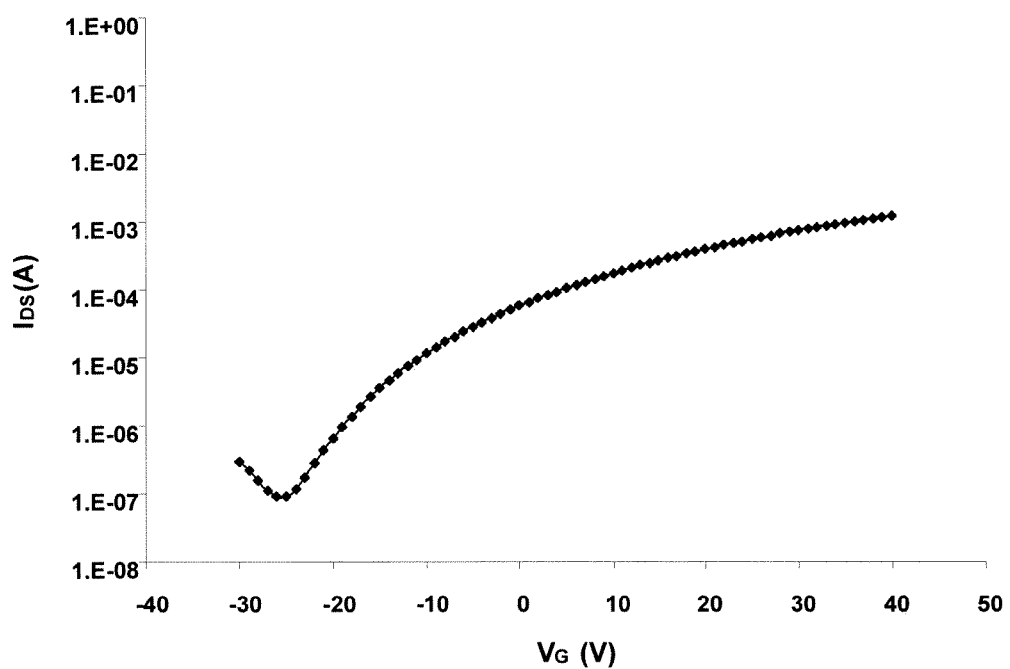
FIG. 14 provides the drain current-gate voltage (Log($I_{DS}$)-$V_{GS}$) transfer characteristics at $V_{DS}$=40 V for the ZnO—$In_2O_3$ (ZIO) MISFET made according to Example 8.

The drain current on-to-off ratio determines the switching quality of the MISFET. FIG. 14 shows the Log($I_{DS}$)-$V_{GS}$ transfer characteristics at $V_{DS}$=40 V. These data indicate a drain current on-to-off ratio of approximately $10^4$ with a turn-on voltage at −26 V. With a negative turn on voltage, this device behaves as a depletion-mode device that is initially on and requires a negative gate voltage to fully turn off the device. Hoffman, R. L., "ZnO-channel thin-film transistors: channel mobility," *J. Appl. Phys.* 95, 5813-5819 (2004). Turn on voltage was used here, instead of threshold voltage, to determine the minimum required voltage in order to induce current in the active layer. The threshold voltage value extrapolated from the linear portion at $V_{DS}$=1 V of $I_{DS}$-$V_{GS}$ or at $V_{DS}$=40V of $I^{1/2}{}_{DS}$-$V_{GS}$ plot sometimes is arbitrary and had been discussed in a recent reported literature. Id. The threshold voltage value usually is higher than the turn-on voltage for embodiments of devices disclosed herein due to the assumption that the mobility is independent of the applied gate voltage. Schroder, D. K. *Semiconductor Material and Device Characterization* ($2^{nd}$ edn), John Wiley & Sons, Inc., New York (1998). For disclosed devices the mobility usually increases with applied gate voltage. As a result, using turn-on voltage to determine the minimum required gate voltage to produce a conductive channel is more appropriate. The field effect mobility obtained from the inkjet printed ZIO MISFET is much higher than previous reported inkjet printed transistors. This establishes that high performance inkjet printed electronic devices can be fabricated using this new process.

Example 9

Blanket coating processes, such as spin coating, also have been evaluated. ZIO precursor solutions (0.01M $ZnCl_2$ and 0.02M $InCl_3$) were spun on top of an $Si/SiO_2$ substrate at 8,000 rpm for 30 seconds. The substrate and deposited ZIO thin film were then subjected to a post annealing process at 600° C. for 1 hour. Inverted-gate ZIO MISFETs were fabricated on oxidized silicon substrates having the structure illustrated schematically in FIG. 9. A spin-coated ZIO MISFET made according to this example, having a channel width-to-length ratio of 12 (channel length equals 200 μm), had a relatively high field-effect mobility ($\mu_{FE}$), $\mu_{FE} \cong 16.13$ $cm^2$/V·sec; a drain current on-to-off ratio of approximately $10^4$; and a turn-on voltage at −32 V.

Example 10

Figure 15:
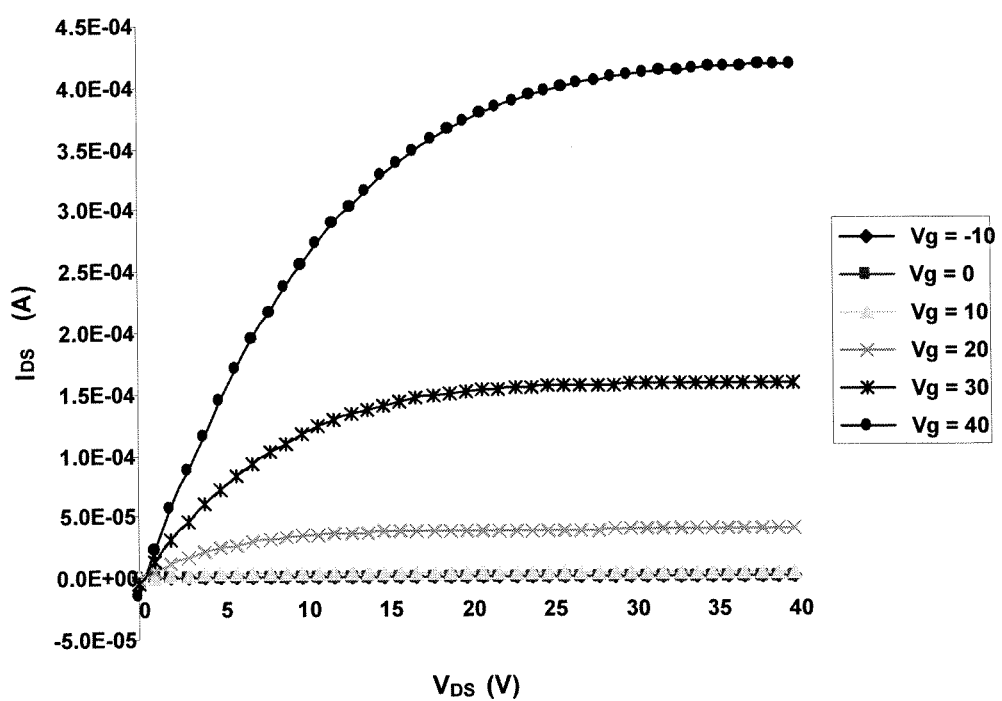
FIG. 15 provides the drain current-drain voltage ($I_{DS}$-$V_{DS}$) output characteristics for an inkjet printed $In_2O_3$—ZnO—$SnO_2$ (IZTO) MISFET made according to Example 10.
Figure 16:
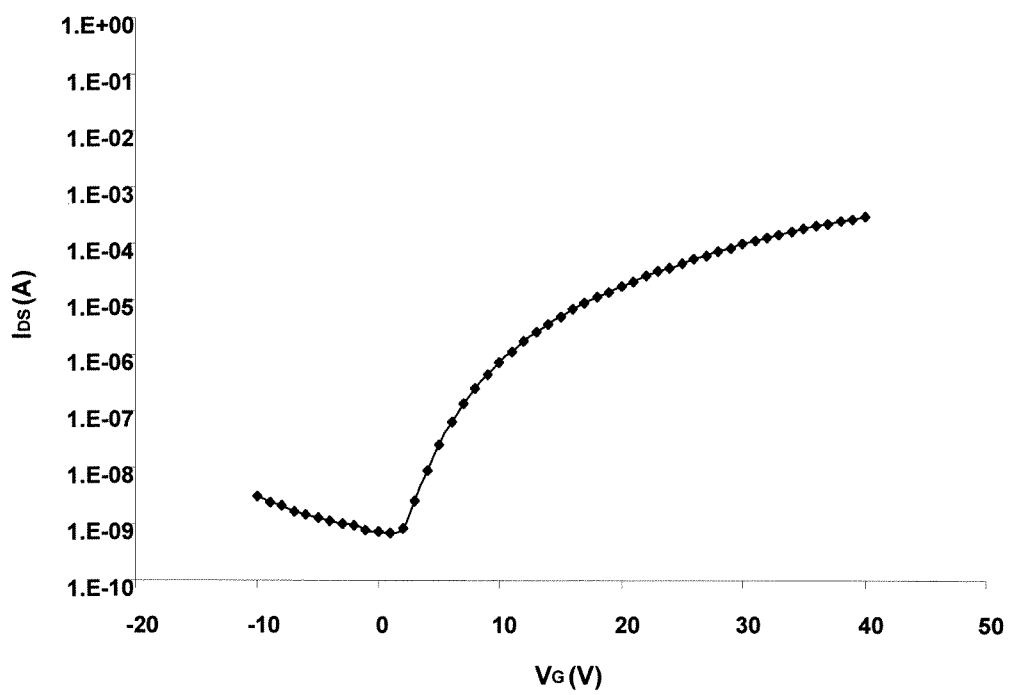
FIG. 16 provides the drain current-gate voltage (Log($I_{DS}$)-$V_{GS}$) transfer characteristics at $V_{DS}$=40 V for an inkjet printed $In_2O_3$—ZnO—$SnO_2$ (IZTO) MISFET made according to Example 10.

Multi-component materials can be used to tailor the electrical, optical, physical and chemical properties of TCO films by altering the chemical composition. For example, IZTO thin films have been inkjet printed using a precursor solution of $InCl_3$, $ZnCl_2$ and $SnCl_2$ in acetonitrile. Without any process optimization, the overall device performance for the inkjet printed IZTO MISFET is good. FIG. 15 shows the drain current-drain voltage ($I_{DS}$-$V_{DS}$) output characteristics for an IZTO MISFET having a channel width-to-length ratio of 12 (channel length equals 200 μm). This IZTO MISFET has a good gate-modulated transistor behavior with a hard saturation. The field-effect mobility ($\mu_{FE}$) for this device is $\mu_{FE} \cong 3.87$ $cm^2$/V-sec. FIG. 16 shows the $Log(I_{DS})$-$V_{GS}$ transfer characteristics at $V_{DS}$=40 V. These data establish a drain current on-to-off ratio of approximately $10^6$ with a turn-on voltage of 1 V. With a positive turn-on voltage, this device behaves as an enhancement-mode device and the relatively large drain current on-to-off ratio indicates that it can function well as a switch.

Example 11

Figure 17:
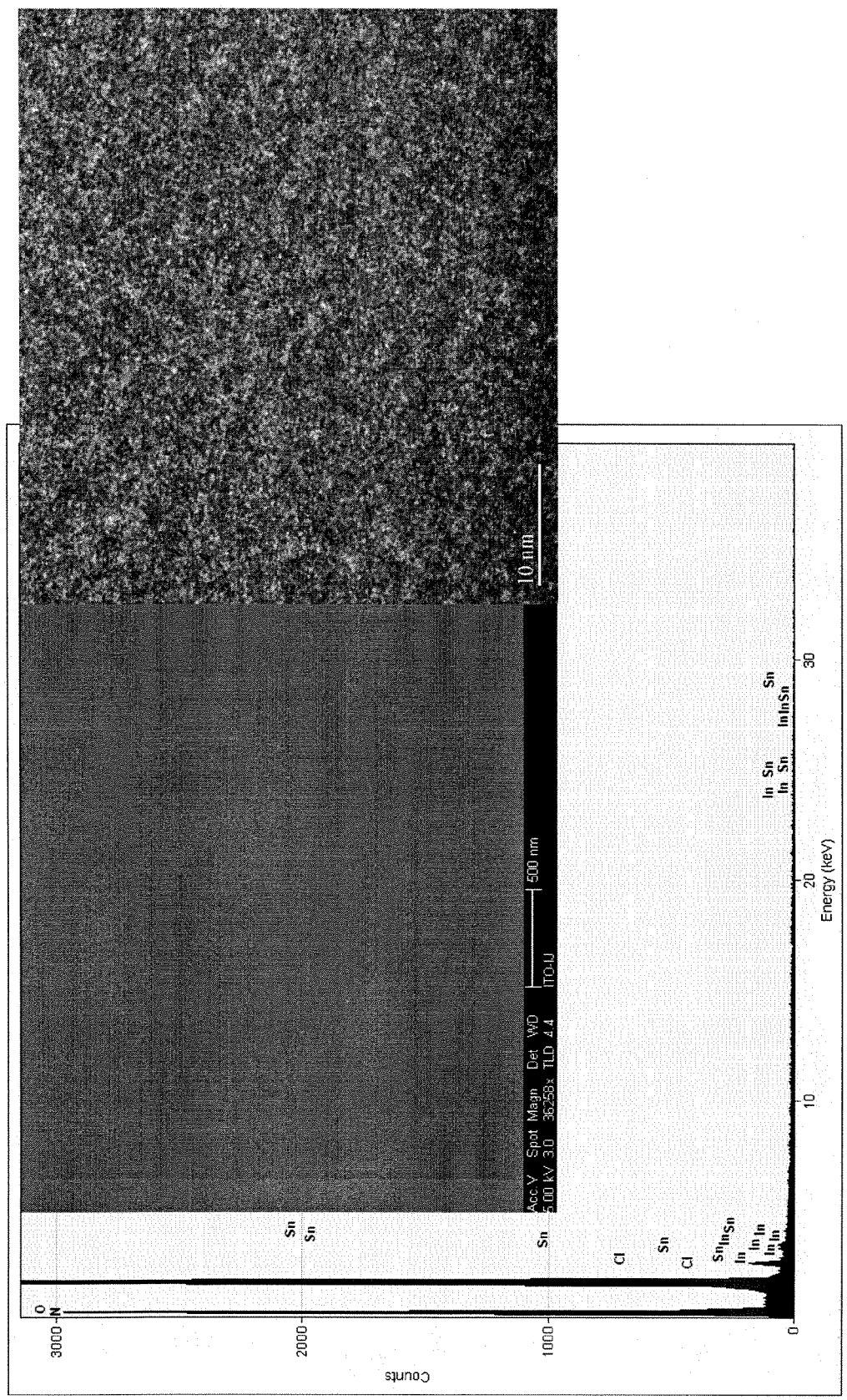
FIG. 17 provides a TEM micrograph, electron diffraction pattern and an EDX analysis of an $In_2O_3$—$SnO_2$ (ITO) thin film used to make an $In_2O_3$—$SnO_2$ (ITO) MISFET according to Example 11.

An ITO MISFET also has been made by spin coating. The output characteristics of the spin-coated ITO MISFET with a channel width-to-length ratio of 7 (channel length equals 200 μm) shows a relatively high field-effect mobility ($\mu_{FE}$) of 30.21 $cm^2$/V-sec, a drain current on-to-off ratio of approximately $10^5$ and a turn-on voltage of −15 V. FIG. 17 provides a TEM micrograph, electron diffraction pattern and an EDX analysis of an $In_2O_3$—$SnO_2$ (ITO) thin film used to make the $In_2O_3$—$SnO_2$ (ITO) MISFET according to this example.

Example 12

Figure 18:
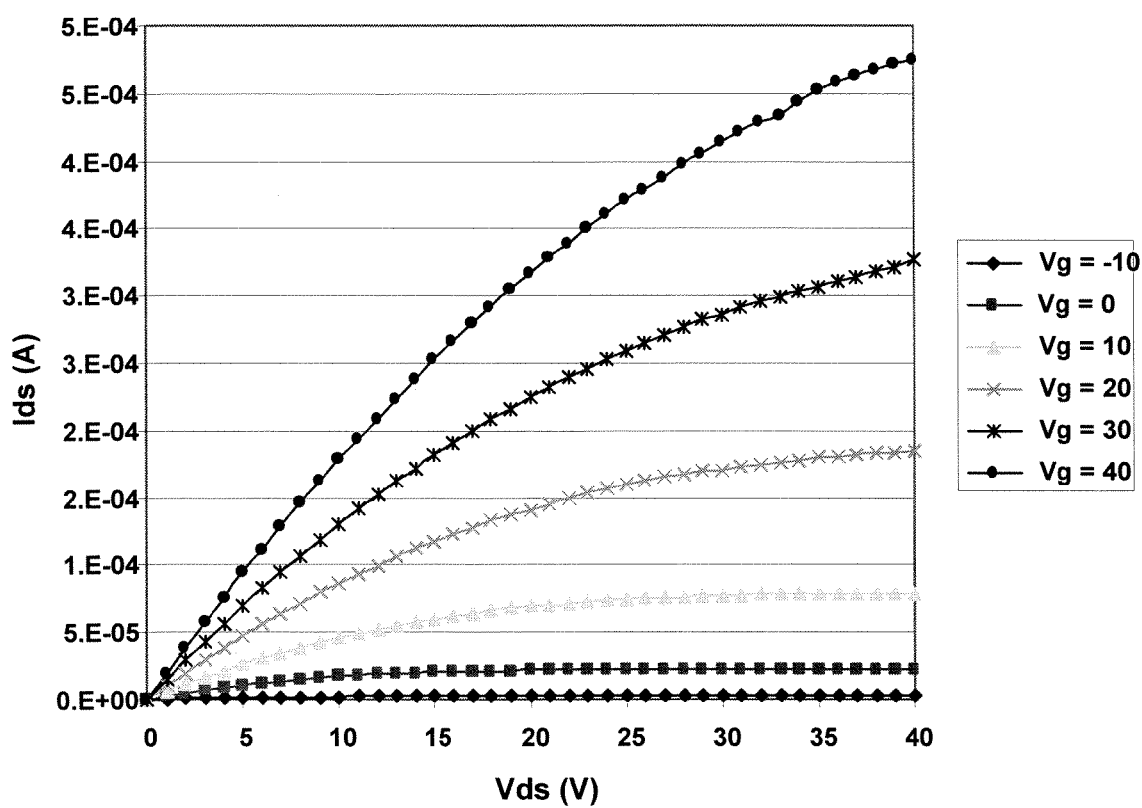
FIG. 18 provides the drain current-drain voltage ($I_{DS}$-$V_{DS}$) output characteristics for an $In_2O_3$—$SnO_2$ (ITO) MISFET made according to Example 12.
Figure 19:
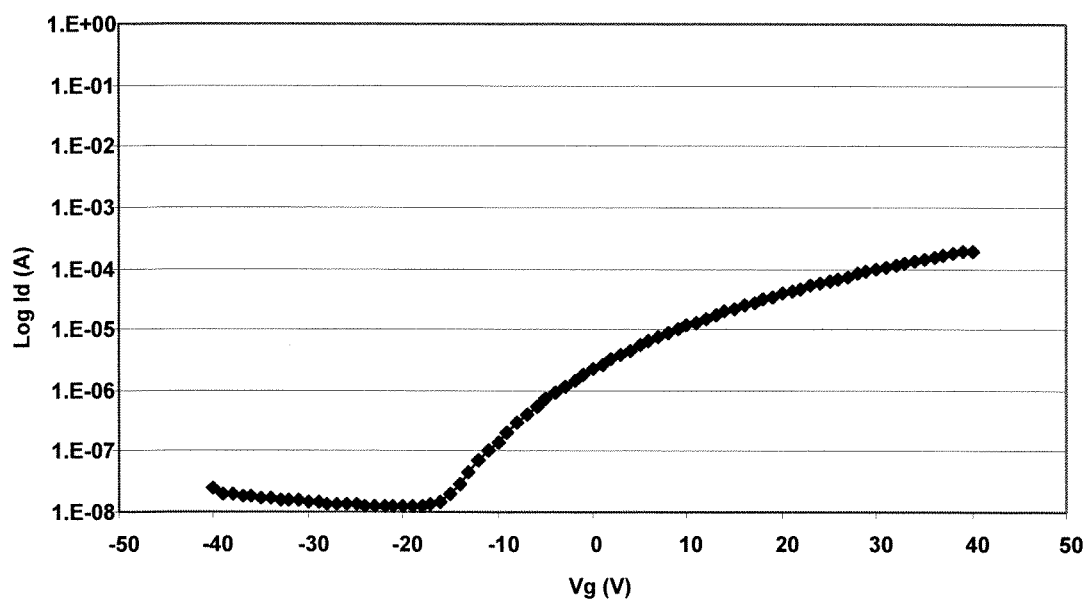
FIG. 19 provides drain current-gate voltage (Log($I_{DS}$)-$V_{GS}$) transfer characteristics at $V_{DS}$=40 V for an $In_2O_3$—$SnO_2$ (ITO) MISFET made according to Example 12.

An ITO MISFET has been made by inkjet printing too. The drain current-drain voltage ($I_{DS}$-$V_{DS}$) output characteristics and, drain current-gate voltage ($Log(I_{DS})$-$V_{GS}$) transfer characteristics at $V_{DS}$=40 V for the ITO MISFET of this example are provided by FIGS. 18 and 19, respectively. The ITO MISFET had a field effect mobility ($\mu_{FE}$) of 2.03 $cm^2$/V·sec., a turn on voltage at −20 volts, and a current on/off ratio of about 1e4. The inkjet printed ITO TFT showed inferior device performance compared to the device fabricated by spin coating the channel layer. But optimization of the inkjet printing process should lead to inkjet printed TFTs having better performance.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

Example 13

This example describes thin film deposition of CuI for use in fabricating inkjet-printed and spin-coated CuI thin films. CuI powder was obtained from Alfa Aesar and used directly without further purification. A 0.153 molar CuI solution in acetonitrile was then prepared. The solution was subjected to ultrasonic mixing for 10 minutes at ambient temperature in a 30 milliliter, pre-cleaned vial to provide a well mixed solution for printing and spin coating.

An HP 1220C thermal inkjet printer was modified to allow placement of $Si/SiO_2$ substrates on a plastic tray, which were loaded from the back of the printer, for deposition of thin film inorganic materials. The black ink cartridge was filled with CuI solution (~10 milliliters) using a syringe. The cartridge was sealed with a metallic ball and loaded into the printer's cartridge holder. Microsoft Excel software was used to print the active layer with a desired pattern.

Desired substrate materials were then treated using a standard acetone/methanol/de-ionized water (AMD) pre-cleaning method. A nitrogen stream was used to dry the cleaned substrate, which was then loaded into the inkjet printer for printing.

Desired substrate materials were first ultrasonicated using a 1 M NaOH solution for 10 minutes following by rinsing with deionized-water. A nitrogen stream was used to dry the cleaned substrates. Spin coating was performed using a Specialty Coating System P-6708D spin coater operating at 8,000 rpm for 30 seconds.

Example 14

This example concerns one embodiment of a method for making a Metal-Insulator-Semiconductor Field Effect Transistors (MISFETs) using CuI thin film deposition. A heavily boron (p+) doped silicon substrate served as the gate and an inverted-gate structure was used. Silicon dioxide having a thickness of 100 nm was thermally grown on top of a silicon substrate. A 500-nanometer gold layer was sputtered on the backside of the Si substrate to form a gate contact. This structure was used to test device fabrication.

Figure 21:
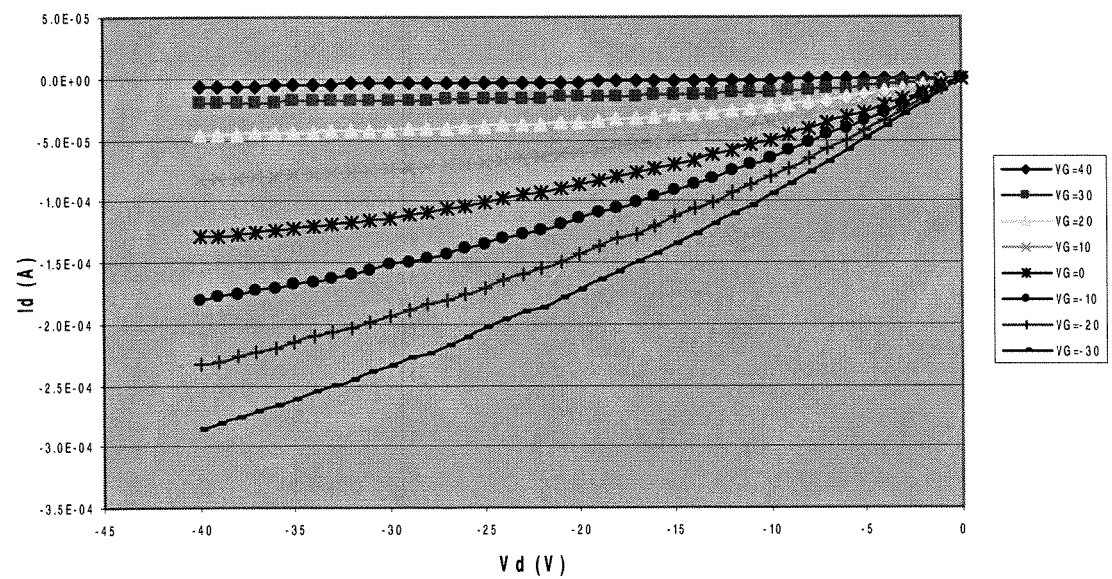
FIG. 21 provides the drain current-drain voltage ($I_{DS}$-$V_{DS}$) for a CuI MISFET according to Example 14.

Semiconductor channel material was strip patterned using a designated layout that was generated using a Microsoft Excel software program in order to reduce the gate leakage current. A ~30 nanometer CuI thin film was deposited on top of the $Sio_2$ by inkjet printing. No further post deposition annealing process was performed after CuI deposition. The CuI thin film growth mechanism is subject to direct dissolution and recrystallization after solvent evaporation in air. The 100-nanometer gold source and drain contacts were then evaporated on top of the CuI layer through a shadow mask with channel width-to-length ratio of 7 and 12 (channel length equals 200 μm) to form the MISFET. Device characterization was performed in the dark at room temperature with an HP 4157B Semiconductor Parameter Analyzer. The drain current-drain voltage ($I_{DS}$-$V_{DS}$) output characteristics are presented in FIG. 21. Ambient moisture will be absorbed by the CuI thin films, which increases the conductivity. Moisture therefore was removed from the CuI thin film by preheating the substrate on a hotplate heated to a temperature of about 200° C. for 5 minutes before device characterization.

Example 15

This example describes thin film deposition of CuCdI for use in fabricating inkjet-printed and spin-coated CuCdI thin films. CuI powder was obtained from Alfa Aesar and used directly without further purification. A 0.04 M of CuI and CdI (1 to 1 mole ratio) solution in acetonitrile was then prepared. The solution was subjected to ultrasonic mixing for 10 minutes at ambient temperature in a 30 milliliter, pre-cleaned vial to provide a well mixed solution for printing and spin coating.

Desired substrate materials were treated using a standard acetone/methanol/de-ionized water (AMD) pre-cleaning method. A nitrogen stream was used to dry the cleaned substrates. Spin coating was performed using a Specialty Coating System P-6708D spin coater operating at 8,000 rpm for 30 seconds.

Example 16

Figure 22:
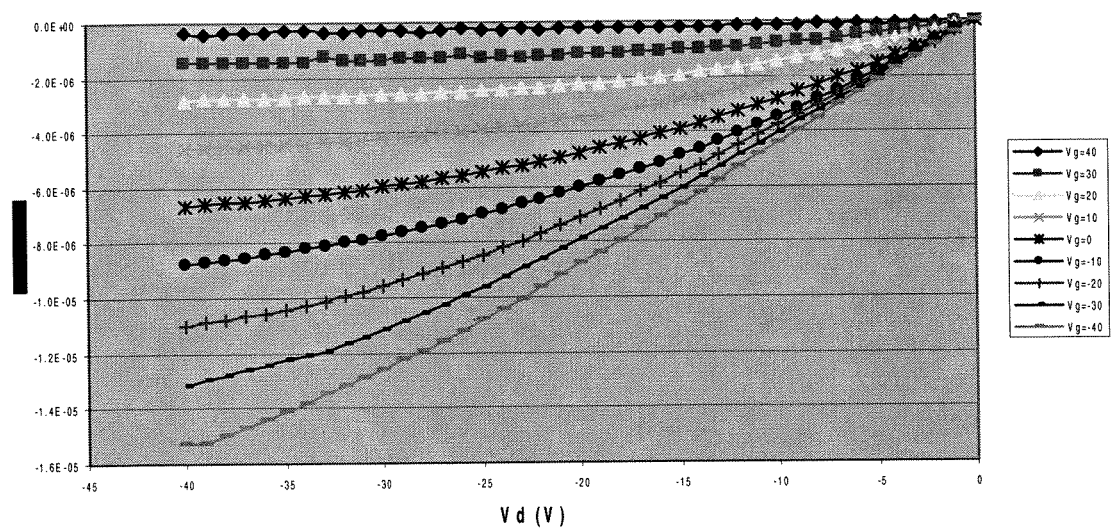
FIG. 22 provides the current-drain voltage characteristics for a CuCdI MISFET according to Example 16.

This example concerns one embodiment of a method for making a CuCdI Metal-Insulator-Semiconductor Field Effect Transistors (MISFETs). A heavily boron (p+) doped silicon substrate served as the gate and an inverted-gate structure was used. Silicon dioxide having a thickness of 100 nm was thermally grown on top of a silicon substrate. A 500-nanometer gold layer was sputter deposited on the backside of the Si substrate to form a gate contact. This structure was used to test device fabrication. A patterned ~20 nanometer CuCdI thin film was deposited on top of the SiO$_2$ by spin coating using a photolithography process. No further post deposition annealing process was performed after CuCdI deposition. The 100-nanometer gold source and drain contacts were then evaporated on top of the CuCdI layer through a shadow mask with channel width-to-length ratio of 7 and 12 (channel length equals 200 μm) to form the MISFET. Device characterization was performed in the dark at room temperature with an HP 4157B Semiconductor Parameter Analyzer. The drain current-drain voltage ($I_{DS}$-$V_{DS}$) output characteristics are presented in FIG. 22.

Example 17

Figure 23:
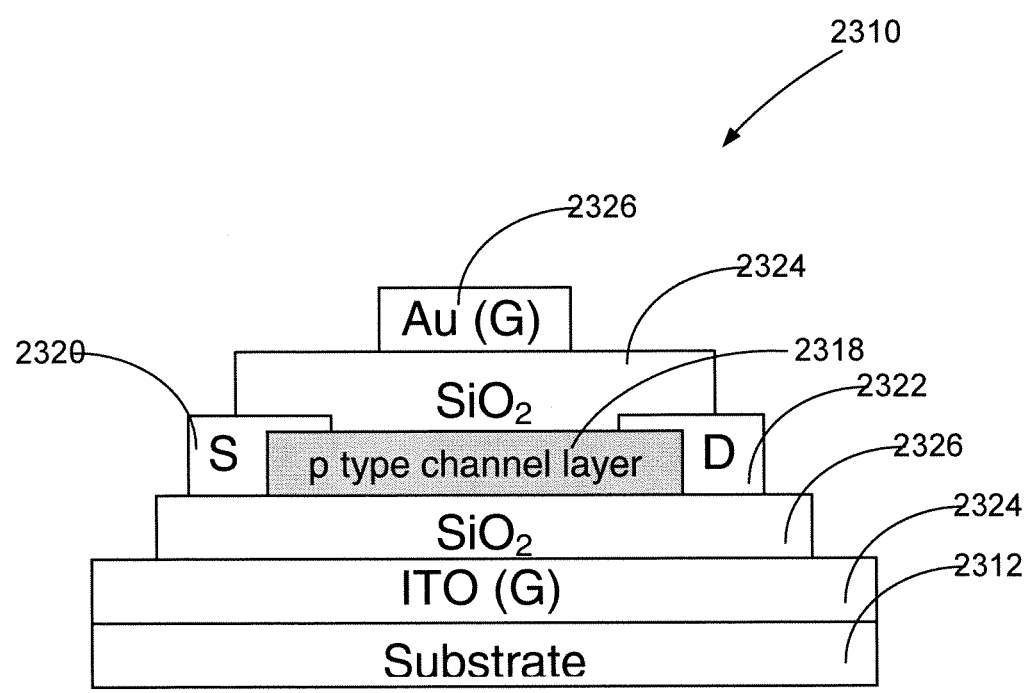
FIG. 23 is a schematic diagram illustrating an embodiment of a transparent flexible p-type MISFET according to Example 17.

This example concerns one embodiment of a method for making a transparent flexible P-type Metal-Insulator-Semiconductor Field Effect Transistors (MISFETs) using p-type channel materials such as CuI, CuCdI and CuAgI thin films as active layers for device fabrication. FIG. 23 is a schematic diagram illustrating one embodiment of a transparent, flexible P-type MISFET that can be made according to this example. With reference to FIG. 23, MISFET 2310 included a substrate 2312. An ITO gate electrode layer 2314 was formed positioned on top of the substrate. Patterned, silicon dioxide gate dielectric layer was grown on top of the ITO surface 2314. P-type channel 2318 was formed on layer 2316, followed by source layer 2320 and drain layer 2322. A silica layer 2324 was then formed to encapsulate the MISFET.

To make a specific implementation of MISFET 2310, a commercially available transparent glass slide/ITO or flexible PET/ITO can be used as the substrate. An ITO layer serves as the gate electrode and an inverted-gate structure was used. A patterned silicon dioxide gate dielectric layer having a thickness of 500 nm was sputtered and grown through a shadow mask on top of ITO surface. P-type channel materials were either ink jet printed or spin-coated on top of the SiO$_2$ layer. A 100-nanometer source and drain gold contact layer was evaporated on the channel layer. To prevent moisture from absorbing into the channel layer, the thin film was first pre-heated at 200° C. for 10 minutes, followed by sputtering a 500-nm thick SiO$_2$ encapsulation layer. A top gate device structure can be made by simply depositing a gold gate contact on top of the SiO$_2$ encapsulation layer.

Example 18

Figure 24:
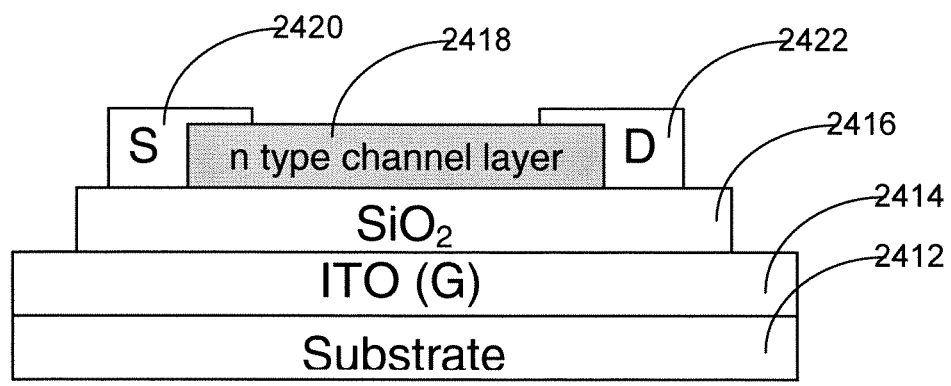
FIG. 24 is a schematic diagram of a transparent flexible N-type MISFET according to Example 18.

This example concerns one embodiment of a method for making a transparent, flexible N-type Metal-Insulator-Semiconductor Field Effect Transistors (MISFETs) illustrated schematically in FIG. 24 using n-type channel materials such as InO$_x$, ZnO, SnO$_x$, ITO, ZTO, ZIO and IZTO thin films as active layers for device fabrication. With reference to FIG. 24, a flexible N-type MISFET 2410 included a substrate layer 2412. An ITO gate layer 2414 is provided on top of the substrate layer 2412. SiO$_2$ layer 2416 is then deposited on top of the ITO gate layer. N-type channel layer 2418 is then positioned on top of the silica layer, followed by formation of source 2420 and drain 2422.

To make a specific implementation of a flexible N-type MISFET 2410, a commercially available transparent glass slide/ITO or flexible PET/ITO cab be used as the substrate. An ITO layer serves as the gate electrode and an inverted-gate structure cab be used. A patterned silicon dioxide gate dielectric layer having a thickness of 500 nm will be sputter deposited through a shadow mask on top of an ITO surface. N-type channel materials can be either inkjet printed or spin-coated on top of the SiO$_2$ layer. A 300-nanometer source and drain aluminum contact layer will be evaporated on top of the channel layer.

Example 19

Figure 25:
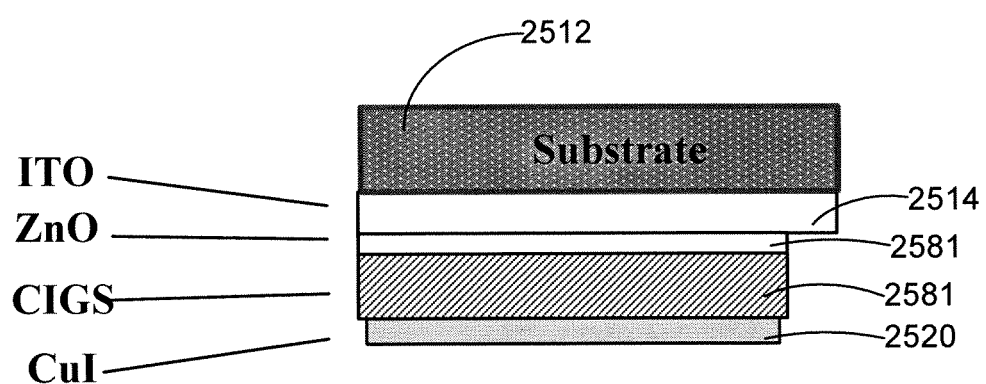
FIG. 25 is a schematic diagram of a thin film photovoltaic according to Example 19.

This example concerns one embodiment of a method for making a thin film photovoltaic using semiconductor materials, such as indium tin oxide (ITO), zinc oxide (ZnO), Cu(In-Ga)Se$_2$ (CIGS), and copper iodide (CuI) as active layers for device fabrication. FIG. 25 is a schematic diagram of one embodiment of a thin-film photovoltaic 2510 that can be made according to this example. With reference to FIG. 25, photovoltaic 2510 includes substrate 2512, such as a glass substrate. An n-type layer can then be formed using a ITO layer 2514 and a ZNO layer 2516. A selenized layer 2518 thin film photovoltaic 2510 also includes copper iodide layer 2520.

To make a specific implementation of a thin-film photovoltaic 2510, a commercially available transparent glass will be used as the substrate. A transparent indium tin oxide (ITO) and ZnO n-type window layer can be inkjet printed on top of the glass substrate using InCl$_3$, SnCl$_2$ precursor for ITO and ZnCl$_2$ precursor for ZnO. Thermal annealing in the presence of H$_2$O was followed by formation of the n-type window layer. P-type absorber materials can be inkjet printed on top of the ZnO layer. A chalcopyrite Cu(In, Ga)Se$_2$ thin film could be fabricated by subjecting inkjet-printed CuCl, InCl$_3$, GaCl$_3$ precursor film to a selenization agent (e.g. H$_2$Se). P-type CuI transparent conductor then will be inkjet printed to form a contact with the absorber layer.

Example 20

Figure 26:
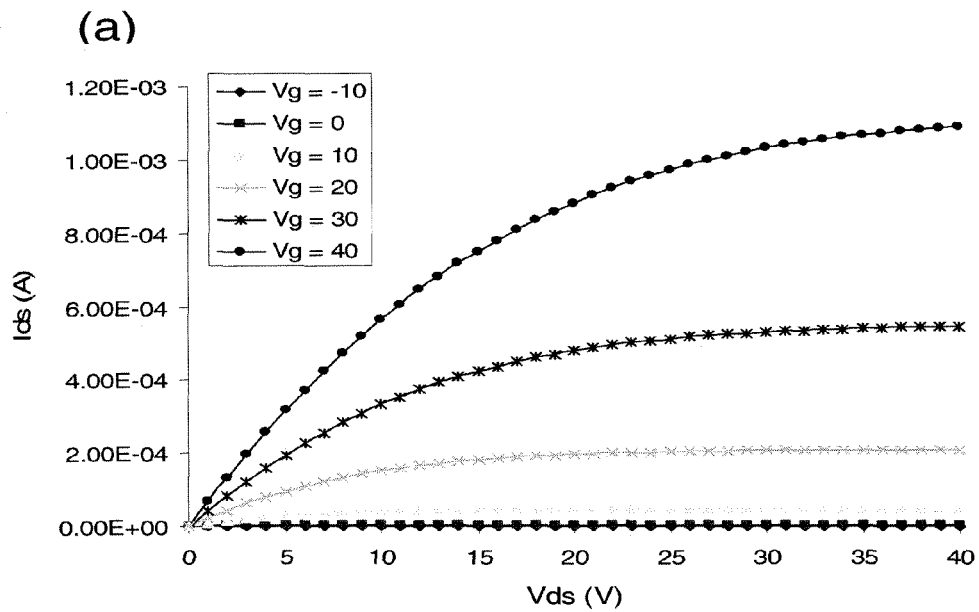
FIG. 26 provides drain current-drain voltage ($I_{DS}$-$V_{DS}$) output characteristics for one embodiment of an IZTO MISFET made according to the present invention.
Figure 27:
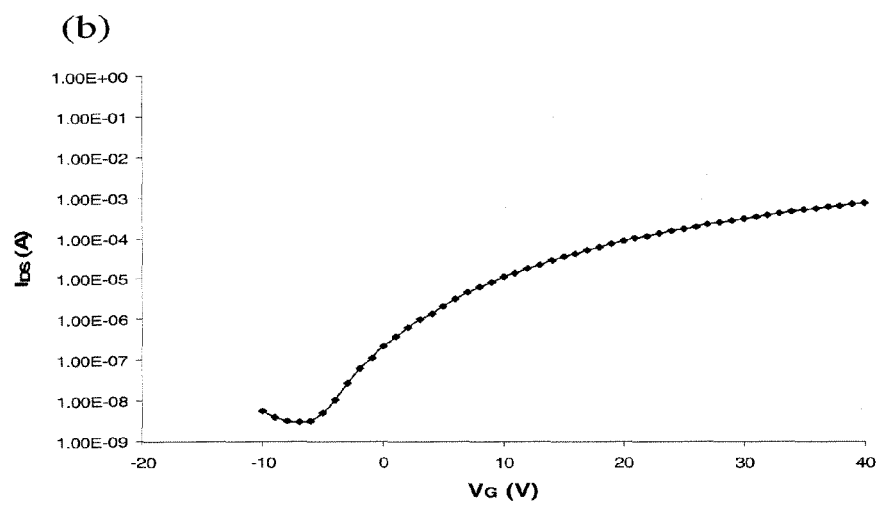
FIG. 27 provides Log($I_{DS}$)-$V_{GS}$ transfer characteristics at $V_{DS}$=40 V indicating a drain current on-to-off ratio of approximately $10^6$ with a turn-on voltage of −7 V for one embodiment of an IZTO MISFET made according to the present invention.

This example concerns one embodiment for inkjet printing IZTO thin films using a precursor solution of InCl$_3$, ZnCl$_2$ and SnCl$_3$ in acetonitrile. Without any process optimization, the overall device performance for the inkjet printed IZTO MISFET is quite encouraging. FIG. 26 shows the drain current-drain voltage (I$_{DS}$-V$_{DS}$) output characteristics for IZTO MISFET with a channel width-to-length ratio of 7 (channel length equals 200 pm) and a good gate-modulated transistor behavior. The field-effect mobility ($\mu_{FE}$) determined by the transconductance of this device is $\mu_{FE}$=12 cm$^2$/V-sec. FIG. 27 shows the Log(I$_{DS}$)-V$_{GS}$ transfer characteristics at V$_{DS}$=40 V indicating a drain current on-to-off ratio of approximately 10$^6$ with a turn-on voltage of −7 V. With a negative turn-on voltage, this device behaves as a depletion-mode device and the relatively large drain current on-to-off ratio indicates that it can function well as a switch. Another interesting example is the fabrication of ITO MISFET via the same process.

Figure 28:
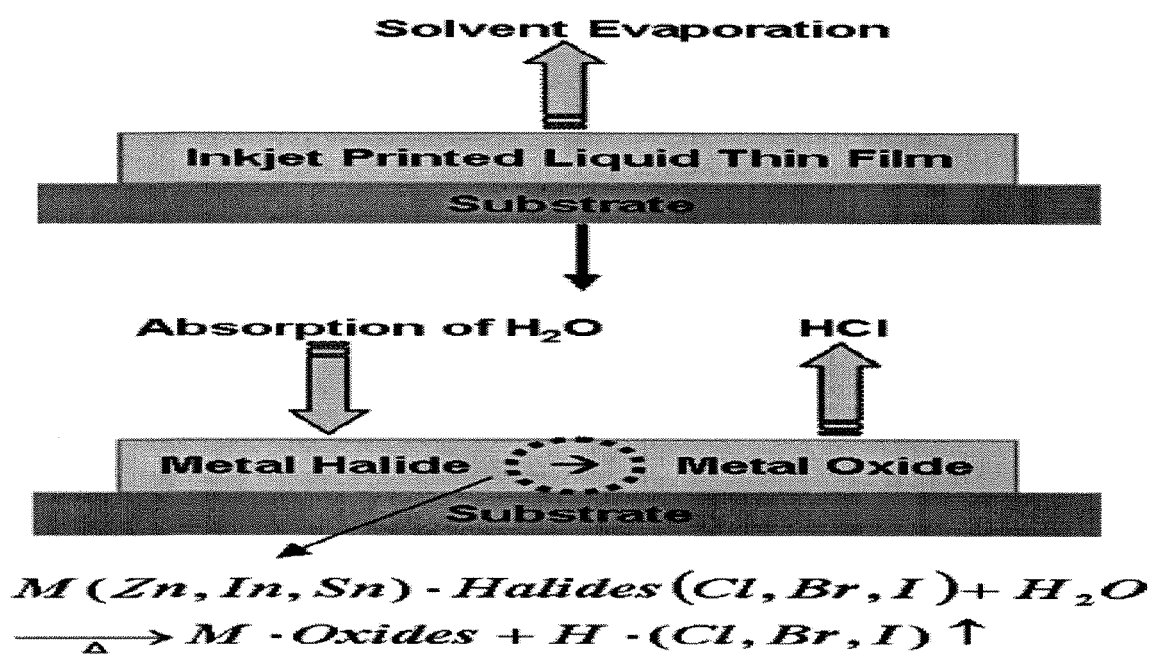
FIG. 28 is a schematic diagram illustrating a proposed mechanism for metal oxide semiconductor thin film formation.

Working examples provided herein establish that inkjet printed metal halide thin films can be to high performance semiconducting metal oxides. Without being limited to a theory of operation, it appears that the metal halides are converted to metal oxides by a thermally activated substitution reaction between the metal halide film and water. This proposed mechanism of metal oxide semiconductor thin film formation is illustrated schematically in FIG. 28. The metal oxide thin film formation starts with the precursor dissolution and follows by thin liquid film formation by inkjet printing, spin coating etc., thin solid film formation after solvent evaporation, and finishes by a substitution oxidation reaction. This synthetic pathway provides a new avenue to fabricate a variety of patterned metal oxide semiconductors at low-cost.

TABLE 2

Summary of Electrical Properties of Semiconducting Oxide Thin Film Transistors

| | | Oxide MISFET device by Inkjet printing | | | |
|---|---|---|---|---|---|
| | | ZIO | ZTO | ITO | IZTO |
| Spin-coating | Mobility (µFE) [cm$^2$/V-sec] | 16.13 | 15.92 | 30.21* | 15.09 |
| | On-off | 1e4 | 1e5 | 1e5 | 1e5 |
| | Von | −32 | 2 | −15 | −33 |
| Inkjet printing | Mobility (µFE) [cm$^2$/V-sec] | 7.37 | 1.17 | 2.03 | 12.02** |
| | On-off | 1e4 | 1e5 | 1e4 | 1e6 |
| | Von | −25 | 7 | −20 | −7 |

*,**indicate the TFT which has the highest mobility

Example 21

This example concerns one embodiment of a method for printing porous tin oxide thin films by using SnCl$_4$ as the precursor. Tin oxide thin film precursor solution was prepared by dissolving 0.0086 mol of tin tetrachloride (Alfa Aesar, 98% SnCl$_4$) into 25 ml of acetonitrile (CH$_3$CN) at room temperature. A modified HP 1220C thermal inkjet printer and Microsoft Excel software was used to print the active layer with a desired pattern. First, the precursor solution (~10 ml) was filled into the black cartridge (HP45) by a needle syringe, sealed with a metallic ball, and then loaded into the cartridge holder. Second, the substrate was treated by a standard Acetone, Methanol and De-ionized Water (AMD) pre-cleaning method, followed by a stream of clean dry nitrogen gas to blow it dry, before placing onto a plastic tray, and loaded into the inkjet printer. The absorption and transmission analysis of the thin films were measured at various wavelengths by a UV-Vis spectrophotometer (Ocean Optics Inc, USB 2000 optic spectrometer) for the optical bandgap and transmittance measurement. The TEM sample was prepared by inkjet printing thin films directly on a TEM grid (Electron Microscopy Sciences, Dura SiN TEM grid). TEM analysis was performed using a Philips CM 12 at 120 KV. The chemical composition was characterized by X-ray Photoelectron Spectroscopy (XPS) using a Physical Electronics QUANTERA Scanning ESCA in high power mode.

The thermal behaviors of the precursor chemicals were investigated by a Thermogravimetric Analyzer (TA Instrument Inc., Modulated TGA 2950 Thermogavimetric Analyzer). A drop of the precursor solution was laid on a pretarred aluminum pan. The temperature ramping rate was 5° C. per minute, and the temperature was increased to 600° C. Device testing was performed in the dark at room temperature using an Agilent Technology 4157B Semiconductor Parameter Analyzer.

Figure 36:
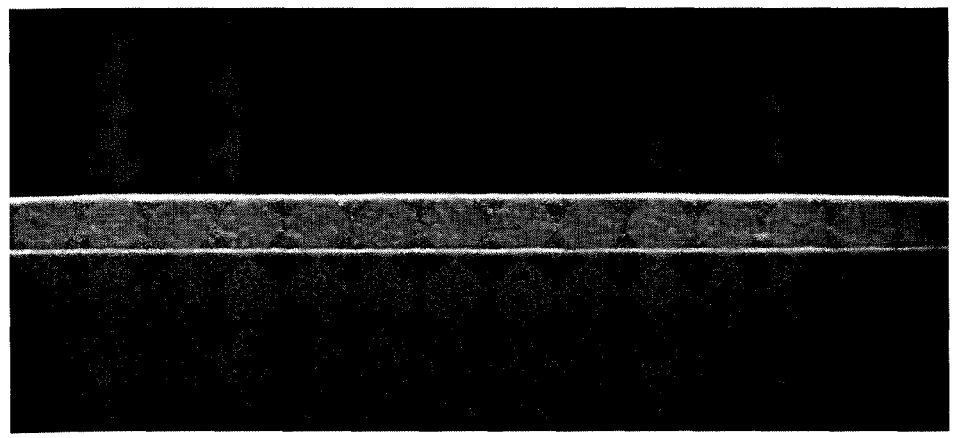
FIG. 36 is a cross-sectional SEM image of an as-deposited tin oxide thin film deposited on a 20×40 millimeter silicon substrate.
Figure 37:
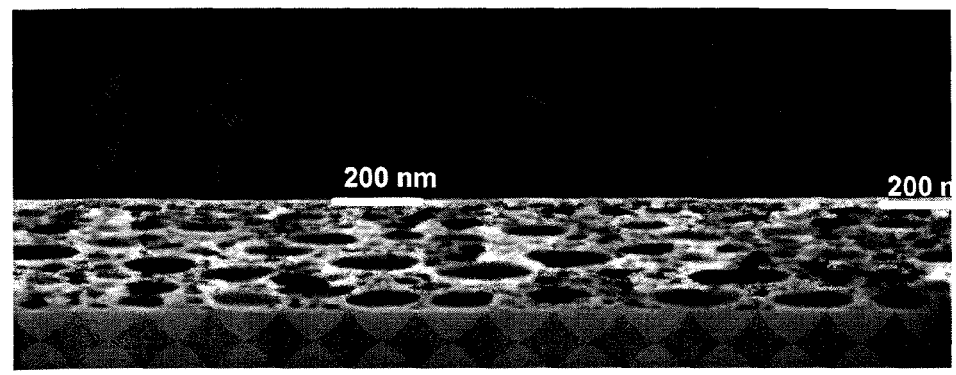
FIG. 37 is a cross sectional image after a post-annealing process of the tin oxide film of FIG. 36 in an air furnace at 500° C. for 15 minutes.

Top and cross-sectional SEM images of as-deposited SnCl$_4$ precursor thin film clearly illustrate a dense, smooth and very uniform film can be printed directly from a commercially available thermal inkjet printer. The printed SnCl$_4$ thin film precursors were subjected to a post annealing process using an air furnace at 500° C. for 15 minutes. FIGS. 36 and 37 show the corresponding top and cross-sectional SEM images of the annealed film. The top surface reveals nanopores on the order of 5 nanometers to 20 nanometers. The cross-sectional SEM image indicates an increment of film thickness. The thickness is mainly created by the porosity. The film surface remains smooth, uniform, and continuous. The film has an interesting porous structure that has a thin mesoporous layer on top and a thicker meso- (~2 to 20 nm) and macroporous layer (~70 nm to 100 nm) beneath the top layer.

The porous thin films were analyzed by scanning ESCA using a Physical Electronics QUANTEPA in a high power mode. The Sn3d5 has 487 eV and 495.6 eV two binding energies and binding energy spectra of O1s were observed at 530.7 eV. The high binding energy shoulder in the O1s peak could be attributed to the oxygen atoms chemisorbed at the surface. The atomic concentrations were calculated from established elemental sensitivity factors and considered semi-quantitative. The results show a [O]/[Sn] ratio of 1.4. The XPS analysis indicated that our inkjet-printed thin film is corresponding to SnO$_{2-x}$.

Figure 38:
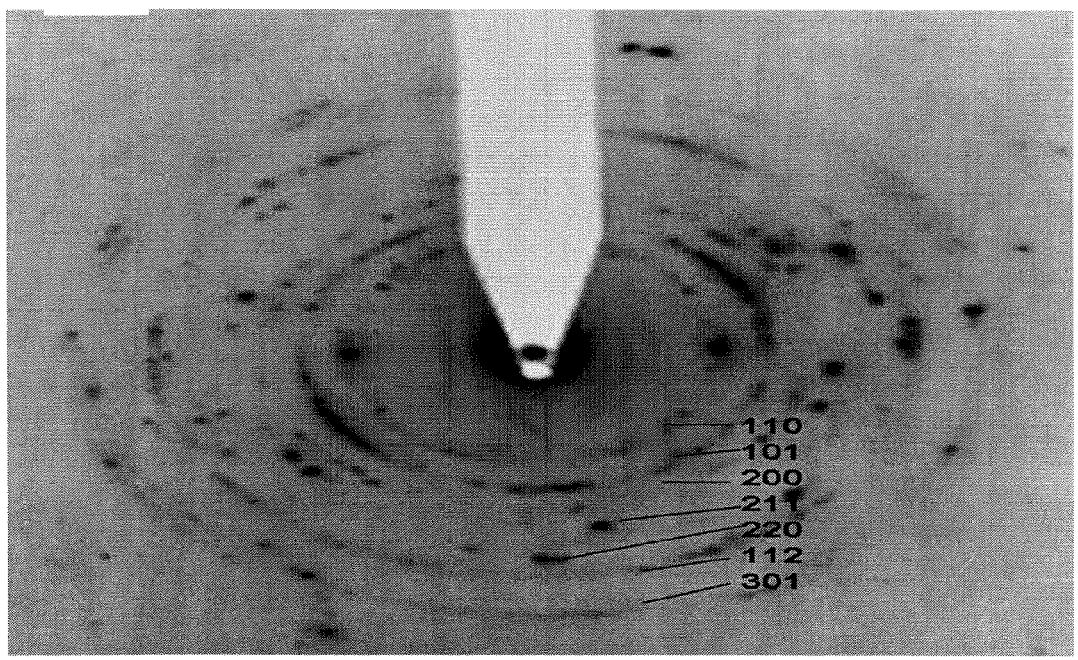
FIG. 38 is a TEM-electron diffraction pattern of a tin oxide sample prepared by one embodiment of an ink-jet printing process.

Selected area electron diffraction (SAED) was carried out using a TEM (Philips CM12) to determine the crystal structure of the inkjet printed tin oxide thin films. An electron diffraction pattern was given in FIG. 38. The pattern confirms the formation of polycrystalline thin films that matches the tetragonal SnO$_2$ (JCPDS 72-1147) structure.

Figure 39:
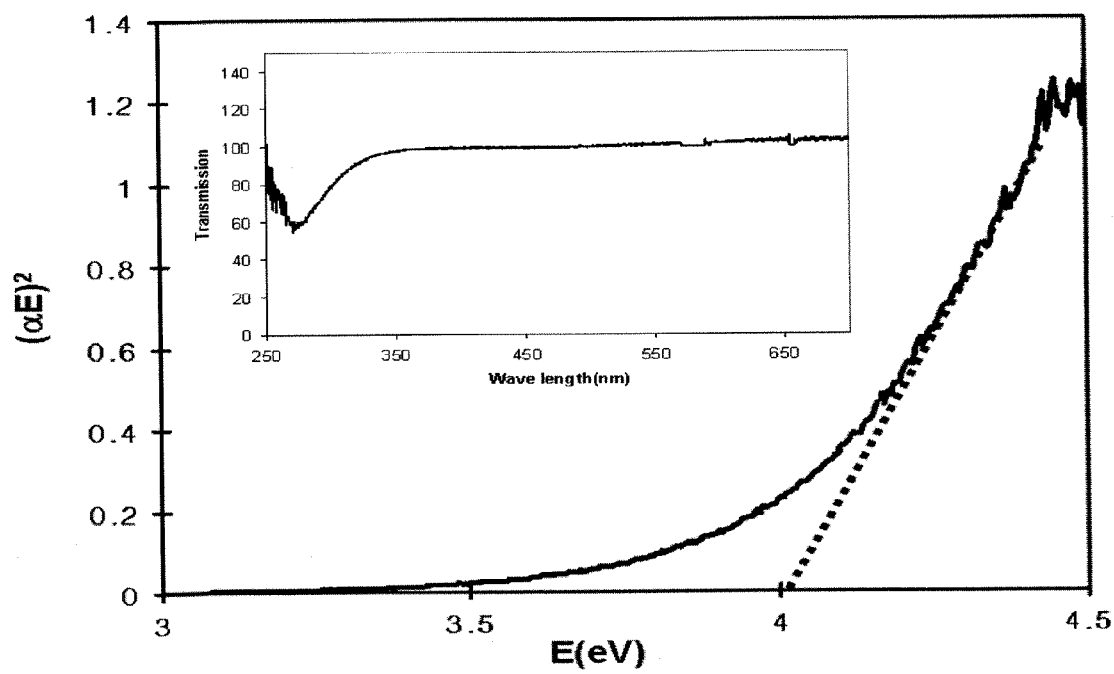
FIG. 39 provides an estimated bandgap and UV-Vis spectrum (inset) of a tin oxide thin film prepared by one embodiment of an ink-jet printing process.
Figure 40:
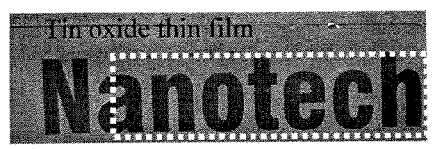
FIG. 40 illustrates a transparent tin oxide thin film printed directly on a fused silica substrate.

The optical properties of the inkjet printed porous tin oxide thin films were characterized by a UV/Vis spectrophotometer. FIG. 39 shows an absorption spectrum that is over 98% of transmittance within the visible range from 400 to 700 nm for of the printed film on a fused silica substrate. The optical image of FIG. 40 shows a uniform porous tin oxide thin film could be printed directed on a fused silica substrate. The optical bandgap value was estimated to be around 4.0 eV [13].

Figure 41:
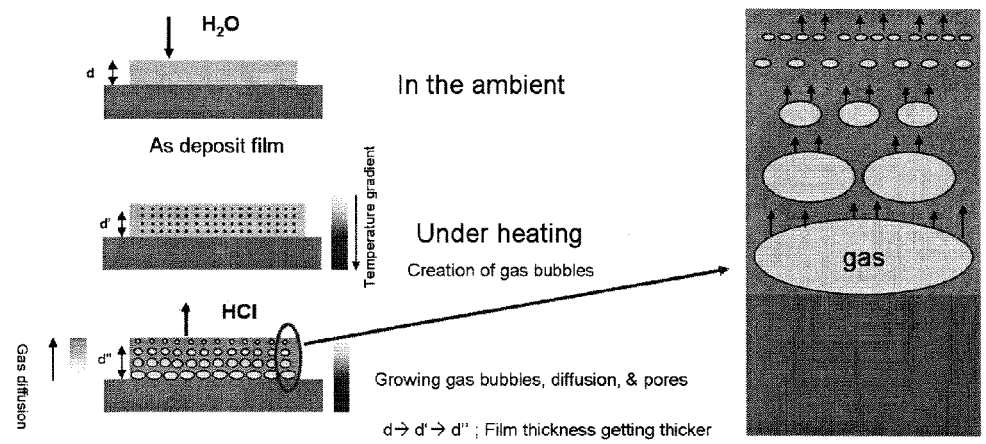
FIG. 41 is a schematic diagram illustrating a proposed mechanism for formation of a porous thin film.

The formation of pores in the film could be attributed to a series of water absorption, water diffusion, reaction, and gas evolution. Without being limited to a particular theory of operation, a schematic diagram of the proposed mechanism is provided by FIG. 41. At first, $SnCl_4$ precursor solution deposited on the substrate released the acetonitrile solvent by evaporation. After that, the as-deposited hygroscopic $SnCl_4$ precursor film absorbed water from the ambient and the water distributed within the precursor film and form $SnCl_4 \cdot H_2O$. During the thermal annealing process, $SnCl_4$ precursor will react with water and convert to tin oxide and generate hydrogen chloride gas according to the chemical reaction of $SnCl_4 + 2H_2O \rightarrow SnO_2 + 4HCl\ (g)\uparrow$. During this reaction, the HCl gas was generated, nucleated and formed bubbles within the film. The gas then diffused toward the surface of the film and created nano-sized pores within the tin oxide thin film. The pore size depends on the temperature, the mass transport of the evolving gas, and the surface tension between the gas and the precursor.

Figure 42:
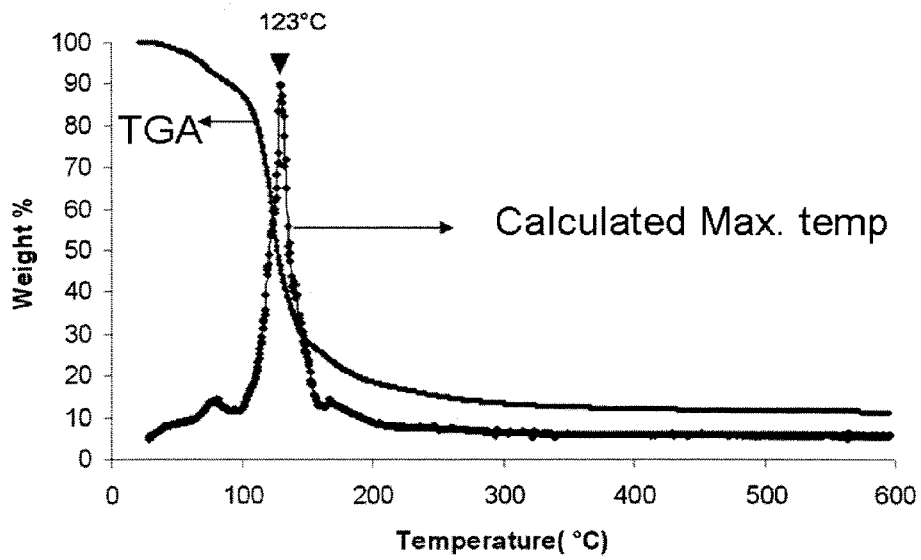
FIG. 42 is a thermo gravimetric analysis curve used to characterize weight loss at an annealing ramping rate of 15° C./minute with an operating temperature up to 600° C.

Thermo Gravimetric Analysis (TGA) was used to characterize the weight loss at an annealing ramping rate of 15° C./min with an operating temperature up to 600° C. The samples were prepared by preheating the metal halide/acetonitrile precursor solution at 87° C. for 5 minutes to remove the residual acetonitrile by evaporation. The TGA curve for the $SnCl_4$ precursor is provided by FIG. 42. The range of major weight loss was observed between 100° C. and 200° C. and the maximum weight loss at 123° C. was also calculated. The first weight loss peak in the TGA spectra was observed before 100° C., indicating that there is residual acetonitrile existed in the film after the preheating treatment. TGA data also suggest that an annealing temperature below 200° C. might be sufficient for converting $SnCl_4$ to $SnO_2$.

Figure 34:
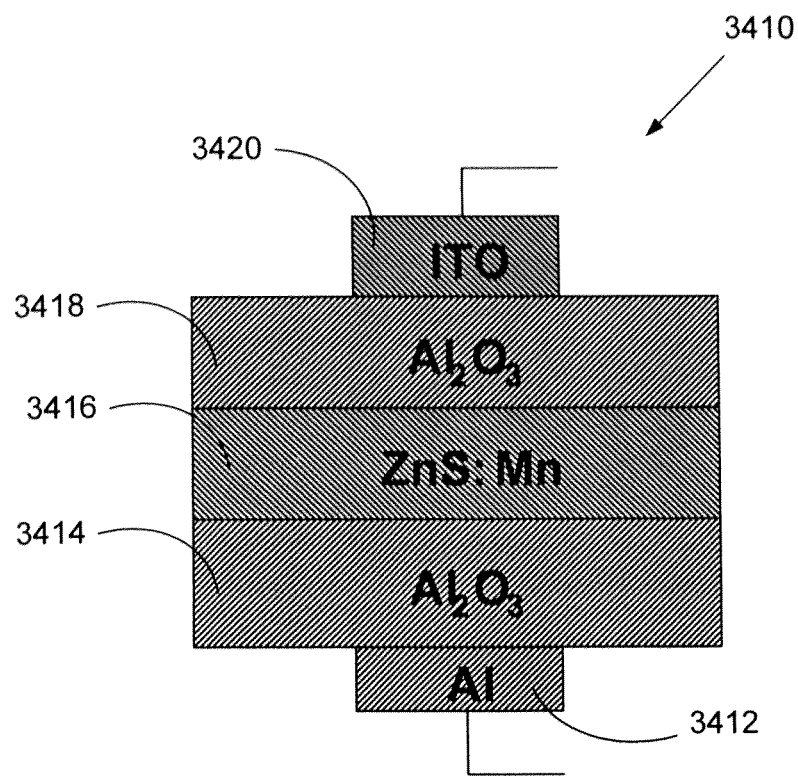
FIG. 34 is a schematic diagram of one embodiment of an electroluminescent device that can be made according to the present invention.
Figure 43:
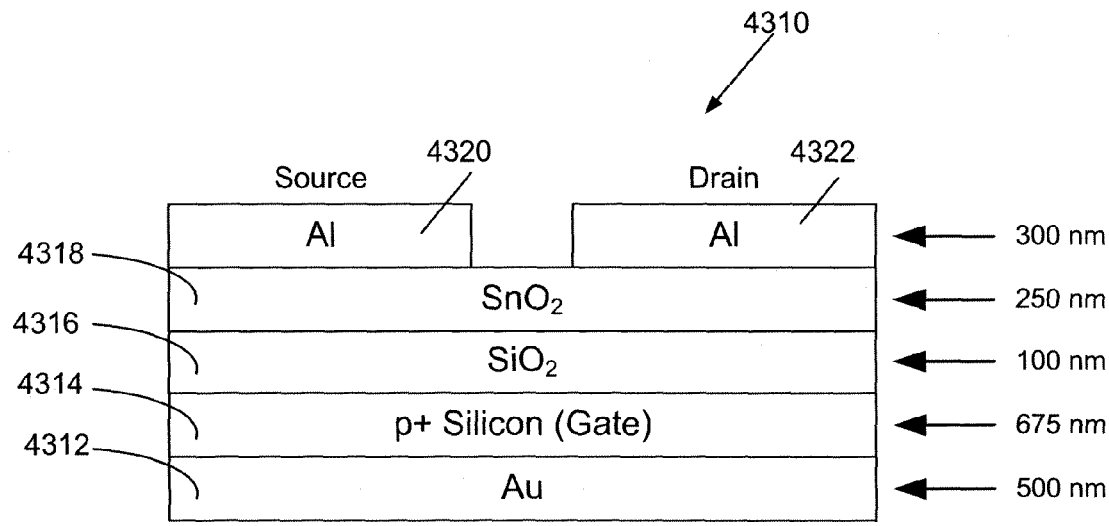
FIG. 43 is a schematic cross-sectional view of an inkjet printed $SnO_2$ MISFET.

Thin film transistors (TFTs) are commonly used for controlling pixels in flat panel displays. The typical semiconducting channel material used today is silicon. Tin oxide TFTs have been investigated in the early days for communication applications. More recently, the emergence of transparent electronics has spurred new interests in using tin oxide as a channel material. On the other hand, tin oxide is a well established material for gas sensing applications. The Fermi level affects the adsorption gases at semiconductor surface. Gas sensing properties of $SnO_2$-thin films may be controlled by applying an external electrical field. Wollenstein et al. reported the possibility of using $SnO_2$ TFTs to tune the sensitivities and selectivities to various gases by controlling the gate voltage. The porous structure of ink jet printed tin oxide thin films of the present application are particularly good for sensing applications. To assess its electrical characteristics, MISFETs have been fabricated using porous tin oxide channel layer. For the device fabrication, we had used 10×15 mm $SiO_2$/Si/Au substrate. After depositing the tin oxide channel layer on the substrate by inkjet printing, the aluminum source and drain contacts with a channel width-to-length ratio of 12 (channel length are 200 µm) were deposited through a shadow mask by thermal evaporation. The device structure is illustrated in FIG. 34. FIG. 43 illustrates one embodiment of a metal oxide semiconductor MISFET 4410. MISFET structure 4310 includes a gold substrate material 4312 having a thickness of about 500 nanometers. A p+silicon gate layer 4314 was formed having a thickness of about 675 µm. Gold layer 4312 was sputter deposited on the silicon substrate to form a gate contact. Silicon dioxide ($SiO_2$) layer 4316 was thermally grown on top of a silicon layer 4314. Layer 4316 typically had a thickness of about 100 nanometers. As the name implies, a metal oxide semiconductor MISFET requires a metal oxide semiconductor layer 4318. Layer 4318 can be formed as described herein by solution process deposition of a suitable metal oxide or metal oxide precursor material, such as a metal halide. These layers have typical thicknesses of from about 10 to about 20 nanometers. 300-nanometer aluminum source contact 4320 and drain contact 4322 were evaporated on top of the $SnO2$ layer 4318 through a shadow mask with a channel width-to-length ratio of 7 and 12, respectively.

Figure 44:
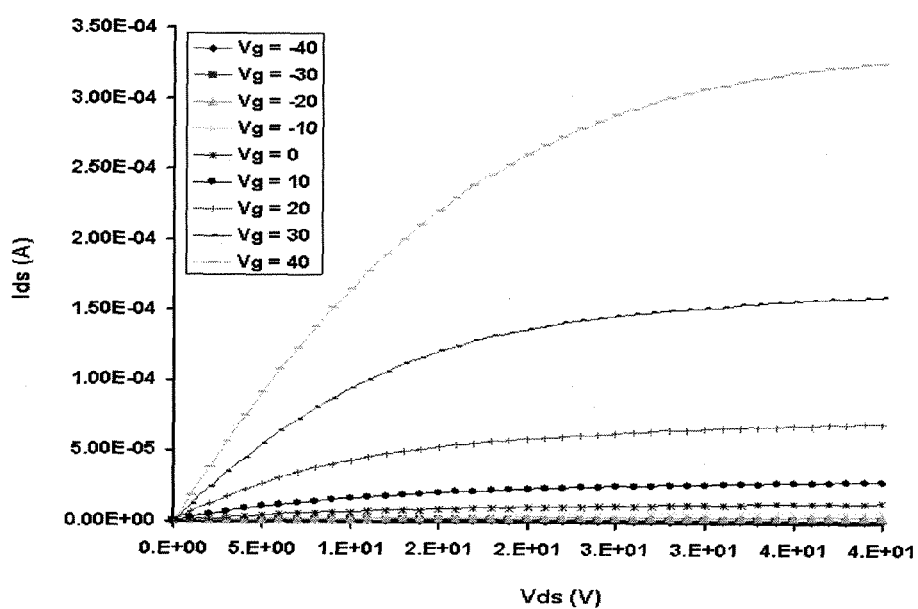
FIG. 44 provides drain current-drain voltage ($I_{DS}$-$V_{DS}$) output characteristics for one embodiment of an $SnO_2$ thin film transistor with a channel layer thickness of about 250 nanometers.

The drain current-drain voltage ($I_{DS}$-$V_{DS}$) characteristics of the fabricated $SnO_2$ MISFET having a channel thickness ~250 nm was shown in FIG. 44. For this n-type channel device, $V_G$ run from −40 to 40 and $V_{DS}$ from 0 to 40 resulting positive $I_{DS}$. The device characterization data showed that a field effect mobility ($\mu_{FE}$) of 3.62 $cm^2V^{-1}s^{-1}$, a turn-on voltage of −39V, and a drain current on-to-off ratio of $10^3$ were obtained for this normally on tin oxide MISFET. This result is comparable to reported tin oxide thin-film transistor devices fabricated by an RF magnetron sputtering method.

This example demonstrates fabrication of highly transparent porous tin oxide thin films using an inkjet printing process. The films exhibit an interesting porous structure that has a thin mesoporous layer on top and a thicker meso-(~2 to 20 nm) and macroporous layer (~70 nm to 100 nm) beneath the top layer. The thin film transmittance is over 98% in the visible wavelength range. A normally on thin film transistor based on the porous tin oxide channel layer has been fabricated. A field effect mobility of 3.62 $cm^2$/V·s was measured, which is higher than previous reported $SnO_2$ TFTs using sputtered thin films.

Example 22

This example concerns fabricating an IZTO (indium-zinc oxide) MISFET using a piezo-inkjet printer. IZTO solutions for fabricating inkjet-printed ZIO thin films were prepared by dissolving $InCl_3$(0.02M), $ZnCl_2$(0.027M) and $SnCl_2$(0.02M) powders (Alfa Aesar) in the solvent with volumetric ratio of 35% of acetonitrile (J. C. Baker) and 65% of ethylene glycol (Sigma-Aldrich, 99%). A DIMATIX (DMP-2800) piezo-inkjet printer was used to print the active layer with a desired pattern. First, the metal halide precursor solution (~3 ml) was filled into the cartridge (Dimatix Model Fluid Cartridge) by a needle syringe, and then loaded into the cartridge holder. Second, the substrate was cleaned with 1M sodium hydroxide for 5 minutes in an ultra-sonicator, followed by a stream of clean dry nitrogen gas to blow it dry. The loading stage was heated and kept at 60° C. before loading the substrate. The as-deposited thin film was annealed at 600° C. under air for 1 hour to produce oxide materials.

For Metal-Insulator-Semiconductor Field-Effect Transistors (MISFETs) fabrication, a heavily boron (p+) doped silicon substrate (10×15 mm) was used as the gate in an inverted-gate structure. Silicon dioxide with a thickness of 100 nm was thermally grown on top of the silicon substrate. The back of the substrate had the silicon dioxide etched followed by deposition of a 500 nm gold layer for the gate contact. The semiconductor channel material was patterned to reduce the gate leakage current. The 300 nm aluminum source and drain contacts were then evaporated on top of metal oxide layer through a shadow mask. The device characterization was performed in the dark at room temperature with a HP 4157B Semiconductor Parameter Analyzer.

Figure 47:
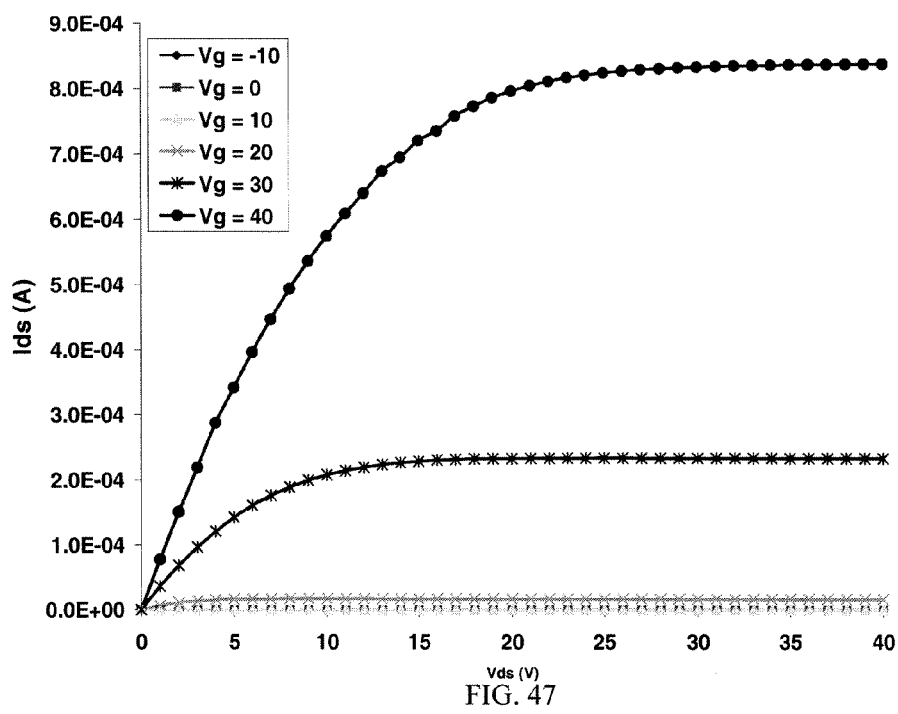
FIG. 47 provides drain current-drain voltage ($I_{DS}$-$V_{DS}$) output characteristics for one embodiment of an IZTO (indium-zinc oxide) MISFET.
Figure 48:
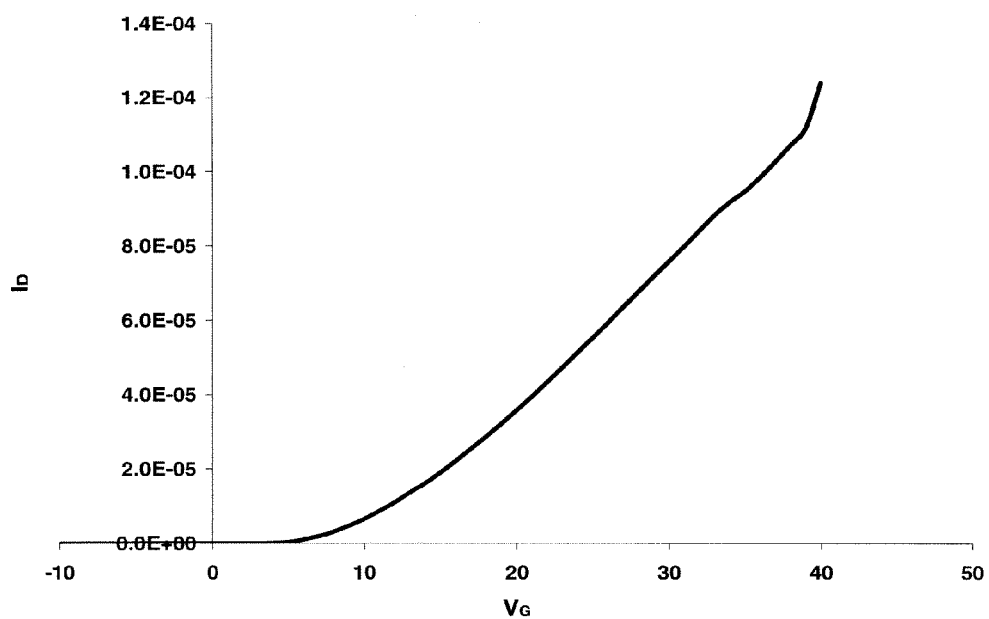
FIG. 48 provides characterization data for one embodiment of an IZTO (indium-zinc oxide) MISFET.
Figure 49:
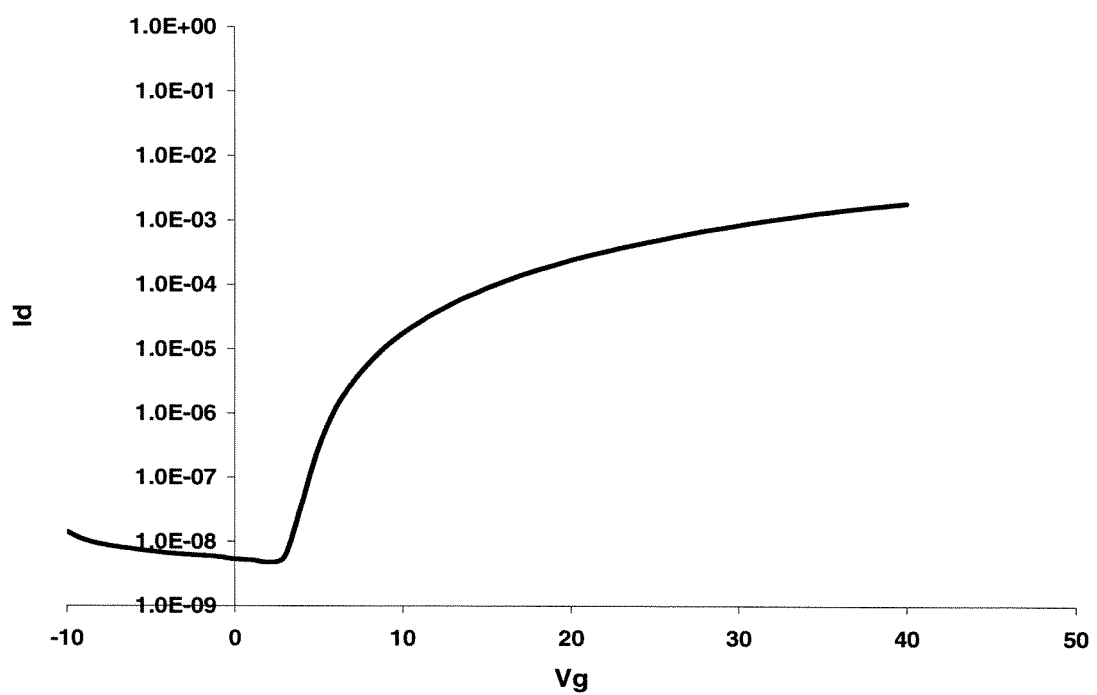
FIG. 49 provides characterization data for one embodiment of an IZTO (indium-zinc oxide) MISFET.

The drain current-drain voltage ($I_D$-$V_{DS}$) output characteristics, field-effective mobility, Von, On-off current ratio are provided by FIGS. 47-49. The output characteristic date showed ~30 cm$^2$/V·sec of field-effect mobility, 2V of turn-on voltage (enhancement mode device) and ~10$^6$ of the on-off ratio respectively.

Example 23

This example concerns one embodiment of a method for fabricating a CIS (copper-indium-sulfide, CuInS$_2$) thin film by inkjet printing. CuInS$_2$ solutions for fabricating inkjet-printed CIS thin films were prepared by dissolving CuI (0.001M, Alfa), InCl$_3$(0.001M, Alfa), and thiourea (0.002M, Aldrich) powders stoichiometrically in 25 ml of the acetonitrile (J. C. Baker). A modified HP 1220C thermal inkjet printer and Microsoft Excel software were used to print the thin film with a desired pattern. First, the metal halide precursor solution (~10 ml) was filled into the black cartridge (HP45) by a needle syringe, sealed with a metallic ball, and then loaded into the cartridge holder. Second, the substrate was treated with standard Acetone, Methanol and De-ionized Water (AMD) pre-cleaning method, followed by a stream of clean dry nitrogen gas to blow it dry, before placing onto a plastic tray, and loaded into the inkjet printer. The obtained as-deposit thin film was annealed at 400° C. for 1 hour under vacuum in order to form CuInS$_2$.

VI. Electronic Devices

A person of ordinary skill in the art will appreciate that many different electronic devices can be made using disclosed embodiments of the present invention. These electronic devices are exemplified herein primarily by reference to transistors, and circuits comprising such transistors. Many embodiments of working transistors have been made, including copper iodide, ZnO—In$_2$O$_3$ (ZIO), tin oxide, indium tin oxide, indium oxide, indium zinc tin oxide, CuAgI and CuCdI transistors.

However, there are other applications for disclosed embodiments of the present invention, including conductors (electrons, holes, and ions), semiconductors, and insulators. Light emitting materials also can be processed as described herein to make, for example, light emitting diodes. Thus, devices such as thin film photovoltaics, photodetectors, gas sensors, thin film batteries, X-ray imagers, etc. can be made using disclosed embodiments of the present invention.

Figure 29:
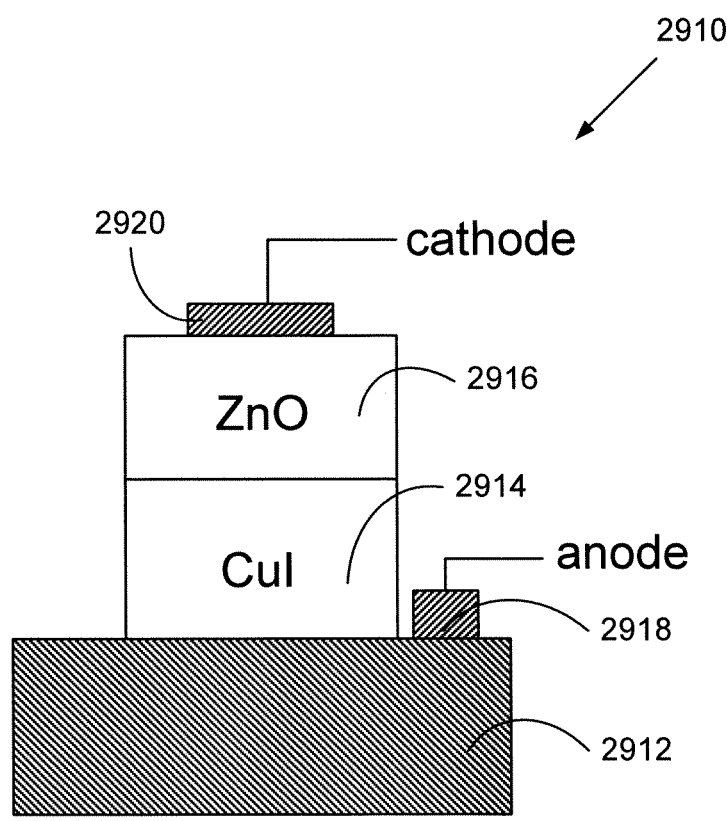
FIG. 29 is a schematic diagram of one embodiment of a UV light detector that can be made according to the present invention.

FIG. 29 illustrates one embodiment of a UV light detector 2910 that can be made according to the present invention. UV light detector 2910 includes a substrate later 2912. A first layer, such as a copper iodide layer, 2914 is solution deposited on substrate 2912. A second layer, such as a zinc oxide layer, 2916 is then solution deposited on layer 2914. UV light detector also includes anode portion 2918 and cathode portion 2920.

Figure 30:
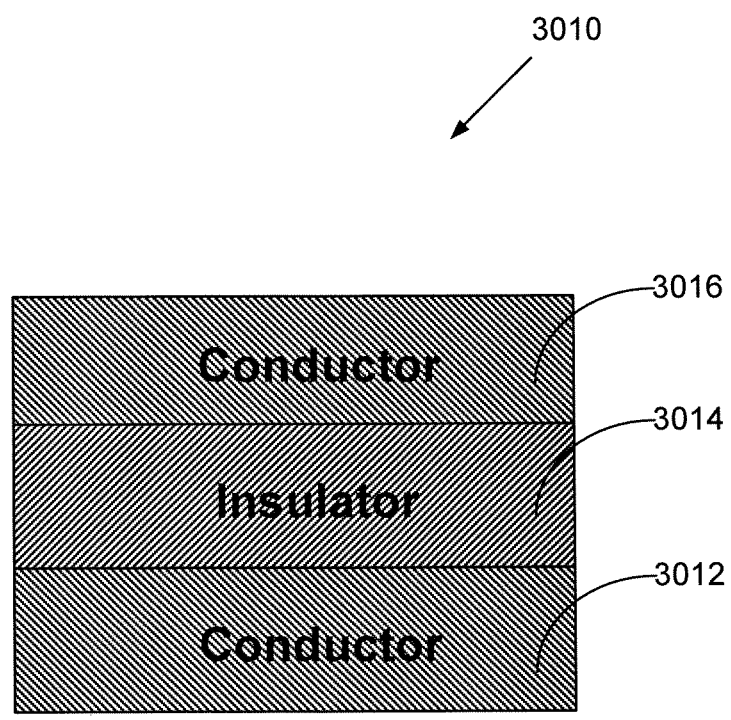
FIG. 30 is a schematic diagram of one embodiment of capacitor that can be made according to the present invention.

FIG. 30 illustrates a capacitor 3010 that can be made according to the present invention. Capacitor 3010 includes a first conductive layer 3012. An insulating layer 3014 can be solution deposited on a conductive layer 3012. Finally a second conductive layer 3016 can be deposited on insulating layer 3014 to form capacitor 3010.

Figure 31:
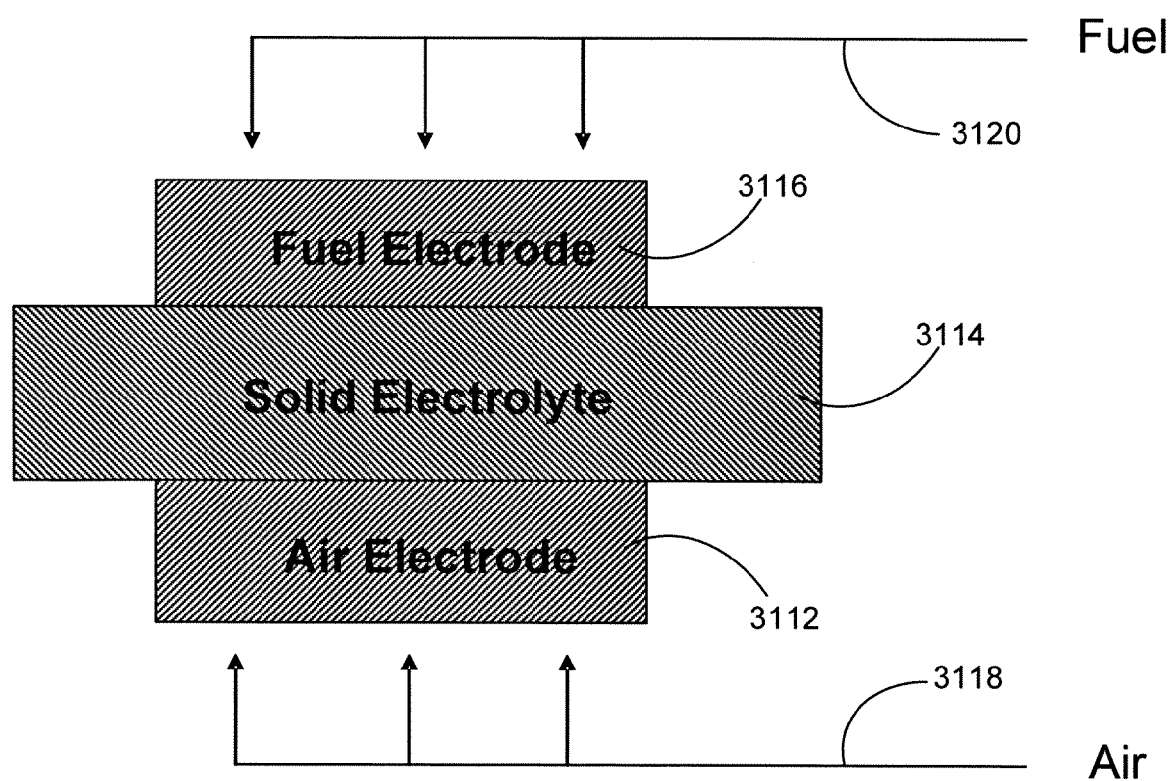
FIG. 31 is a schematic diagram of one embodiment of a solid electrolyte that can be made according to the present invention.

FIG. 31 is a schematic of one embodiment of a solid electrolyte that can be made according to the present invention. Solid electrolyte 3110 has three components, an air electrode 3112, a solid electrolyte 3114 and a fuel electrode 3116. Solid electrolyte layer 3114 can comprise a variety of materials. Solely by way of example, electrolyte layer 3114 can comprise ZrO$_2$(CaO), La(Sr) MnO$_3$, ZrO$_2$(Y$_2$O$_3$), LaCr(Mg) O$_3$, and combinations thereof. Air electrode 3112 receives an air stream 3118. Fuel electrode receives a fuel stream 3131.

Figure 32:
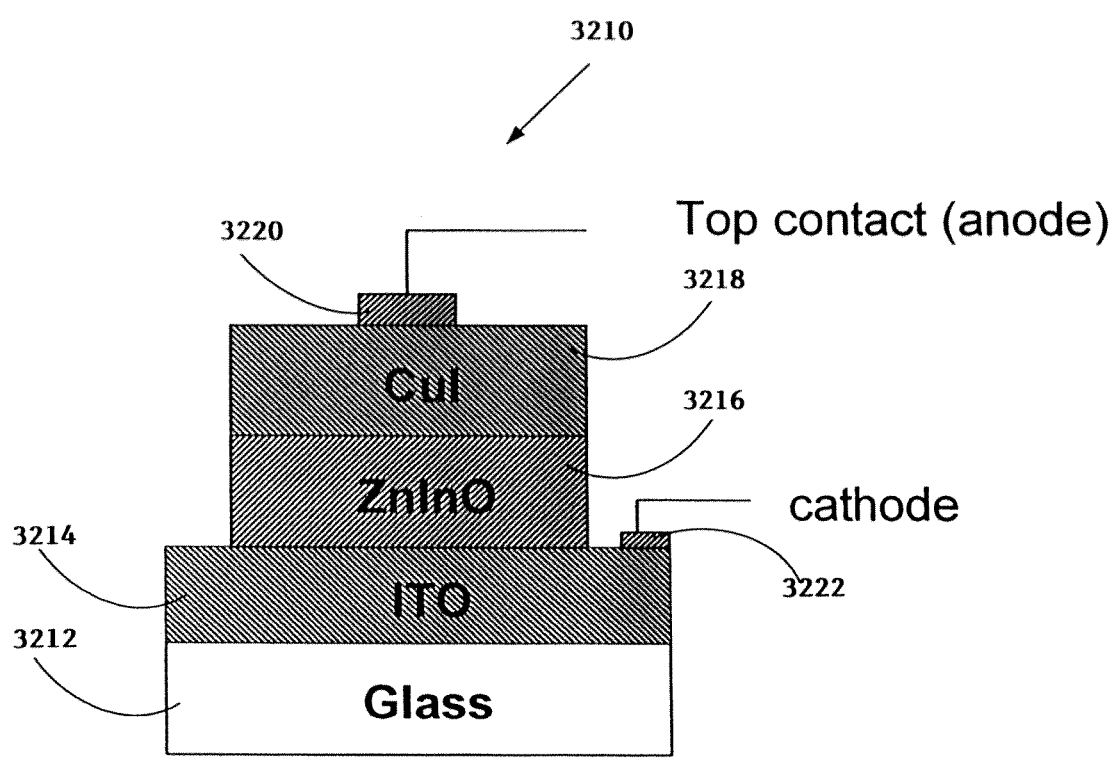
FIG. 32 is a schematic diagram of one embodiment of an LED that can be made according to the present invention.

FIG. 32 is a schematic diagram of a light emitting diode (LED) 3210 that can be made according to the present invention. LED 3210 includes a substrate 3212, such as a glass substrate. A first layer, such as an indium tin oxide layer 3214, is formed, such as by solution deposition on glass layer 3212. A second layer, such as a zinc indium oxide layer 3216, is formed on layer 3214. A third layer 3218, such as a copper iodide layer, is formed on layer 3116. LED also includes an anode layer 3120 and a cathode layer 3122.

Figure 33:
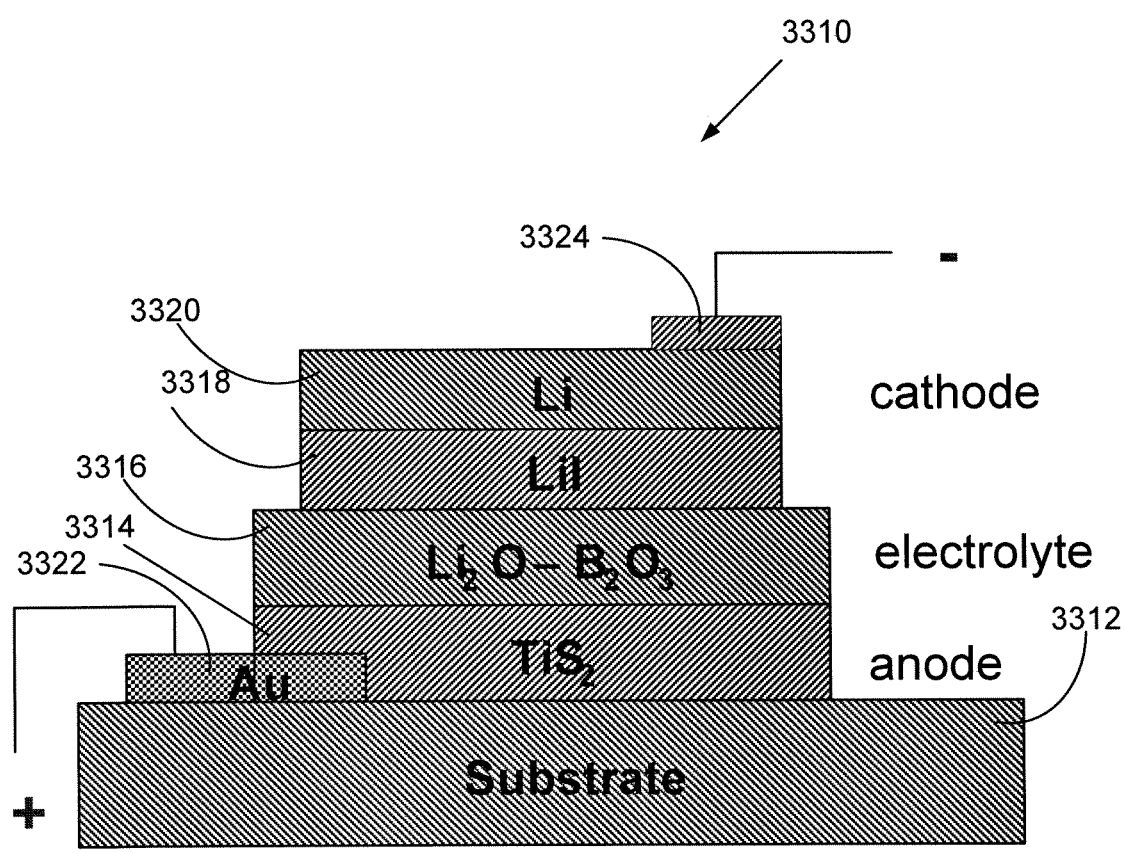
FIG. 33 is a schematic diagram of one embodiment of a thin film battery that can be made according to the present invention.

FIG. 33 is a schematic diagram of one embodiment of a thin-film battery 3310 that can be made according to the present invention. Thin-film battery 3310 includes a substrate layer 3312. Thin-film battery 3310 also includes an anode layer, such as a TiS$_2$ layer 3314. Thin-film battery 3310 also includes an electrolyte layer 3316, such as an Li$_2$—B$_2$O$_3$ layer. Lithium iodide layer 3318 is formed on top of layer 3316, followed by deposition of a cathode layer 3320, such as a lithium cathode layer. A thin-film battery also has contacts, such as gold cathode contact 3322 and anode contact 3324.

FIG. 34 is a schematic diagram of one embodiment of an electroluminescent device 3410 that can be made according to the present invention. Electroluminescent device 3410 includes a first layer 3412, such as an aluminum layer. A second layer 3414, such as an aluminum oxide layer Al$_2$O$_3$, can be formed upon the first layer 3412. A third layer 3416, such as a ZnS:Mn layer is formed on the second layer. A fourth layer 3418, such as an aluminum oxide layer, can be formed on layer 3416. Electroluminescent device 3410 also includes a layer 3420, such as an indium tin oxide layer. The zinc sulfide layer can be formed by first depositing a zinc chloride layer, followed by treating the zinc chloride layer with sulfiding agent, such as hydrogen sulfide, to produce zinc sulfide.

Figure 35:
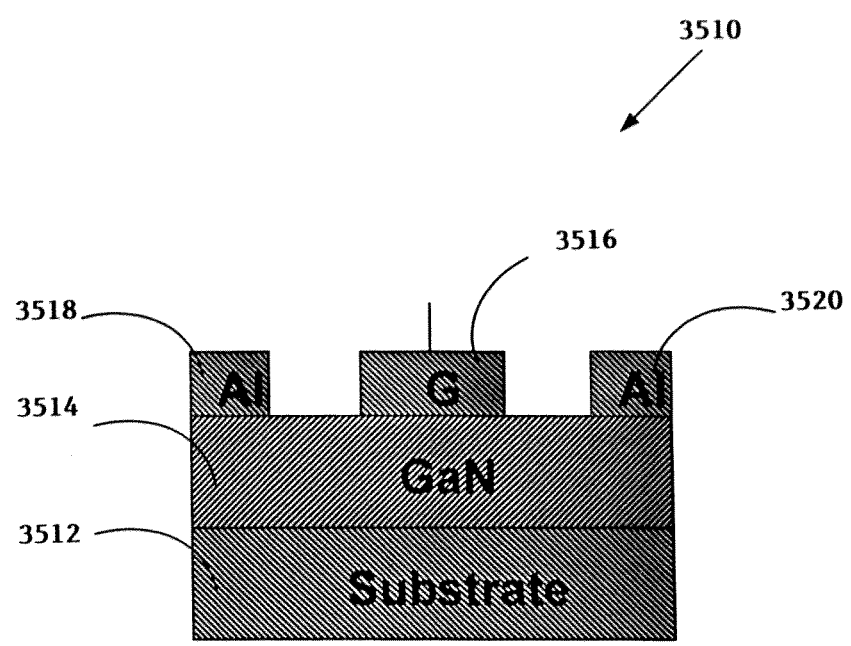
FIG. 35 is a schematic diagram of one embodiment of a MESFET that can be made according to the present invention.

FIG. 35 is a schematic diagram of one embodiment of a MESFET 3510 that can be made according to the present invention. MESFET 3510 includes a substrate layer 3512. MESFEST 3510 includes a second layer, such as a gallium nitride layer, GaN, 3514. Gallium nitride can be formed, for example, by treating a gallium iodide thin film with a nitriding agent, such as ammonia. A Shottkey gate 3516 is formed, along with contact layers 3518 and 3520.

Figure 45:
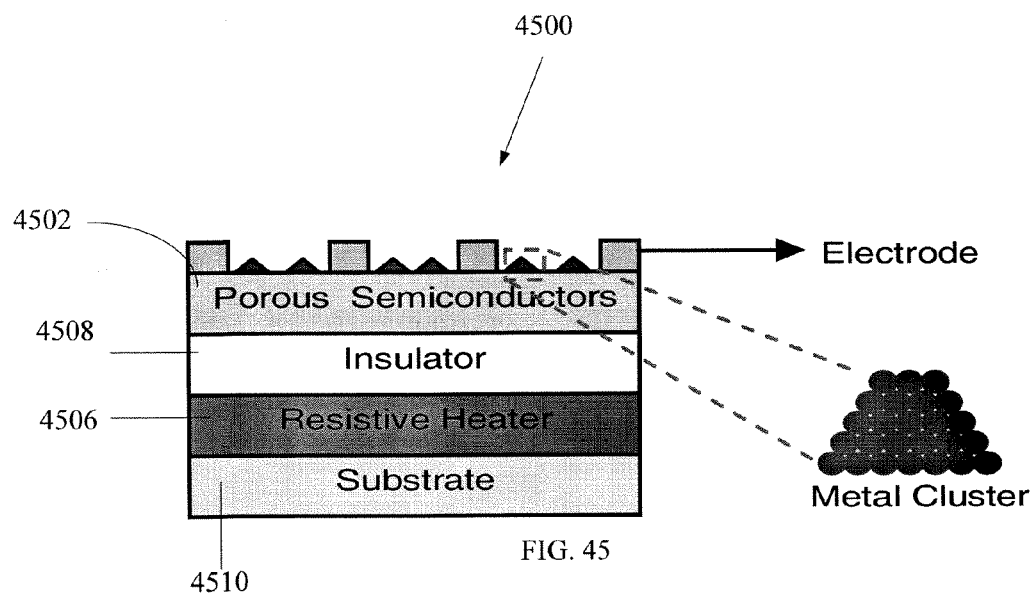
FIG. 45 is a schematic cross-sectional view of a typical thin film resistive gas sensor.
Figure 46:
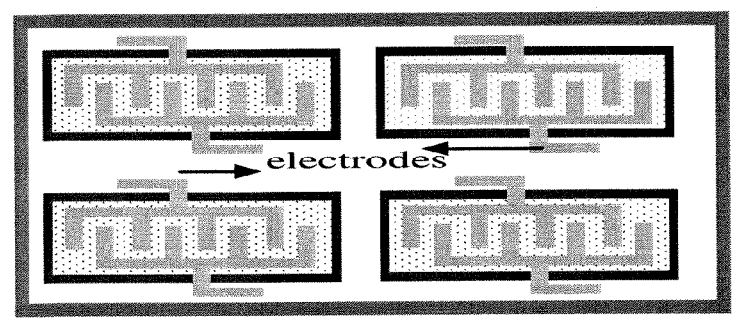
FIG. 46 is a plan view of electrodes used with the gas sensor of FIG. 45.

Semiconductor gas sensors operate primarily based on monitoring the conductance change caused by interaction of gas molecules with the semiconductor, such as oxygen chemisorption and its reaction with reducing gases. Thus, semiconductor thin film sensors are thin film resistors with a modulated electrical conductivity controlled by the gases in contact. A cross-session view of a typical thin film resistive gas sensor 4500 is shown in FIG. 45. The illustrated gas sensor comprises a semiconductor thin films (e.g. SnO$_2$, WO$_3$) 4502, with contact electrodes 4504 for measuring the conductance change, a thin film resistive heater (e.g. Pt, RuO$_2$) 4506 to operate the sensor at elevated temperature (the gas sensing is essentially a gas/solid reaction that is strongly depending on the temperature), an insulating layer 4508 to separate the semiconductor thin film and the conducting resistive heater, and a substrate layer 4510. Associated electrodes are illustrated in FIG. 46.

The present invention has been described with reference to certain working embodiments. A person of ordinary skill in the art will appreciate that the scope of the invention is not limited to the particular features disclosed.

We claim:

1. A method for making a semiconducting thin film by solution deposition, and not suspension deposition, of inorganic compounds, comprising:

providing a first solution consisting of at least a first metal halide and an aprotic solvent capable of dissolving the metal halide;

depositing the solution onto a substrate in a predetermined pattern using a digital fabrication technique;

evaporating the solvent, or allowing the solvent to evaporate, under ambient conditions to form a continuous thin film of a precursor material comprising an inorganic compound comprising the metal halide and having a thickness of at least 5 nanometers to 300 nanometers;

exposing the precursor material to water; and annealing in the presence of oxygen or an oxygen-containing reactive species after exposing the precursor material to water, thereby forming an amorphous semiconducting thin film comprising a metal oxide suitable as a channel layer for thin film transistors with a field effect mobility value higher than 1 $cm^2/V \cdot s$.

2. The method according to claim 1 where the metal is a Group Ia, IIa, IIIa, IVa, Va, Ib, IIb, IIIb, IVb, Vb, VIIb, VIIb, or VIIIb metal, or mixtures thereof.

3. The method according to claim 2 where the inorganic compound is a binary compound.

4. The method according to claim 1 where the inorganic compound includes antimony (Sb), bismuth (Bi), cadmium (Cd), calcium (Ca), magnesium (Mg), barium (Ba), strontium (Sr), copper (Cu), gallium (Ga), gold (Au), titanium (Ti), zirconium (Zr), hafnium (Hf), indium (In), aluminum (Al), iron (Fe), ruthenium (Ru), lead (Pb), manganese (Mn), rhenium (Re), chromium (Cr), molybdenum (Mo), tungsten (W), nickel (Ni), silicon (Si), silver (Ag), thallium (Tl), germanium (Ge), tin (Sn), vanadium (V), niobium (Nb), tantalum (Ta), scandium (Sc), lanthanum (La), yttrium (Y), zinc (Zn), cobalt (Co), rhodium (Rh), lithium (Li), sodium (Na), potassium (K), rubidium (Rb), cesium (Cs), boron (B), mercury (Hg), palladium (Pd), platinum (Pt), iridium (Ir), osmium (Os), technetium (Tc), cerium (Ce), beryllium (Be), europium (Eu), terbium (Tb), gadolinium (Gd), holmium (Ho), erbium (Er), thulium (Tm), or lutetium (Lu).

5. The method according to claim 1 where the inorganic compound is $SbCl_3$, $SbBr_3$, $SbI_3$, $SbF_3$, $SbCl_5$, $SbBr_5$, $SbI_5$, $SbF_5$, $BiCl_3$, $BiBr_3$, $BiI_3$, $BiF_3$, $CdCl_2$, $CdBr_2$, $CdI_2$, $CdF_2$, $CaF_2$, $CaBr_2$, $CaCl_2$, $CaI_2$, $MgCl_2$, $MgBr_2$, $MgI_2$, $MgF_2$, $BaCl_2$, $BaBr_2$, $BaI_2$, $BaF_2$, $CuCl$, $CuBr$, $CuI$, $CuF$, $CuCl_2$, $CuBr_2$, $CuI_2$, $CuF_2$, $GaCl$, $GaI$, $GaBr$, $GaF$, $GaCl_3$, $GaBr_3$, $GaI_3$, $GaF_3$, $AuCl$, $AuCl_3$, $Au_4Cl_8$, $AuBr$, $AuBr_3$, $AuI$, $AuI_3$, $AuF_3$, $AuF_5$, $TiCl_2$, $TiBr_2$, $TiI_2$, $TiF_2$, $TiCl_3$, $TiBr_3$, $TiI_3$, $TiF_3$, $TiCl_4$, $TiBr_4$, $TiI_4$, $TiF_4$, $ZrC_2$, $ZrBr_2$, $ZrI_2$, $ZrF_2$, $ZrCl_3$, $ZrBr_3$, $ZrI_3$, $ZrF_3$, $ZrCl_4$, $ZrBr_4$, $ZrI_4$, $ZrF_4$, $HfCl_4$, $HfBr_4$, $HfI_4$, $HfF_4$, $InCl$, $InBr$, $InI$, $InF$, $InCl_2$, $InBr_2$, $InI_2$, $InF_2$, $InCl_3$, $InCBr_3$, $InI_3$, $InF_3$, $AlCl_3$, $AlBr_3$, $AlI_3$, $AlF_3$, $TlCl$, $TlBr$, $TlI$, $FeI_2$, $FeI_3$, $FeCl_2$, $FeCl_3$, $FeBr_2$, $FeBr_3$, $FeF_2$, $FeF_3$, $RuCl_2$, $RuBr_2$, $RuI_2$, $RuF_2$, $RuCl_3$, $RuBr_3$, $RuI_3$, $RuF_3$, $PbCl$, $PbBr$, $PbI$, $PbF$, $MnCl_2$, $MnBr_2$, $MnF_2$, $MnI_2$, $ReCl_2$, $ReBr_2$, $ReI_2$, $ReF_2$, $ReCl_4$, $ReBr_4$, $ReI_4$, $ReI_4$, $CrCl_3$, $CrBr_3$, $CrI_3$, $CrF_3$, $MoCl_4$, $MoBr_4$, $MoI_4$, $MoCl_2$, $MoBr_2$, $MoI_2$, $MoF_2$, $MoCl_3$, $MoBr_3$, $MoI_3$, $MoF_3$, $MoCl_4$, $MoBr_4$, $MoI_4$, $MoF_4$, $MoCl_5$, $MoCl_6$, $WCl_6$, $WBr_6$, $WI_6$, $WF_6$, $AgI$, $AgBr$, $AgCl$, $TlCl$, $TlBr$, $TlI$, $TlF$, $SiCl_2$, $SiCl_4$, $SiBr_2$, $SiBr_4$, $SiI_2$, $SiI_4$, $SiF_2$, $SiF_4$, $GeCl_2$, $GeCl_4$, $GeBr_2$, $GeBr_4$, $GeI_2$, $GeI_4$, $GeF_2$, $GeF_4$, $SnCl_2$, $SnCl_4$, $SnBr_2$, $SnBr_4$, $SnI_2$, $SnI_4$, $SnF_2$, $SnF_4$, $VCl_2$, $VBr_2$, $VI_2$, $VF_2$, $VCl_3$, $VBr_3$, $VI_3$, $VF_3$, $VCl_4$, $VBr_4$, $VI_4$, $VF_4$, $NbCl_3$, $NbBr_3$, $NbI_3$, $NbF_3$, $NbCl_5$, $NbBr_5$, $NbI_5$, $NbF_5$, $TaCl_3$, $TaBr_3$, $TaI_3$, $TaF_3$, $TaCl_4$, $TaBr_4$, $TaI_4$, $TaF_4$, $TaCl_5$, $TaBr_5$, $TaI_5$, $TaF_5$, $ScCl_3$, $ScBr_3$, $ScI_3$, $ScF_3$, $SrCl_2$, $SrBr_2$, $SrI_2$, $LaCl_3$, $LaBr_4$, $LaI_3$, $LaF_3$, $YCl_3$, $YBr_3$, $YI_3$, $YF_3$, $ZnCl_2$, $ZnBr_2$, $ZnI_2$, $ZnF_2$, $NiCl_3$, $NiBr_3$, $NiI_3$, $NiF_3$, $CoCl_2$, $CoBr_2$, $CoI_2$, $CoF_2$, $CoCl_3$ $CoBr_3$, $CoI_3$, $CoF_3$, $RhCl_3$ $RhBr_3$, $RhI_3$, $RhF_3$, $LiCl$, $LiBr$, $LiI$, $LiF$, $NaCl$, $NaBr$, $NaI$, $NaF$, $KCl$, $KBr$, $KI$, $KF$, $RbCl$, $RbBr$, $RbI$, $RbF$, $CsCl$, $CsBr$, $CsI$, $CsF$, $BCl_3$, $BBr_3$, $BI_3$, $BF_3$, $HgCl_2$, $HgBr_2$, $HgI_3$, $HgF_3$, $PdCl_2$, $PdBr_2$, $PdI_2$, $PdF_2$, $PdF_4$, $PtCl_3$, $PtCl_4$, $PtBr_3$, $PtBr_2$, $PtBr_4$, $PtI_2$, $PtI_3$, $PtI_4$, $PtF_4$, $PtF_6$, $IrCl_2$, $IrBr_2$, $IrI_2$, $IrF_2$, $IrCl_3$, $IrBr_3$, $IrI_3$, $IrF_3$, $IrCl_4$, $IrBr_4$, $IrI_4$, $IrF_4$, $OSCl_3$, $OSCl_4$, $OSCl_5$, $OSBr_3$, $OSBr_4$, $OsI$, $OSI_2$, $OsI_3$, $OSF_4$, $OSF_5$, $OSF_6$, $OSF_7$, $OSF_8$, $TcF_5$, $TcF_6$, $TcCl_4$, $TcCl_6$, $TcBr_4$, $CeCl_2$, $CeBr_2$, $CeI_2$, $CeF_2$, $CeCl_3$, $CeBr_3$, $CeI_3$, $CeF_3$, $BeF_2$, $BeCl_2$, $BeBr_2$, $BeI_2$, $EuCl_2$, $EuBr_2$, $EuI_2$, $EuF_2$, $EuCl_3$, $EuBr_3$, $EuI_3$, $EuF_3$, $TbF_2$, $TbF_3$, $TbCl_3$, $TbBr_3$, $TbI_3$, $GdCl_2$, $GdCl_3$, $GdBr_2$, $GdI_2$, $GdF_2$, $HoCl_3$, $HoBr_3$, $HoI_3$, $HoF_3$, $ErCl_3$, $ErBr_3$, $ErI_3$, $ErF_3$, $ThCl_4$, $ThBr_4$, $ThI_2$, $ThI_3$, $ThI_4$, $ThF_4$, $TmCl_2$, $TmBr_2$, $TmI_2$, $TmF_2$, $TmCl_3$, $TmBr_3$, $TmI_3$, $TmF_3$, $LuCl_3$, $LuBr_3$, $LuI_3$, $LuF_3$, $CuAgI_2$, $CuCdI_2$, $CuBiI_4$, $CuPbI_3$, $CuSnI_5$, SbSI or a combination thereof.

6. The method according to claim 1 where the inorganic compound is a ternary or higher order mixed-metal compound.

7. The method according to claim 6 where the inorganic compound has a formula $M_a^1 M_b^2 Y_c$ where Y is a halide, a+b is sufficient to provide metal atoms equal to a negative charge associated with any one or more Y groups, and c is sufficient to provide anionic groups equal to a positive charge associated with the metal atoms.

8. The method according to claim 6 where the inorganic compound has a formula $M_a^1 M_b^2 M_c^3 Y_d$ where Y is a halide, a+b+c is sufficient to provide metal atoms equal to a negative charge associated with any one or more Y groups, and d is sufficient to provide anionic groups equal to a positive charge associated with the metal atoms.

9. The method according to claim 1 where the inorganic compound comprises copper-cadmium, copper-silver, zinc-indium, zinc-tin, or indium-tin.

10. The method according to claim 1 where the inorganic compound is a metal halide having a formula $M_a X_b$ where M is a metal, X is a halide, a is 1, 2 or 3, and b provides halide anions sufficient to equal a positive charge on the metal.

11. The method according to claim 10 where the halide is chloride or iodide.

12. The method according to claim 1 where annealing the film precursor in the presence of oxygen or an oxygen-containing reactive species comprises oxidizing or substituting the metal halide to form a metal oxide.

13. The method according to claim 12 where the metal oxide is $ZnO$—$In_2O_3$ (ZIO), $ZnO$, $In_2O_3$, $SnO_2$, $In_2O_3$—$SnO_2$ (ITO), $ZnO$—$SnO_2$ (ZTO), and $In_2O_3$—$ZnO$—$SnO_2$ (IZTO), $Ga_2O_3$, $ZnO$—$Ga_2O_3$ (ZGO), $Al_2O_3$, $B_2O_3$, $GeO_2$, $PbO$, $In_2O_3$—$GeO_2$, $SnO_2$—$GeO_2$, $SiO_2$, $CdO$, $CdO$—$SnO_2$, $CuO$, $CuO$—$Al_2O_3$, $MgO$, $MgO$—$In_2O_3$, $CaO$, $CaO$—$Al_2O_3$, $BaO$, $AgO$, $Ag_2O$, $ScO$, $CuO$—$ScO$, $SrO$, $CoO$, $Fe_2O_3$, $Fe_3O_4$, $ZnO$—$Fe_3O_4$, $Cr_2O_3$, $ZnO$—$Cr_2O_3$, $NiO$, $RuO_2$, $ReO_2$, $ReO_3$, $RhO$, $MoO_2$, $MnO$, $WO$, $V_2O_3$, $Nb_2O_3$, $Ta_2O_5$, $TiO_2$, $BaO$—$TiO_2$, $ZrO_2$, $ZrO_2$—$SiO_2$, $HfO_2$, $HfO_2$—$SiO_2$, $Y_2O_3$, $La_2O_3$, $PbO$, $TlO$, $SrO$, $SrO_2$, $TcO_2$, $Tc_2O_7$, $BeO$, $TbO_2$, $Tb_2O_3$, $Sb_2O_3$, $Sb_2O_3$—$SnO_2$, $Sb_2O_5$, $Bi_2O_3$, or combinations thereof.

14. The method according to claim 1 where depositing the solution on a substrate produces a first layer, and the method further comprises solution depositing at least a second layer on the first layer.

15. The method according to claim 14 where the first layer and the second layer comprise the same inorganic compound.

16. The method according to claim 14 where the first layer and the second layer comprise different inorganic compounds.

17. The method according to claim 1 where the solvent is a nitrile.

18. The method according to claim 1 where the inorganic compound forms a layer on the substrate having a thickness of from about 5 to about 250 nanometers.

19. The method according to claim 1 where the inorganic compound forms a layer on the substrate having a thickness of from about 10 nanometers to about 200 nanometers.

20. The method according to claim 1 where the solution is deposited by inkjet printing.

21. The method according to claim 1 further comprising:
obtaining a concentration versus a deposited layer thickness curve;
providing the first solution with a concentration of the first inorganic material selected to provide a desired layer thickness; and
depositing the first solution to provide the desired layer thickness.

22. The method according to claim 1 comprising air annealing at 600° C. for one hour.

23. The method according to claim 1 where the thin film is a porous thin film.

24. The method according to claim 23 where the thin film has plural different porous structures.

25. The method according to claim 23 further comprising adjusting pore size of the thin film.

26. The method according to claim 25 where adjusting pore size comprises selecting a processing temperature, a temperature heating rate, or both.

27. The method according to claim 23 where the thin film is a metal oxide selected from $ZnO-In_2O_3$ (ZIO), ZnO, $In_2O_3$, $SnO_2$, $In_2O_3-SnO_2$ (ITO), $ZnO-SnO_2$ (ZTO), and $In_2O_3-ZnO-SnO_2$ (IZTO), $Ga_2O_3$, $ZnO-Ga_2O_3$ (ZGO), $Al_2O_3$, $B_2O_3$, $GeO_2$, PbO, $In_2O_3-GeO_2$, $SnO_2-GeO_2$, $SiO_2$, CdO, $CdO-SnO_2$, CuO, $CuO-Al_2O_3$, MgO, $MgO-In_2O_3$, CaO, $CaO-Al_2O_3$, SrO, $SrO_2$, $TcO_2$, $Tc_2O_7$, BeO, $TbO_2$, $Tb_2O_3$, BaO, AgO, $Ag_2O$, ScO, $CuO-ScO$, SrO, CoO, $Fe_2O_3$, $Fe_3O_4$, $ZnO-Fe_3O_4$, $Cr_2O_3$, $ZnO-Cr_2O_3$, NiO, $RuO_2$, $ReO_2$, $ReO_3$, RhO, $MoO_2$, MnO, WO, $V_2O_3$, $Nb_2O_3$, $Ta_2O_5$, $TiO_2$, $BaO-TiO_2$, $ZrO_2$, $ZrO_2-SiO_2$, $HfO_2$, $HfO_2-SiO_2$, $Y_2O_3$, $La_2O_3$, PbO, TiO, $Sb_2O_3$, $Sb_2O_3-SnO_2$, $Sb_2O_5$, $Bi_2O_3$, and combinations thereof.

28. A method for making a semiconductor material by solution deposition, and not suspension deposition, of inorganic compounds, comprising:
providing a first solution consisting of an aprotic solvent and at least a first inorganic material selected from a Group Ia, IIa, IIIa, IVa, Va, Ib, IIb, IIIb, IVb, Vb, VIb, VIIb, or VIIIb metal halide, metal carbonyl, metal carbonyl halide, metal acetate, metal sulfate, metal phosphate, or mixtures thereof;
depositing the solution onto a substrate using a digital fabrication process;
evaporating solvent, or allowing solvent to evaporate, under ambient condition to provide a layer comprising the first inorganic material, the layer having a thickness of from greater than 0 nanometers to 300 nanometers;
exposing the layer to water; and
annealing in the presence of oxygen or an oxygen-containing reactive species after exposing the precursor material to water, thereby forming an amorphous semiconducting thin film comprising a metal oxide suitable as a channel layer for thin film transistors with a field effect mobility value higher than 1 $cm^2/V \cdot s$.

29. A method for making a semiconductor material by solution deposition, and not suspension deposition, of inorganic compounds, comprising:
providing a second solution consisting of an aprotic solvent and at least a first metal halide, wherein the metal is selected from a group Ia, IIa, IIIa, IVa, Va, Ib, IIb, IIIb, IVb, Vb, VIb, VIIb, or VIIIb metal, or mixtures thereof;
depositing the first and second solutions on a substrate using a process selected from inkjet printing, spin coating, gravure, micro-pen, nano-fountain pen, dip-pen, screen printing, spray coating, slide coating, slot coating, curtain coating, dip coating, and combinations thereof;
evaporating solvents, or allowing solvents to evaporate, under ambient conditions to provide a layer comprising the first inorganic material, the layer having a thickness of from greater than 0 nanometers to 300 nanometers;
exposing the layer to water; and
annealing the layer in the presence of oxygen or an oxygen-containing reactive species after exposing the precursor material to water, thereby forming an amorphous semiconducting thin film comprising a metal oxide suitable as a channel layer for thin film transistors with a field effect mobility value higher than 1 $cm^2/V \cdot s$.

30. A method for making an amorphous semiconductor material layer by solution deposition, and not suspension deposition, of an inorganic compound, comprising:
providing a first solution consisting of an aprotic solvent and at least a first inorganic material selected from a Group Ia, IIa, IIIa, IVa, Va, Ib, IIb, IIIb, IVb, Vb, VIIb, VIIb, or VIIIb metal halide, metal carbonyl, metal carbonyl halide, metal acetate, metal sulfate, metal phosphate, or mixtures thereof;
optionally providing a second solution consisting of an aprotic solvent and at least a first inorganic material selected from a Group Ia, IIa, IIIa, IVa, Va, Ib, IIb, IIIb, IVb, Vb, VIIb, VIIb, or VIIIb metal halide, metal carbonyl, metal carbonyl halide, metal acetate, metal sulfate, metal phosphate, or mixtures thereof;
depositing at least the first, and optionally the second, solution onto a substrate using digital fabrication techniques;
evaporating solvents, or allowing solvents to evaporate, under ambient conditions to provide at least a first layer comprising an inorganic compound or compounds comprising the first inorganic material, the layer having a thickness of from greater than 0 nanometers to 300 nanometers; and
exposing the at least first layer to water; and
annealing the at least first layer in the presence of oxygen or an oxygen-containing reactive species after exposing the inorganic compound or compounds comprising the first inorganic material to water, thereby forming an amorphous semiconducting thin film comprising a metal oxide suitable as a channel layer for thin film transistors with a field effect mobility value higher than 1 $cm^2/V \cdot s$.

31. A method for making a semiconducting thin film by solution deposition, and not suspension deposition, comprising:
providing a solution consisting of an inorganic material selected from a metal halide or a combination of metal halides and an aprotic solvent capable of dissolving the metal halide or combination of metal halides;
depositing the solution onto a substrate using a digital fabrication technique;
evaporating the solvent, or allowing the solvent to evaporate, under ambient conditions to form a continuous thin film precursor comprising the inorganic material and having a thickness of at least 5 nanometers to 300 nanometers;

exposing the precursor material to water; and annealing in the presence of oxygen or an oxygen-containing reactive species after exposing the precursor material to water, thereby forming an amorphous semiconducting thin film comprising a metal oxide suitable as a channel layer for thin film transistors with a field effect mobility value higher than 1 $cm^2/V \cdot s$.

32. A method for making an amorphous semiconductor material layer by solution deposition, and not suspension deposition, of an inorganic compound, comprising:

providing a first solution consisting of an aprotic solvent and at least a first inorganic compound selected from a Group Ia, IIa, IIIa, IVa, Va, Ib, IIb, IIIb, IVb, Vb, VIIb, VIIb, or VIIIb metal halide, metal carbonyl, metal carbonyl halide, metal acetate, metal sulfate, metal phosphate, or mixtures thereof; and optionally providing a second solution consisting of an aprotic solvent and at least a first inorganic compound comprising selected from a Group Ia, IIa, IIIa, IVa, Va, Ib, IIb, IIIb, IVb, Vb, VIIb, VIIb, or VIIIb metal halide, metal carbonyl, metal carbonyl halide, metal acetate, metal sulfate, metal phosphate, or mixtures thereof;

depositing at least the first, and optionally the second, solution onto a substrate using digital fabrication techniques;

evaporating solvents, or allowing solvents to evaporate, under ambient conditions to provide at least a first layer comprising the first inorganic compound, the layer having a thickness of from greater than 0 nanometers to 300 nanometers; and exposing the at least first layer to water; and annealing the at least first layer in the presence of oxygen or an oxygen-containing reactive species after exposing the inorganic compound or compounds comprising the first inorganic material to water, thereby forming an amorphous semiconducting thin film comprising a metal oxide suitable as a channel layer for thin film transistors with a field effect mobility value higher than 1 $cm^2/V \cdot s$.

* * * * *